US010448105B2

(12) United States Patent
Oh et al.

(10) Patent No.: US 10,448,105 B2
(45) Date of Patent: *Oct. 15, 2019

(54) APPARATUS FOR TRANSMITTING BROADCAST SIGNALS, APPARATUS FOR RECEIVING BROADCAST SIGNALS, METHOD FOR TRANSMITTING BROADCAST SIGNALS AND METHOD FOR RECEIVING BROADCAST SIGNALS

(71) Applicant: LG ELECTRONICS INC., Seoul (KR)

(72) Inventors: Sejin Oh, Seoul (KR); Woosuk Kwon, Seoul (KR); Sungryong Hong, Seoul (KR); Kyoungsoo Moon, Seoul (KR); Jangwon Lee, Seoul (KR); Woosuk Ko, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/709,081

(22) Filed: Sep. 19, 2017

(65) Prior Publication Data
US 2018/0007438 A1 Jan. 4, 2018

Related U.S. Application Data

(63) Continuation of application No. 14/893,753, filed as application No. PCT/KR2014/005161 on Jun. 12, 2014, now Pat. No. 9,800,934.

(Continued)

(51) Int. Cl.
H04N 7/025 (2006.01)
H04N 21/462 (2011.01)
(Continued)

(52) U.S. Cl.
CPC ...... *H04N 21/462* (2013.01); *H03M 13/1102* (2013.01); *H03M 13/2792* (2013.01);
(Continued)

(58) Field of Classification Search
CPC ......... H04N 21/23412; H04N 21/2343; H04N 21/234309; H04N 21/234345;
(Continued)

(56) References Cited

U.S. PATENT DOCUMENTS 5,404,172 A 4/1995 Berman et al.
5,553,222 A 9/1996 Milne et al.
(Continued)

FOREIGN PATENT DOCUMENTS

CN 1553646 A 12/2004
CN 101300810 A 11/2008
(Continued)

OTHER PUBLICATIONS

"Final Report on ATSC 3.0 Next Generation Broadcast Television", Advanced Television Systems Committee, Sep. 21, 2011, PT2-046r11, XP055145112.

(Continued)

*Primary Examiner* — Hunter B Lonsberry
*Assistant Examiner* — Timothy R Newlin
(74) *Attorney, Agent, or Firm* — Dentons US LLP

(57) ABSTRACT

The present invention provides a method of transmitting broadcast signals. The method includes, formatting input streams into Data Pipe (DP) data, Low-Density Parity-Check (LDPC) encoding the DP data according to a code rate, bit interleaving the LDPC encoded DP data, mapping the bit interleaved DP data onto constellations, building at least one signal frame including the mapped DP data, and modulating data in the built signal frame by an Orthogonal Frequency Division Multiplexing (OFDM) method and
(Continued)

transmitting the broadcast signals having the modulated data, wherein the input streams include Audio/Video (A/V) data and service guide data, and wherein the Audio/Video (A/V) data and service guide data are included in first ISO base media file format (ISOBMFF) files.

16 Claims, 49 Drawing Sheets

Related U.S. Application Data

(60) Provisional application No. 61/926,934, filed on Jan. 13, 2014, provisional application No. 61/834,397, filed on Jun. 12, 2013.

(51) Int. Cl.

| | | |
|---|---|---|
| *H04L 1/00* | (2006.01) | |
| *H04N 7/24* | (2011.01) | |
| *H04N 21/2383* | (2011.01) | |
| *H04N 21/854* | (2011.01) | |
| *H03M 13/11* | (2006.01) | |
| *H03M 13/27* | (2006.01) | |
| *H04N 5/40* | (2006.01) | |
| *H04N 21/242* | (2011.01) | |
| *H04N 21/262* | (2011.01) | |
| *H04N 21/43* | (2011.01) | |
| *H04N 21/2362* | (2011.01) | |
| *H04H 20/40* | (2008.01) | |
| *H04H 60/39* | (2008.01) | |
| *H04H 60/07* | (2008.01) | |

(52) U.S. Cl.
CPC .............. *H04L 1/00* (2013.01); *H04L 1/0041* (2013.01); *H04N 5/40* (2013.01); *H04N 7/24* (2013.01); *H04N 21/2362* (2013.01); *H04N 21/2383* (2013.01); *H04N 21/242* (2013.01); *H04N 21/26275* (2013.01); *H04N 21/4302* (2013.01); *H04N 21/85406* (2013.01); *H04H 20/40* (2013.01); *H04H 60/07* (2013.01); *H04H 60/39* (2013.01)

(58) Field of Classification Search
CPC ..... H04N 21/234363; H04N 21/23614; H04N 21/236; H04N 21/23655; H04N 21/2365
See application file for complete search history.

(56) References Cited

U.S. PATENT DOCUMENTS

| | | | |
|---|---|---|---|
| 5,655,144 A | 8/1997 | Milne et al. | |
| 5,937,138 A | 8/1999 | Fukuda et al. | |
| 6,061,719 A * | 5/2000 | Bendinelli | H04N 7/088 |
| | | | 348/E5.112 |
| 7,028,327 B1 * | 4/2006 | Dougherty | H04N 7/17318 |
| | | | 348/E7.071 |
| 8,498,294 B1 | 7/2013 | Monk et al. | |
| 8,555,313 B2 * | 10/2013 | Newnam | H04N 5/04 |
| | | | 725/32 |
| 8,813,131 B2 * | 8/2014 | Han | H04N 21/812 |
| | | | 725/42 |
| 9,288,554 B2 * | 3/2016 | Lee | H04N 7/08 |
| 9,661,371 B2 * | 5/2017 | Moon | H04N 21/4104 |
| 2002/0162121 A1 * | 10/2002 | Mitchell | H04N 7/165 |
| | | | 725/135 |
| 2003/0051253 A1 * | 3/2003 | Barone, Jr. | H04N 7/088 |
| | | | 725/112 |
| 2004/0244058 A1 | 12/2004 | Carlucci et al. | |
| 2005/0105555 A1 | 5/2005 | Oshima | |
| 2006/0168612 A1 | 7/2006 | Chapman et al. | |
| 2007/0091919 A1 | 4/2007 | Sandoval | |
| 2007/0118850 A1 | 5/2007 | Bertin | |
| 2007/0201516 A1 | 8/2007 | Lee et al. | |
| 2007/0211759 A1 | 9/2007 | Tada et al. | |
| 2008/0187279 A1 | 8/2008 | Gilley et al. | |
| 2008/0225778 A1 | 9/2008 | Vare et al. | |
| 2009/0249393 A1 | 10/2009 | Shelton et al. | |
| 2009/0313293 A1 | 12/2009 | Setlur et al. | |
| 2010/0189424 A1 | 7/2010 | Doehla et al. | |
| 2010/0262628 A1 | 10/2010 | Singer | |
| 2011/0231520 A1 | 9/2011 | Ha et al. | |
| 2012/0005303 A1 | 1/2012 | Hwang et al. | |
| 2012/0147266 A1 | 6/2012 | Sridharan et al. | |
| 2012/0317303 A1 | 12/2012 | Wang | |
| 2012/0327879 A1 | 12/2012 | Stademelmeier et al. | |
| 2013/0074141 A1 * | 3/2013 | Hwang | H04N 21/8126 |
| | | | 725/116 |
| 2013/0195205 A1 | 8/2013 | Wang et al. | |
| 2013/0305305 A1 * | 11/2013 | Park | H04N 21/631 |
| | | | 725/109 |
| 2014/0019593 A1 | 1/2014 | Reznik et al. | |
| 2014/0304760 A1 | 10/2014 | Kim et al. | |
| 2014/0334504 A1 * | 11/2014 | Yie | H04H 20/18 |
| | | | 370/474 |
| 2014/0344875 A1 * | 11/2014 | Bae | H04N 21/2381 |
| | | | 725/109 |
| 2015/0120956 A1 * | 4/2015 | Bouazizi | H04L 65/602 |
| | | | 709/231 |

FOREIGN PATENT DOCUMENTS

| | | |
|---|---|---|
| CN | 101442521 A | 5/2009 |
| CN | 102783050 A | 11/2012 |
| EP | 2566156 A2 | 3/2013 |
| KR | 10-2011-0073340 A | 6/2011 |
| KR | 10-2011-0117686 A | 10/2011 |
| WO | 2005-039131 A1 | 4/2005 |
| WO | 2012091370 A1 | 7/2012 |

OTHER PUBLICATIONS

XP055223064: OSI Model from Wikipedia, Oct. 22, 2015, The Open Systems Interconnection (OSI) model, pp. 1-8.

* cited by examiner

| Content | Bits |
|---|---|
| PHY_PROFILE | 3 |
| FFT_SIZE | 2 |
| GI_FRACTION | 3 |
| EAC_FLAG | 1 |
| PILOT_MODE | 1 |
| PAPR_FLAG | 1 |
| FRU_CONFIGURE | 3 |
| RESERVED | 7 |

FIG. 13

| Content | Bits |
|---|---|
| PREAMBLE_DATA<br>NUM_FRAME_FRU<br>PAYLOAD_TYPE<br>NUM_FSS<br>SYSTEM_VERSION | 20<br>2<br>3<br>2<br>8 |
| CELL_ID<br>NETWORK_ID<br>SYSTEM_ID | 16<br>16<br>16 |
| for i = 0:3<br>    FRU_PHY_PROFILE<br>    FRU_FRAME_LENGTH<br>    FRU_GI_FRACTION<br>    RESERVED<br>end | <br>3<br>2<br>3<br>4<br> |
| PLS2_FEC_TYPE<br>PLS2_MOD<br>PLS2_SIZE_CELL<br>PLS2_STAT_SIZE_BIT<br>PLS2_SYN_SIZE_BIT<br>PLS2_REP_FLAG<br>PLS2_REP_SIZE_CELL<br>PLS2_NEXT_FEC_TYPE<br>PLS2_NEXT_MODE<br>PLS2_NEXT_REP_FLAG<br>PLS2_NEXT_REP_SIZE_CELL<br>PLS2_NEXT_REP_STAT_SIZE_BIT<br>PLS2_NEXT_REP_DYN_SIZE_BIT<br>PLS2_AP_MODE<br>PLS2_AP_SIZE_CELL<br>PLS2_NEXT_AP_MODE<br>PLS2_NEXT_AP_SIZE_CELL | 2<br>3<br>15<br>14<br>14<br>1<br>15<br>2<br>3<br>1<br>15<br>14<br>14<br>2<br>15<br>2<br>15 |
| RESERVED<br>CRC 32 | 32<br>32 |

FIG. 14

| Content | Bits |
|---|---|
| FIC_FLAG | 1 |
| AUX_FLAG | 1 |
| NUM_DP | 6 |
| for i = 1 : NUM_DP | |
|     DP_ID | 6 |
|     DP_TYPE | 3 |
|     DP_GROUP_ID | 8 |
|     BASE_DP_ID | 6 |
|     DP_FEC_TYPE | 2 |
|     DP_COD | 4 |
|     DP_MOD | 4 |
|     DP_SSD_FLAG | 1 |
|     if PHY_PROFILE = '010' | |
|         DP_MIMO | 3 |
|     end | |
|     DP_TI_TYPE | 1 |
|     DP_TI_LENGTH | 2 |
|     DP_TI_BYPASS | 1 |
|     DP_FRAME_INTERVAL | 2 |
|     DP_FIRST_FRAME_IDX | 5 |
|     DP_NUM_BLOCK_MAX | 10 |
|     DP_PAYLOAD_TYPE | 2 |
|     DP_INBAND_MODE | 2 |
|     DP_PROTOCOL_TYPE | 2 |
|     DP_CRC_MODE | 2 |
|     if DP_PAYLOAD_TYPE == TS('00') | |
|         DNP_MODE | 2 |
|         ISSY_MODE | 2 |
|         HC_MODE_TS | 2 |
|         if HC_MODE_TS == '01' or '10' | |
|             PID | 13 |
|         end | |
|     if DP_PAYLOAD_TYPE == IP('01') | |
|         HC_MODE_IP | 2 |
|     end | |
|     RESERVED | 8 |
| end | |
| if FIC_FLAG == 1 | |
|     FIC_VERSION | 8 |
|     FIC_LENGTH_BYTE | 13 |
|     RESERVED | 8 |
| end | |
| if AUX_FLAG == 1 | |
|     NUM_AUX | 4 |
|     AUX_CONFIG_RFU | 8 |
|     for - 1 : NUM_AUX | |
|         AUX_STREAM_TYPE | 4 |
|         AUX_PRIVATE_CONF | 28 |
|     end | |
| end | |

| Content | Bit |
|---|---|
| FRAME_INDEX | 5 |
| PLS_CHANGE_COUNTER | 4 |
| FIC_CHANGE_COUNTER | 4 |
| RESERVED | 16 |
| for i = 1: NUM_DP | |
|     DP_ID | 6 |
|     DP_START | 15 (or 13) |
|     DP_NUM_BLOCK | 10 |
| end     RESERVED | 8 |
| EAC_FLAG | 1 |
| EAS_WAKE_UP_VERSION_NUM | 8 |
| if EAC_FLAG == 1 | |
|     EAC_LENGTH_BYTE | 12 |
| else | |
|     EAC_COUNTER | 12 |
| end | |
| for i=1:NUM_AUX | |
|     AUX_PRIVATE_DYN | 48 |
| end | |
| CRC 32 | 32 |

FIG. 25
(a) 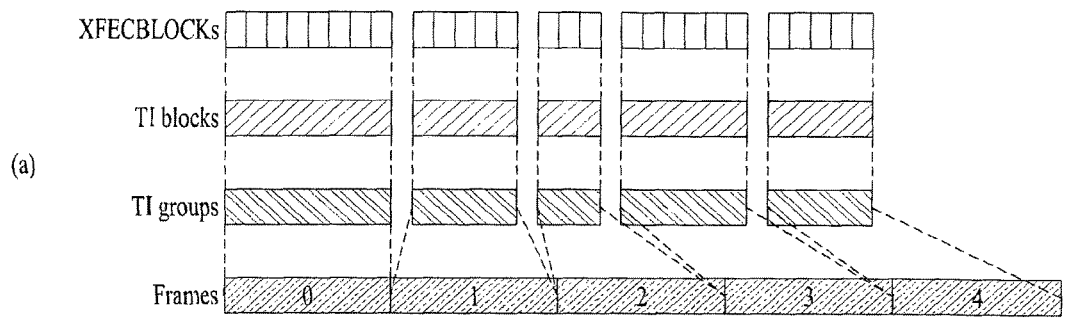
(b) 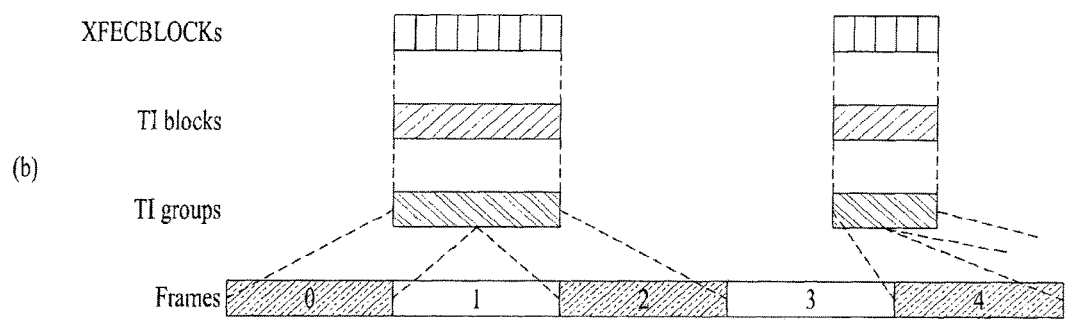
(c) 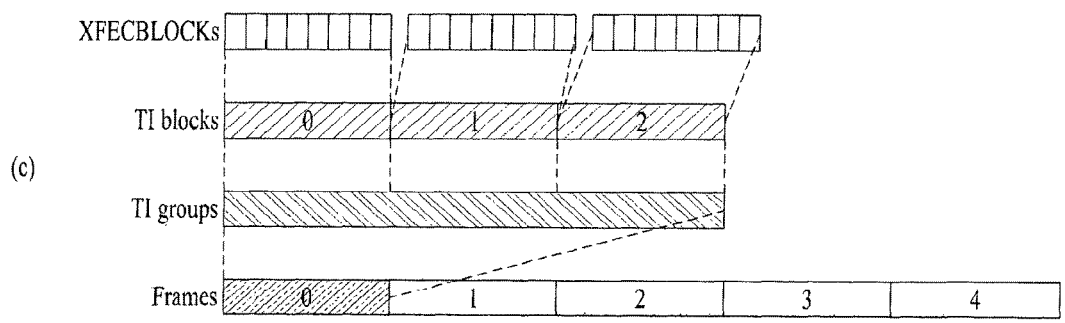

| Code rate | 8 bpcu | | 12 bpcu | |
|---|---|---|---|---|
| | Constellation | a | Constellation | a |
| 5/15 | QAM-16 | 0 | NUQ-64 for CR=5/15 | 0.1571 |
| 6/15 | QAM-16 | 0.0035 | NUQ-64 for CR=5/15 | 0.1396 |
| 7/15 | QAM-16 | 0.1222 | NUQ-64 for CR=6/15 | 0.2129 |
| 8/15 | QAM-16 | 0.1571 | NUQ-64 for CR=8/15 | 0.2548 |
| 9/15 | QAM-16 | 0.1710 | NUQ-64 for CR=11/15 | 0.2653 |
| 10/15 | QAM-16 | 0.1780 | NUQ-64 for CR=12/15 | 0.2566 |
| 11/15 | QAM-16 | 0.1798 | NUQ-64 for CR=12/15 | 0.2548 |
| 12/15 | QAM-16 | 0.1815 | NUQ-64 for CR=13/15 | 0.2583 |
| 13/15 | QAM-16 | 0.1815 | NUQ-64 for CR=13/15 | 0.2583 |

Fig. 38

| Code rate | 10 bpcu | |
|---|---|---|
| | Constellation | a |
| 5/15 | QAM-16 / NUQ-64 for CR=5/15 | 0 |
| 6/15 | QAM-16 / NUQ-64 for CR=5/15 | 0 |
| 7/15 | QAM-16 / NUQ-64 for CR=6/15 | 0 |
| 8/15 | QAM-16 / NUQ-64 for CR=8/15 | 0 |
| 9/15 | QAM-16 / NUQ-64 for CR=11/15 | 0 |
| 10/15 | QAM-16 / NUQ-64 for CR=12/15 | 0 |
| 11/15 | QAM-16 / NUQ-64 for CR=12/15 | 0 |
| 12/15 | QAM-16 / NUQ-64 for CR=13/15 | 0 |
| 13/15 | QAM-16 / NUQ-64 for CR=13/15 | 0 |

$$G_1 = \begin{bmatrix} 1 & 0 & 0 & 0 & 0 & 0 \\ 1 & 0 & 0 & 0 & 1 & 0 \\ 1 & 0 & 0 & 0 & 1 & 1 \\ 1 & 0 & 0 & 1 & 0 & 0 \\ 1 & 0 & 0 & 1 & 0 & 1 \\ 1 & 0 & 0 & 1 & 1 & 0 \\ 1 & 0 & 0 & 1 & 1 & 1 \end{bmatrix}$$

$$G_2 = \begin{bmatrix} 1 & 0 & 0 & 1 & 1 & 1 & 1 \\ 1 & 0 & 0 & 1 & 1 & 1 & 0 \\ 1 & 0 & 0 & 1 & 1 & 0 & 1 \\ 1 & 0 & 0 & 1 & 1 & 0 & 0 \\ 1 & 0 & 0 & 1 & 0 & 1 & 1 \\ 1 & 0 & 0 & 1 & 0 & 1 & 0 \\ 1 & 0 & 0 & 1 & 0 & 0 & 1 \\ 1 & 0 & 0 & 1 & 0 & 0 & 0 \end{bmatrix}$$

$$G_3 = \begin{bmatrix} 1 & 0 & 1 & 0 & 1 & 1 & 1 \\ 1 & 0 & 1 & 0 & 1 & 0 & 1 \\ 1 & 0 & 1 & 0 & 1 & 0 & 0 \\ 1 & 0 & 1 & 0 & 0 & 1 & 1 \\ 1 & 0 & 1 & 0 & 0 & 1 & 0 \\ 1 & 0 & 1 & 0 & 0 & 0 & 1 \\ 1 & 0 & 1 & 0 & 0 & 0 & 0 \end{bmatrix}$$

$$G_4 = \begin{bmatrix} 1 & 0 & 1 & 1 & 1 & 1 \\ 1 & 0 & 1 & 1 & 1 & 0 \\ 1 & 0 & 1 & 1 & 0 & 1 \\ 1 & 0 & 1 & 1 & 0 & 0 \\ 1 & 0 & 1 & 0 & 1 & 1 \\ 1 & 0 & 1 & 0 & 1 & 0 \\ 1 & 0 & 1 & 0 & 0 & 1 \\ 1 & 0 & 1 & 0 & 0 & 0 \end{bmatrix}$$

$$G_5 = \begin{bmatrix} 1 & 1 & 0 & 0 & 1 & 1 \\ 1 & 1 & 0 & 0 & 1 & 0 \\ 1 & 1 & 0 & 0 & 0 & 1 \\ 1 & 1 & 0 & 0 & 1 & 0 \\ 1 & 1 & 0 & 0 & 1 & 1 \\ 1 & 1 & 0 & 0 & 1 & 0 \\ 1 & 1 & 0 & 0 & 0 & 1 \\ 1 & 1 & 0 & 0 & 0 & 0 \end{bmatrix}$$

$$G_6 = \begin{bmatrix} 1 & 1 & 0 & 1 & 1 & 1 \\ 1 & 1 & 0 & 1 & 1 & 0 \\ 1 & 1 & 0 & 1 & 0 & 1 \\ 1 & 1 & 0 & 1 & 0 & 0 \\ 1 & 1 & 0 & 1 & 0 & 1 \\ 1 & 1 & 0 & 1 & 1 & 0 \\ 1 & 1 & 0 & 1 & 0 & 1 \\ 1 & 1 & 0 & 1 & 0 & 0 \end{bmatrix}$$

$$G_7 = \begin{bmatrix} 1 & 0 & 1 & 1 & 1 & 1 \\ 1 & 0 & 1 & 1 & 1 & 0 \\ 1 & 0 & 1 & 1 & 0 & 1 \\ 1 & 0 & 1 & 1 & 0 & 0 \\ 1 & 0 & 1 & 0 & 1 & 1 \\ 1 & 0 & 1 & 0 & 1 & 0 \\ 1 & 0 & 1 & 0 & 0 & 1 \\ 1 & 0 & 1 & 0 & 0 & 0 \end{bmatrix}$$

$$G_8 = \begin{bmatrix} 1 & 1 & 1 & 1 & 1 & 1 & 1 \\ 1 & 1 & 1 & 1 & 1 & 1 & 0 \\ 1 & 1 & 1 & 1 & 1 & 0 & 1 \\ 1 & 1 & 1 & 1 & 0 & 1 & 1 \\ 1 & 1 & 1 & 0 & 1 & 0 \\ 1 & 1 & 1 & 0 & 0 & 1 \\ 1 & 1 & 1 & 0 & 0 & 0 \\ 1 & 1 & 0 & 0 & 0 & 1 \\ 1 & 1 & 0 & 0 & 0 & 0 \\ 1 & 1 & 1 & 0 & 1 & 0 \\ 1 & 1 & 1 & 0 & 0 & 1 \\ 1 & 1 & 0 & 0 & 1 & 0 \\ 1 & 1 & 0 & 0 & 0 & 1 \\ 1 & 1 & 0 & 0 & 0 & 0 \end{bmatrix}$$

Fig. 43

| 139 | 143 | 145 | 146 | 148 | 149 | 150 | 151 | 153 | 154 | 156 | 157 | 158 | 160 | 164 | 165 | 166 |
| 167 | 169 | 170 | 172 | 173 | 174 | 176 | 179 | 184 | 188 | 189 | 190 | 192 | 196 | 197 | 198 | 199 |
| 201 | 202 | 203 | 207 | 209 | 210 | 212 | 213 | 214 | 215 | 217 | 218 | 220 | 221 | 222 | 224 | 228 |
| 229 | 230 | 231 | 233 | 234 | 235 | 239 | 241 | 242 | 244 | 245 | 246 | 247 | 267 | 268 | 270 | 271 |
| 272 | 273 | 275 | 276 | 278 | 282 | 285 | 290 | 291 | 292 | 294 | 298 | 299 | 300 | 302 | 303 | 304 |
| 305 | 307 | 308 | 310 | 314 | 315 | 316 | 318 | 319 | 320 | 321 | 325 | 327 | 328 | 329 | 333 | 338 |
| 341 | 343 | 344 | 345 | 347 | 348 | 350 | 351 | 352 | 353 | 357 | 359 | 360 | 361 | 363 | 364 | 366 |
| 367 | 368 | 369 | 371 | 372 | 374 | 378 | 379 | 380 | 382 | 383 | 384 | 385 | 389 | 391 | 392 | 393 |
| 397 | 402 | 405 | 407 | 408 | 409 | 411 | 412 | 414 | 415 | 416 | 417 | 421 | 423 | 424 | 425 | 429 |
| 434 | 437 | 439 | 440 | 441 | 445 | 450 | 451 | 452 | 454 | 458 | 461 | 466 | 469 | 471 | 472 | 473 |
| 475 | 476 | 478 | 479 | 480 | 481 | 485 | 487 | 488 | 489 | 491 | 492 | 494 | 495 | 496 | 497 | 499 |
| 500 | 502 | 506 | 507 | 508 | 510 | 511 | 512 | 513 | 517 | 519 | 520 | 521 | 523 | 524 | 526 | 527 |
| 528 | 529 | 531 | 532 | 534 | 538 | 541 | 546 | 547 | 548 | 550 | 554 | 555 | 556 | 558 | 559 | 560 |
| 561 | 563 | 564 | 566 | 570 | 571 | 572 | 574 | 575 | 576 | 577 | 581 | 583 | 584 | 585 | 589 | 594 |
| 597 | 599 | 600 | 601 | 603 | 604 | 606 | 607 | 608 | 609 | 613 | 615 | 616 | 617 | 619 | 620 | 622 |
| 623 | 624 | 625 | 627 | 628 | 630 | 634 | 635 | 636 | 638 | 639 | 640 | 641 | 645 | 647 | 648 | 649 |
| 651 | 652 | 654 | 655 | 656 | 657 | 659 | 660 | 662 | 666 | 669 | 674 | 675 | 676 | 678 | 682 | 683 |
| 684 | 686 | 687 | 688 | 689 | 691 | 692 | 694 | 698 | 699 | 700 | 702 | 703 | 704 | 705 | 709 | 711 |
| 712 | 713 | 715 | 716 | 718 | 719 | 720 | 721 | 723 | 724 | 726 | 730 | 733 | 738 | 779 | 781 | 782 |
| 784 | 785 | 786 | 787 | 789 | 790 | 791 | 795 | 797 | 798 | 800 | 801 | 802 | 804 | 808 | 809 | 810 |
| 812 | 815 | 820 | 824 | 825 | 826 | 827 | 829 | 830 | 832 | 833 | 834 | 836 | 840 | 841 | 842 | 843 |
| 845 | 846 | 848 | 849 | 850 | 851 | 853 | 854 | 855 | 859 | 861 | 862 | 864 | 865 | 866 | 868 | 872 |
| 873 | 874 | 875 | 877 | 878 | 880 | 881 | 882 | 883 | 885 | | | | | | | |

APPARATUS FOR TRANSMITTING BROADCAST SIGNALS, APPARATUS FOR RECEIVING BROADCAST SIGNALS, METHOD FOR TRANSMITTING BROADCAST SIGNALS AND METHOD FOR RECEIVING BROADCAST SIGNALS

This application is a Continuation of application Ser. No. 14/893,753 filed Nov. 24, 2015, which is a National Stage Application of International Application No. PCT/KR2014/005161, filed on Jun. 12, 2014, which claims the benefit of U.S. Provisional Application No. 61/926,934, filed on Jan. 13, 2014, and U.S. Provisional Application No. 61/834,397, filed on Jun. 12, 2013, the entire content of the prior applications is hereby incorporated by reference.

TECHNICAL FIELD

The present invention relates to an apparatus for transmitting broadcast signals, an apparatus for receiving broadcast signals and methods for transmitting and receiving broadcast signals.

BACKGROUND ART

As analog broadcast signal transmission comes to an end, various technologies for transmitting/receiving digital broadcast signals are being developed. A digital broadcast signal may include a larger amount of video/audio data than an analog broadcast signal and further include various types of additional data in addition to the video/audio data.

That is, a digital broadcast system can provide HD (high definition) images, multi-channel audio and various additional services. However, data transmission efficiency for transmission of large amounts of data, robustness of transmission/reception networks and network flexibility in consideration of mobile reception equipment need to be improved for digital broadcast.

DISCLOSURE

Technical Problem

An object of the present invention is to provide an apparatus and method for transmitting broadcast signals to multiplex data of a broadcast transmission/reception system providing two or more different broadcast services in a time domain and transmit the multiplexed data through the same RF signal bandwidth and an apparatus and method for receiving broadcast signals corresponding thereto.

Another object of the present invention is to provide an apparatus for transmitting broadcast signals, an apparatus for receiving broadcast signals and methods for transmitting and receiving broadcast signals to classify data corresponding to services by components, transmit data corresponding to each component as a data pipe, receive and process the data Still another object of the present invention is to provide an apparatus for transmitting broadcast signals, an apparatus for receiving broadcast signals and methods for transmitting and receiving broadcast signals to signal signaling information necessary to provide broadcast signals.

Technical Solution

To achieve the object and other advantages and in accordance with the purpose of the invention, as embodied and broadly described herein, the present invention provides a method of transmitting broadcast signals. The method of transmitting broadcast signals includes formatting input streams into Data Pipe (DP) data, Low-Density Parity-Check (LDPC) encoding the DP data according to a code rate, bit interleaving the LDPC encoded DP data, mapping the bit interleaved DP data onto constellations, building at least one signal frame including the mapped DP data and modulating data in the built signal frame by an Orthogonal Frequency Division Multiplexing (OFDM) method and transmitting the broadcast signals having the modulated data, wherein the input streams include Audio/Video (A/V) data and service guide data, and wherein the Audio/Video (A/V) data and service guide data are included in first ISO base media file format (ISOBMFF) files.

Preferably, the input streams further include non-real time content data which are delivered in advance its use and stored in a receiving device, and wherein the non-real time content data are included in second ISO base media file format (ISOBMFF) files.

Preferably, the AV data which are transmitted in a real-time are to be combined with the non-real time content data to present a complete content.

Preferably, the first ISOBMFF files include a first timeline and the second ISOBMFF files include a second timeline, and the first timeline and the second timeline are used to synchronize the non-real time content with the A/V data.

Preferably, the second ISOBMFF files include a plurality of presentation units.

Preferably, the second timeline specify a clock rate and a start time corresponding to a first presentation unit in the second ISOBMFF files.

Preferably, the each of the presentation units has a presentation time relative to the second timeline.

The apparatus for transmitting broadcast signals includes a formatting module formatting input streams into Data Pipe (DP) data, a Low-Density Parity-Check (LDPC) encoding module LDPC encoding the DP data according to a code rate, a bit interleaving module bit interleaving the LDPC encoded DP data, a mapping module mapping the bit interleaved DP data onto constellations, a frame building module building at least one signal frame including the mapped DP data, a modulating module modulating data in the built signal frame by an Orthogonal Frequency Division Multiplexing (OFDM) method, and a transmitting module transmitting the broadcast signals having the modulated data, wherein the input streams include Audio/Video (A/V) data and service guide data, and wherein the Audio/Video (A/V) data and service guide data are included in first ISO base media file format (ISOBMFF) files.

Preferably, the input streams further include non-real time content data which are delivered in advance its use and stored in a receiving device, and the non-real time content data are included in second ISO base media file format (ISOBMFF) files.

Preferably, the AV data which are transmitted in a real-time are to be combined with the non-real time content data to present a complete content.

Preferably, the first ISOBMFF files include a first timeline and the second ISOBMFF files include a second timeline, and the first timeline and the second timeline are used to synchronize the non-real time content with the A/V data.

Preferably, the second ISOBMFF files include a plurality of presentation units.

Preferably, the second timeline specify a clock rate and a start time corresponding to a first presentation unit in the second ISOBMFF files.

Preferably, the each of the presentation units has a presentation time relative to the second timeline.

Advantageous Effects

The present invention can process data according to service characteristics to control QoS (Quality of Services) for each service or service component, thereby providing various broadcast services.

The present invention can achieve transmission flexibility by transmitting various broadcast services through the same RF signal bandwidth.

The present invention can improve data transmission efficiency and increase robustness of transmission/reception of broadcast signals using a MIMO system.

According to the present invention, it is possible to provide broadcast signal transmission and reception methods and apparatus capable of receiving digital broadcast signals without error even with mobile reception equipment or in an indoor environment.

DESCRIPTION OF DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIG. 13 illustrates PLS1 data according to an embodiment of the present invention.

FIG. 14 illustrates PLS2 data according to an embodiment of the present invention.

FIG. 25 illustrates a time interleaving according to an embodiment of the present invention.

FIG. 29 illustrates interlaved XFECBLOCKs from each interleaving array according to an embodiment of the present invention.

FIG. 37 illustrates MIMO parameter table according to an embodiment of the present invention.

FIG. 38 illustrates MIMO parameter table according to other embodiment of the present invention.

FIG. 41 illustrates sub-matrixes of Reed Muller generator matrix G according to an embodiment of the present invention.

FIG. 43 illustrates distribution of the active carriers according to an embodiment of the present invention.

BEST MODE

Figure 1:
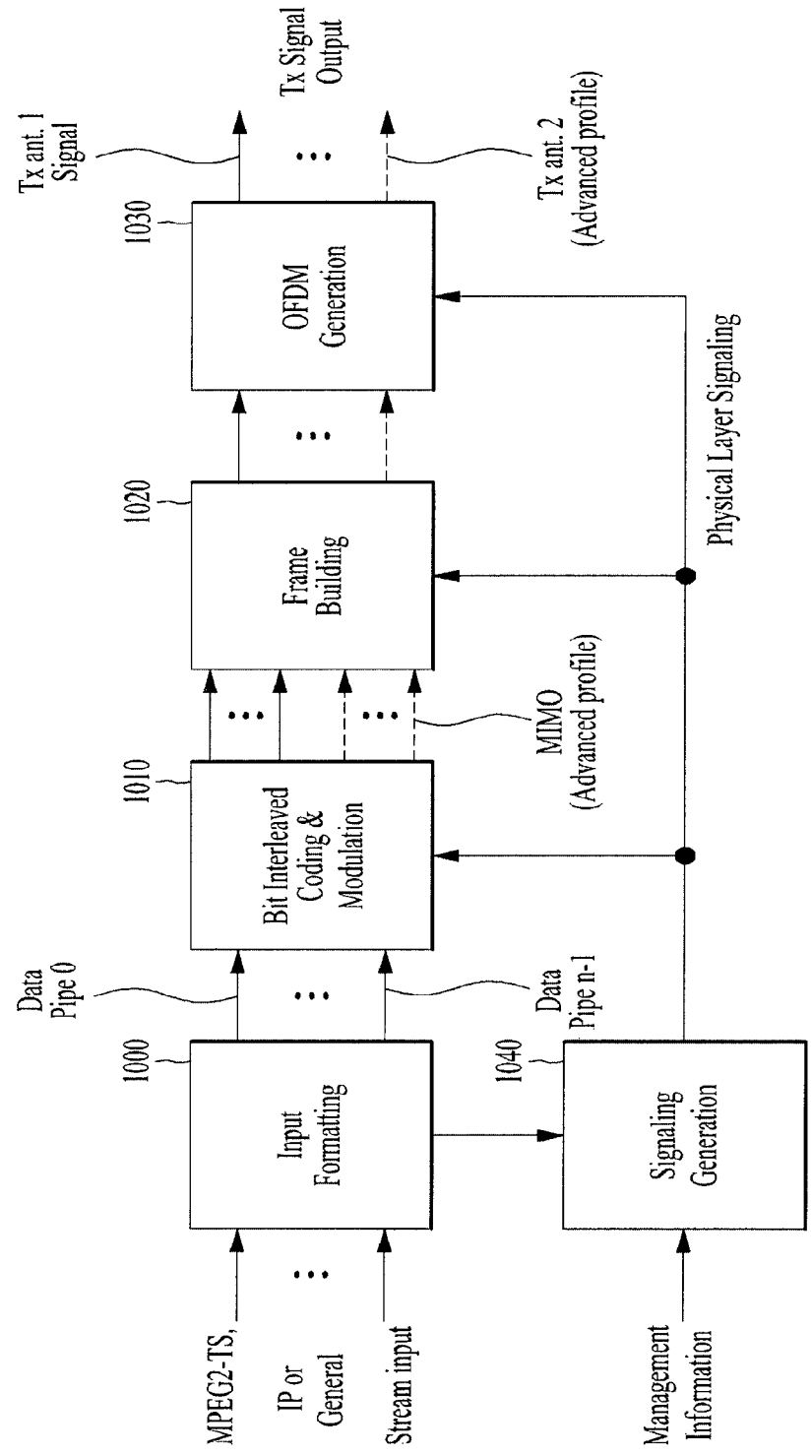
FIG. 1 illustrates a structure of an apparatus for transmitting broadcast signals for future broadcast services according to an embodiment of the present invention.

Reference will now be made in detail to the preferred embodiments of the present invention, examples of which are illustrated in the accompanying drawings. The detailed description, which will be given below with reference to the accompanying drawings, is intended to explain exemplary embodiments of the present invention, rather than to show the only embodiments that can be implemented according to the present invention. The following detailed description includes specific details in order to provide a thorough understanding of the present invention. However, it will be apparent to those skilled in the art that the present invention may be practiced without such specific details.

Although most terms used in the present invention have been selected from general ones widely used in the art, some terms have been arbitrarily selected by the applicant and their meanings are explained in detail in the following description as needed. Thus, the present invention should be understood based upon the intended meanings of the terms rather than their simple names or meanings.

The present invention provides apparatuses and methods for transmitting and receiving broadcast signals for future broadcast services. Future broadcast services according to an embodiment of the present invention include a terrestrial broadcast service, a mobile broadcast service, a UHDTV service, etc. The present invention may process broadcast signals for the future broadcast services through non-MIMO (Multiple Input Multiple Output) or MIMO according to one embodiment. A non-MIMO scheme according to an embodiment of the present invention may include a MISO (Multiple Input Single Output) scheme, a SISO (Single Input Single Output) scheme, etc.

While MISO or MIMO uses two antennas in the following for convenience of description, the present invention is applicable to systems using two or more antennas.

The present invention may defines three physical layer (PL) profiles—base, handheld and advanced profiles—each optimized to minimize receiver complexity while attaining the performance required for a particular use case. The physical layer (PHY) profiles are subsets of all configurations that a corresponding receiver should implement.

The three PHY profiles share most of the functional blocks but differ slightly in specific blocks and/or parameters. Additional PHY profiles can be defined in the future. For the system evolution, future profiles can also be multiplexed with the existing profiles in a single RF channel through a future extension frame (FEF). The details of each PHY profile are described below.

1. Base Profile

The base profile represents a main use case for fixed receiving devices that are usually connected to a roof-top antenna. The base profile also includes portable devices that could be transported to a place but belong to a relatively stationary reception category. Use of the base profile could be extended to handheld devices or even vehicular by some improved implementations, but those use cases are not expected for the base profile receiver operation.

Target SNR range of reception is from approximately 10 to 20 dB, which includes the 15 dB SNR reception capability of the existing broadcast system (e.g. ATSC A/53). The receiver complexity and power consumption is not as critical as in the battery-operated handheld devices, which will use the handheld profile. Key system parameters for the base profile are listed in below table 1.

TABLE 1

| | |
|---|---|
| LDPC codeword length | 16K, 64K bits |
| Constellation size | 4~10 bpcu (bits per channel use) |
| Time de-interleaving memory size | ≤$2^{19}$ data cells |
| Pilot patterns | Pilot pattern for fixed reception |
| FFT size | 16K, 32K points |

2. Handheld Profile

The handheld profile is designed for use in handheld and vehicular devices that operate with battery power. The devices can be moving with pedestrian or vehicle speed. The power consumption as well as the receiver complexity is very important for the implementation of the devices of the handheld profile. The target SNR range of the handheld profile is approximately 0 to 10 dB, but can be configured to reach below 0 dB when intended for deeper indoor reception.

In addition to low SNR capability, resilience to the Doppler Effect caused by receiver mobility is the most important performance attribute of the handheld profile. Key system parameters for the handheld profile are listed in the below table 2.

TABLE 2

| | |
|---|---|
| LDPC codeword length | 16K bits |
| Constellation size | 2~8 bpcu |
| Time de-interleaving memory size | ≤$2^{18}$ data cells |
| Pilot patterns | Pilot patterns for mobile and indoor reception |
| FFT size | 8K, 16K points |

3. Advanced Profile

The advanced profile provides highest channel capacity at the cost of more implementation complexity. This profile requires using MIMO transmission and reception, and UHDTV service is a target use case for which this profile is specifically designed. The increased capacity can also be used to allow an increased number of services in a given bandwidth, e.g., multiple SDTV or HDTV services.

The target SNR range of the advanced profile is approximately 20 to 30 dB. MIMO transmission may initially use existing elliptically-polarized transmission equipment, with extension to full-power cross-polarized transmission in the future. Key system parameters for the advanced profile are listed in below table 3.

TABLE 3

| | |
|---|---|
| LDPC codeword length | 16K, 64K bits |
| Constellation size | 8~12 bpcu |
| Time de-interleaving memory size | ≤$2^{19}$ data cells |
| Pilot patterns | Pilot pattern for fixed reception |
| FFT size | 16K, 32K points |

FIG. 1 illustrates a structure of an apparatus for transmitting broadcast signals for future broadcast services according to an embodiment of the present invention.

The apparatus for transmitting broadcast signals for future broadcast services according to an embodiment of the present invention can include an input formatting block 1000, a BICM (Bit interleaved coding & modulation) block 1010, a frame structure block 1020, an OFDM (Orthogonal Frequency Division Multiplexing) generation block 1030 and a signaling generation block 1040. A description will be given of the operation of each module of the apparatus for transmitting broadcast signals.

IP stream/packets and MPEG2-TS are the main input formats, other stream types are handled as General Streams. In addition to these data inputs, Management Information is input to control the scheduling and allocation of the corresponding bandwidth for each input stream. One or multiple TS stream(s), IP stream(s) and/or General Stream(s) inputs are simultaneously allowed.

The input formatting block 1000 can demultiplex each input stream into one or multiple data pipe(s), to each of which an independent coding and modulation is applied. The data pipe (DP) is the basic unit for robustness control, thereby affecting quality-of-service (QoS). One or multiple service(s) or service component(s) can be carried by a single DP. Details of operations of the input formatting block 1000 will be described later.

The data pipe is a logical channel in the physical layer that carries service data or related metadata, which may carry one or multiple service(s) or service component(s).

Also, the data pipe unit: a basic unit for allocating data cells to a DP in a frame.

In the BICM block 1010, parity data is added for error correction and the encoded bit streams are mapped to complex-value constellation symbols. The symbols are interleaved across a specific interleaving depth that is used for the corresponding DP. For the advanced profile, MIMO encoding is performed in the BICM block 1010 and the additional data path is added at the output for MIMO transmission. Details of operations of the BICM block 1010 will be described later.

The Frame Building block 1020 can map the data cells of the input DPs into the OFDM symbols within a frame. After mapping, the frequency interleaving is used for frequency-domain diversity, especially to combat frequency-selective fading channels. Details of operations of the Frame Building block 1020 will be described later.

After inserting a preamble at the beginning of each frame, the OFDM Generation block 1030 can apply conventional OFDM modulation having a cyclic prefix as guard interval. For antenna space diversity, a distributed MISO scheme is applied across the transmitters. In addition, a Peak-to-Average Power Reduction (PAPR) scheme is performed in the time domain. For flexible network planning, this proposal provides a set of various FFT sizes, guard interval lengths and corresponding pilot patterns. Details of operations of the OFDM Generation block 1030 will be described later.

The Signaling Generation block 1040 can create physical layer signaling information used for the operation of each functional block. This signaling information is also transmitted so that the services of interest are properly recovered at the receiver side. Details of operations of the Signaling Generation block 1040 will be described later.

Figure 2:
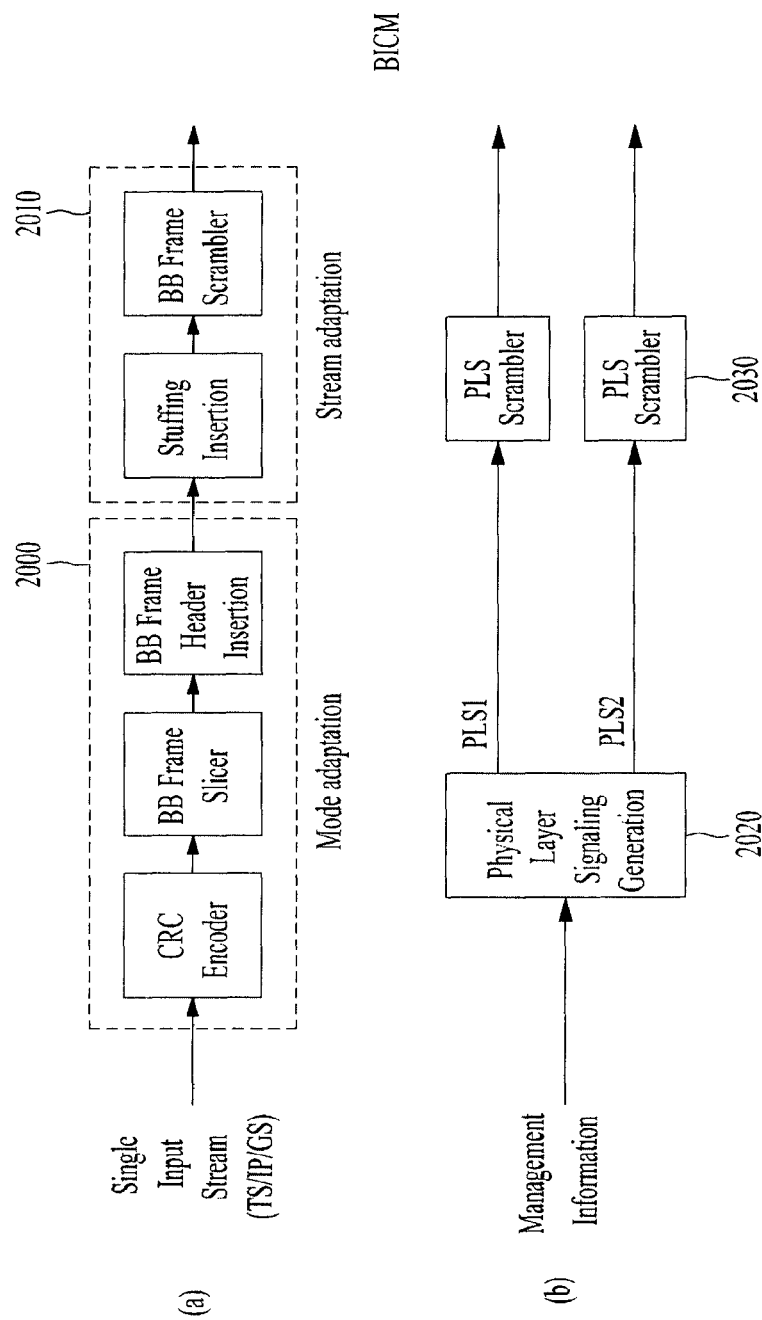
FIG. 2 illustrates an input formatting block according to one embodiment of the present invention.
Figure 3:
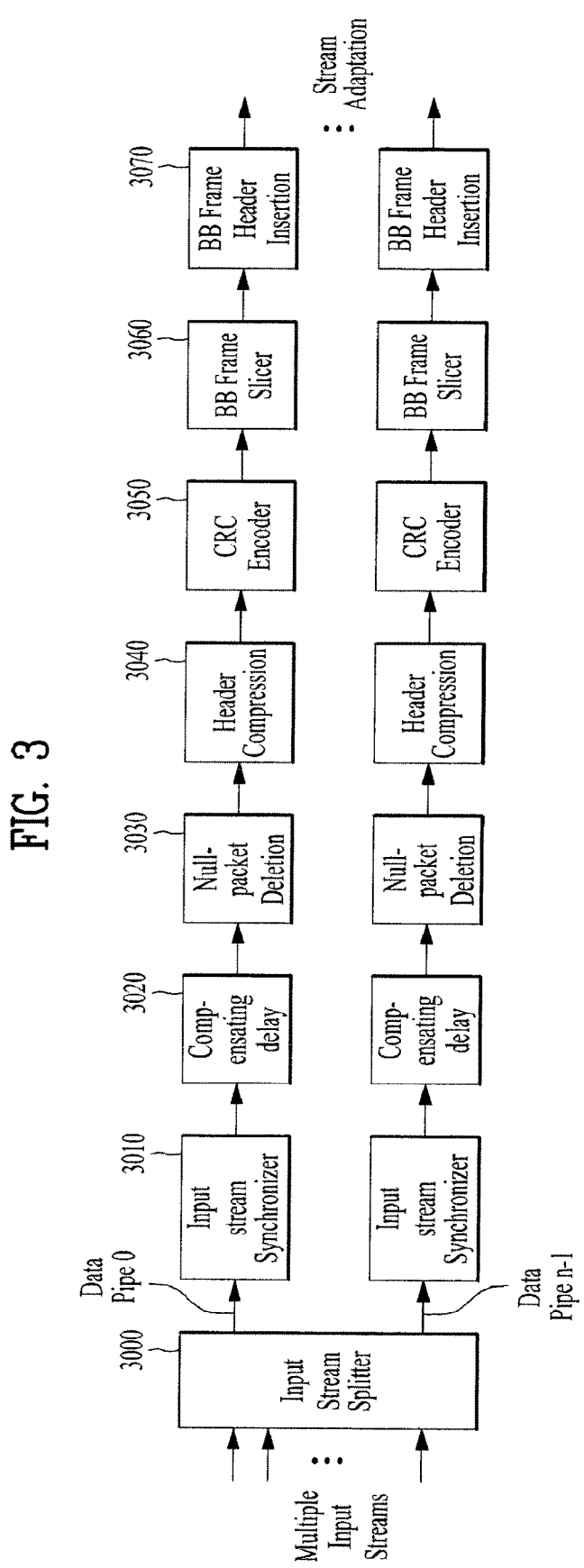
FIG. 3 illustrates an input formatting block according to another embodiment of the present invention.
Figure 4:
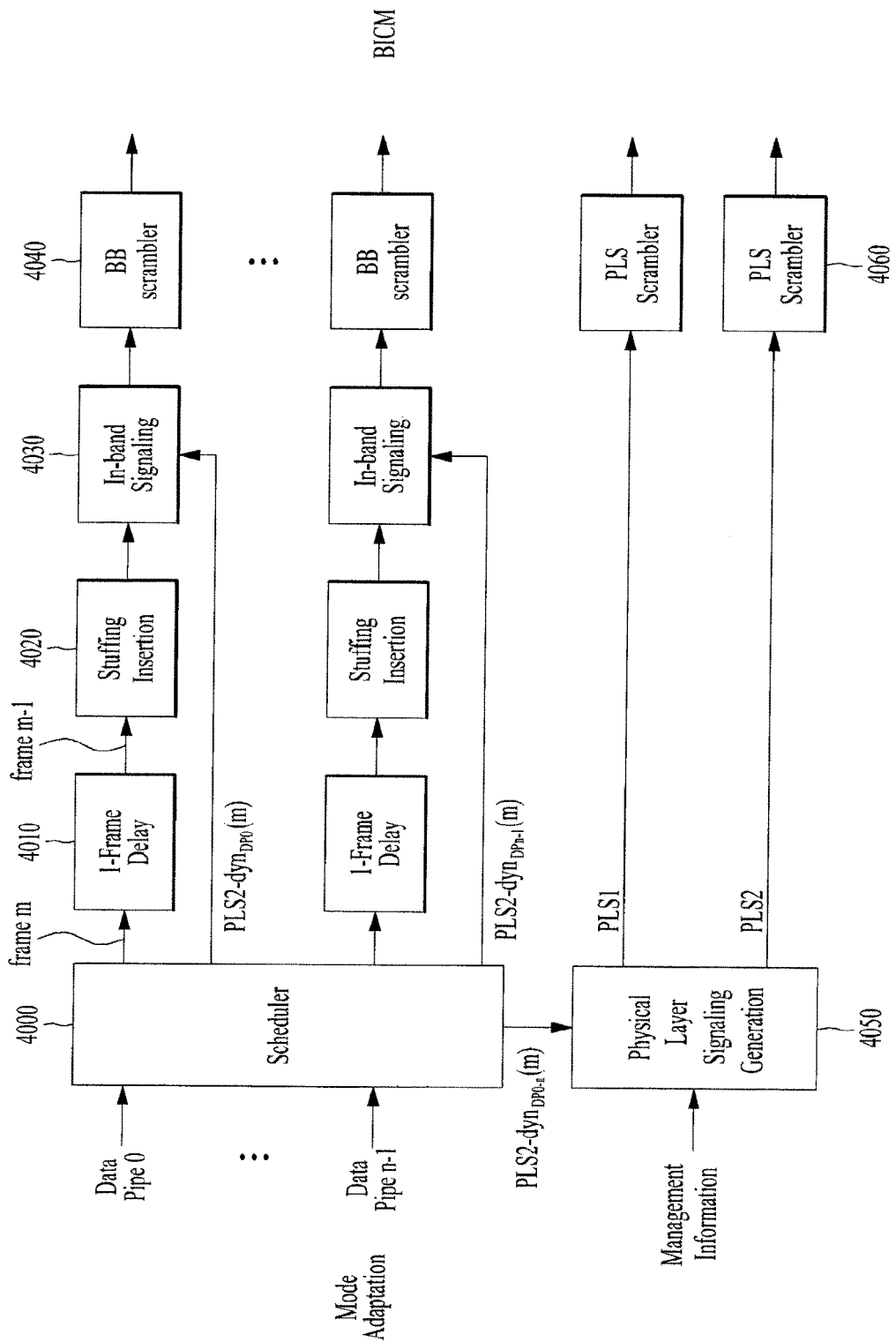
FIG. 4 illustrates an input formatting block according to another embodiment of the present invention.

FIGS. 2, 3 and 4 illustrate the input formatting block 1000 according to embodiments of the present invention. A description will be given of each figure.

FIG. 2 illustrates an input formatting block according to one embodiment of the present invention. FIG. 2 shows an input formatting module when the input signal is a single input stream.

The input formatting block illustrated in FIG. 2 corresponds to an embodiment of the input formatting block 1000 described with reference to FIG. 1.

The input to the physical layer may be composed of one or multiple data streams. Each data stream is carried by one DP. The mode adaptation modules slice the incoming data stream into data fields of the baseband frame (BBF). The system supports three types of input data streams: MPEG2-TS, Internet protocol (IP) and Generic stream (GS). MPEG2-TS is characterized by fixed length (188 byte) packets with the first byte being a sync-byte (0x47). An IP stream is composed of variable length IP datagram packets, as signaled within IP packet headers. The system supports both IPv4 and IPv6 for the IP stream. GS may be composed of variable length packets or constant length packets, signaled within encapsulation packet headers.

(a) shows a mode adaptation block 2000 and a stream adaptation 2010 for signal DP and (b) shows a PLS generation block 2020 and a PLS scrambler 2030 for generating and processing PLS data. A description will be given of the operation of each block.

The Input Stream Splitter splits the input TS, IP, GS streams into multiple service or service component (audio, video, etc.) streams. The mode adaptation module 2010 is comprised of a CRC Encoder, BB (baseband) Frame Slicer, and BB Frame Header Insertion block.

The CRC Encoder provides three kinds of CRC encoding for error detection at the user packet (UP) level, i.e., CRC-8, CRC-16, and CRC-32. The computed CRC bytes are appended after the UP. CRC-8 is used for TS stream and CRC-32 for IP stream. If the GS stream doesn't provide the CRC encoding, the proposed CRC encoding should be applied.

BB Frame Slicer maps the input into an internal logical-bit format. The first received bit is defined to be the MSB. The BB Frame Slicer allocates a number of input bits equal to the available data field capacity. To allocate a number of input bits equal to the BBF payload, the UP packet stream is sliced to fit the data field of BBF.

BB Frame Header Insertion block can insert fixed length BBF header of 2 bytes is inserted in front of the BB Frame. The BBF header is composed of STUFFI (1 bit), SYNCD (13 bits), and RFU (2 bits). In addition to the fixed 2-Byte BBF header, BBF can have an extension field (1 or 3 bytes) at the end of the 2-byte BBF header.

The stream adaptation 2010 is comprised of stuffing insertion block and BB scrambler.

The stuffing insertion block can insert stuffing field into a payload of a BB frame. If the input data to the stream adaptation is sufficient to fill a BB-Frame, STUFFI is set to '0' and the BBF has no stuffing field. Otherwise STUFFI is set to '1' and the stuffing field is inserted immediately after the BBF header. The stuffing field comprises two bytes of the stuffing field header and a variable size of stuffing data.

The BB scrambler scrambles complete BBF for energy dispersal. The scrambling sequence is synchronous with the BBF. The scrambling sequence is generated by the feedback shift register.

The PLS generation block 2020 can generate physical layer signaling (PLS) data. The PLS provides the receiver with a means to access physical layer DPs. The PLS data consists of PLS1 data and PLS2 data.

The PLS1 data is a first set of PLS data carried in the FSS symbols in the frame having a fixed size, coding and modulation, which carries basic information about the system as well as the parameters needed to decode the PLS2 data. The PLS1 data provides basic transmission parameters including parameters required to enable the reception and decoding of the PLS2 data. Also, the PLS1 data remains constant for the duration of a frame-group.

The PLS2 data is a second set of PLS data transmitted in the FSS symbol, which carries more detailed PLS data about the system and the DPs. The PLS2 contains parameters that provide sufficient information for the receiver to decode the desired DP. The PLS2 signaling further consists of two types of parameters, PLS2 Static data (PLS2-STAT data) and PLS2 dynamic data (PLS2-DYN data). The PLS2 Static data is PLS2 data that remains static for the duration of a frame-group and the PLS2 dynamic data is PLS2 data that may dynamically change frame-by-frame.

Details of the PLS data will be described later.

The PLS scrambler 2030 can scramble the generated PLS data for energy dispersal.

The above-described blocks may be omitted or replaced by blocks having similar or identical functions.

FIG. 3 illustrates an input formatting block according to another embodiment of the present invention.

The input formatting block illustrated in FIG. 3 corresponds to an embodiment of the input formatting block 1000 described with reference to FIG. 1.

FIG. 3 shows a mode adaptation block of the input formatting block when the input signal corresponds to multiple input streams.

The mode adaptation block of the input formatting block for processing the multiple input streams can independently process the multiple input streams.

Referring to FIG. 3, the mode adaptation block for respectively processing the multiple input streams can include an input stream splitter 3000, an input stream synchronizer 3010, a compensating delay block 3020, a null packet deletion block 3030, a head compression block 3040, a CRC encoder 3050, a BB frame slicer 3060 and a BB header insertion block 3070. Description will be given of each block of the mode adaptation block.

Operations of the CRC encoder 3050, BB frame slicer 3060 and BB header insertion block 3070 correspond to those of the CRC encoder, BB frame slicer and BB header insertion block described with reference to FIG. 2 and thus description thereof is omitted.

The input stream splitter 3000 can split the input TS, IP, GS streams into multiple service or service component (audio, video, etc.) streams.

The input stream synchronizer 3010 may be referred as ISSY. The ISSY can provide suitable means to guarantee Constant Bit Rate (CBR) and constant end-to-end transmission delay for any input data format. The ISSY is always used for the case of multiple DPs carrying TS, and optionally used for multiple DPs carrying GS streams.

The compensating delay block 3020 can delay the split TS packet stream following the insertion of ISSY information to allow a TS packet recombining mechanism without requiring additional memory in the receiver.

The null packet deletion block 3030, is used only for the TS input stream case. Some TS input streams or split TS streams may have a large number of null-packets present in order to accommodate VBR (variable bit-rate) services in a CBR TS stream. In this case, in order to avoid unnecessary transmission overhead, null-packets can be identified and not transmitted. In the receiver, removed null-packets can be re-inserted in the exact place where they were originally by reference to a deleted null-packet (DNP) counter that is inserted in the transmission, thus guaranteeing constant bit-rate and avoiding the need for time-stamp (PCR) updating.

The head compression block 3040 can provide packet header compression to increase transmission efficiency for TS or IP input streams. Because the receiver can have a priori information on certain parts of the header, this known information can be deleted in the transmitter.

For Transport Stream, the receiver has a-priori information about the sync-byte configuration (0x47) and the packet length (188 Byte). If the input TS stream carries content that has only one PID, i.e., for only one service component (video, audio, etc.) or service sub-component (SVC base layer, SVC enhancement layer, MVC base view or MVC dependent views), TS packet header compression can be applied (optionally) to the Transport Stream. IP packet header compression is used optionally if the input steam is an IP stream.

The above-described blocks may be omitted or replaced by blocks having similar or identical function's.

FIG. 4 illustrates an input formatting block according to another embodiment of the present invention.

The input formatting block illustrated in FIG. 4 corresponds to an embodiment of the input formatting block 1000 described with reference to FIG. 1.

FIG. 4 illustrates a stream adaptation block of the input formatting module when the input signal corresponds to multiple input streams.

Referring to FIG. 4, the mode adaptation block for respectively processing the multiple input streams can include a scheduler 4000, an 1-Frame delay block 4010, a stuffing insertion block 4020, an in-band signaling 4030, a BB Frame scrambler 4040, a PLS generation block 4050 and a PLS scrambler 4060. Description will be given of each block of the stream adaptation block.

Operations of the stuffing insertion block 4020, the BB Frame scrambler 4040, the PLS generation block 4050 and the PLS scrambler 4060 correspond to those of the stuffing insertion block, BB scrambler, PLS generation block and the PLS scrambler described with reference to FIG. 2 and thus description thereof is omitted.

The scheduler 4000 can determine the overall cell allocation across the entire frame from the amount of FEC-BLOCKs of each DP. Including the allocation for PLS, EAC and FIC, the scheduler generate the values of PLS2-DYN data, which is transmitted as in-band signaling or PLS cell in FSS of the frame. Details of FECBLOCK, EAC and FIC will be described later.

The 1-Frame delay block 4010 can delay the input data by one transmission frame such that scheduling information about the next frame can be transmitted through the current frame for in-band signaling information to be inserted into the DPs.

The in-band signaling 4030 can insert un-delayed part of the PLS2 data into a DP of a frame.

The above-described blocks may be omitted or replaced by blocks having similar or identical functions.

Figure 5:
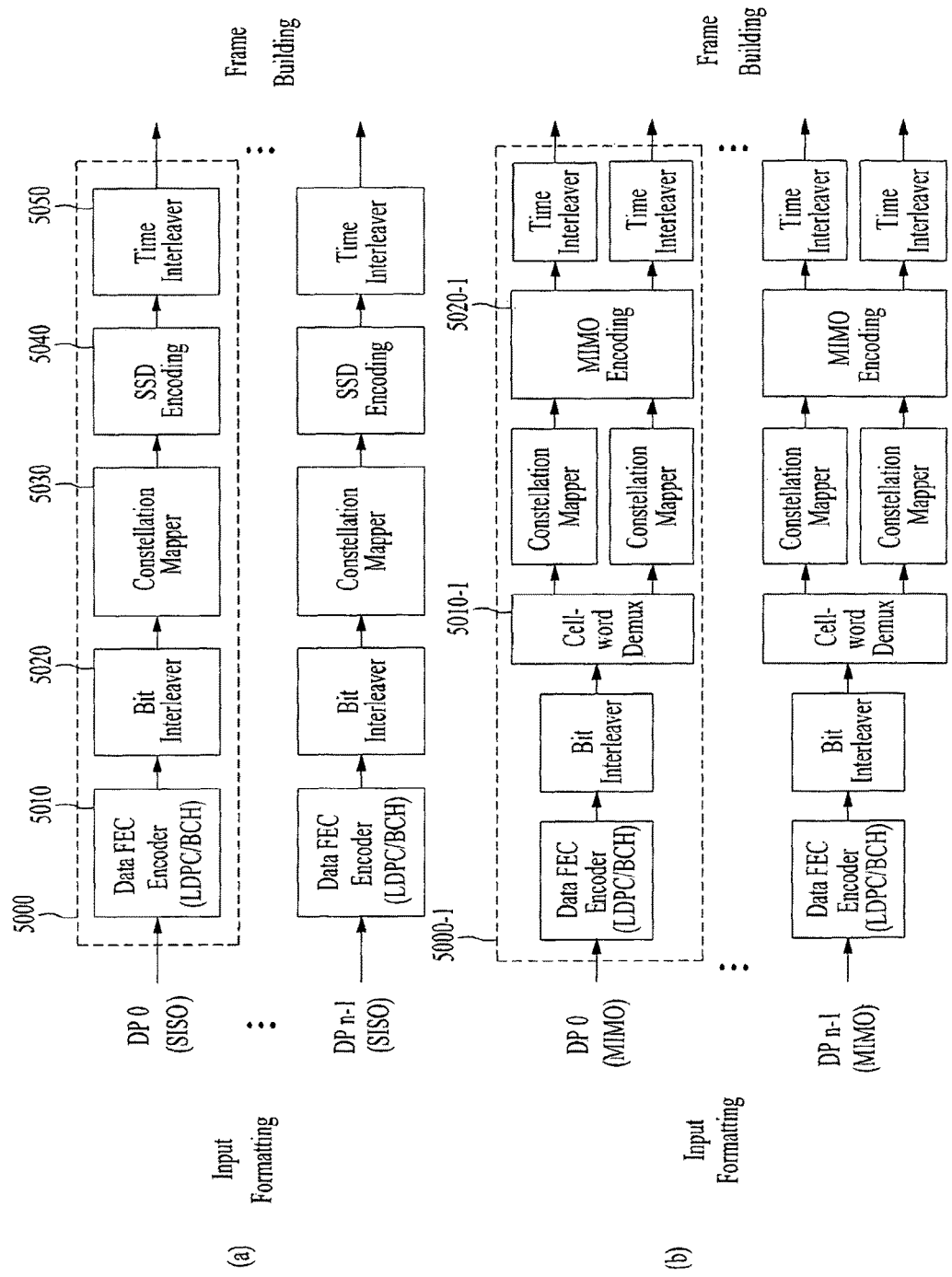
FIG. 5 illustrates a BICM block according to an embodiment of the present invention.

FIG. 5 illustrates a BICM block according to an embodiment of the present invention.

The BICM block illustrated in FIG. 5 corresponds to an embodiment of the BICM block 1010 described with reference to FIG. 1.

As described above, the apparatus for transmitting broadcast signals for future broadcast services according to an embodiment of the present invention can provide a terrestrial broadcast service, mobile broadcast service, UHDTV service, etc.

Since QoS (quality of service) depends on characteristics of a service provided by the apparatus for transmitting broadcast signals for future broadcast services according to an embodiment of the present invention, data corresponding to respective services needs to be processed through different schemes. Accordingly, the a BICM block according to an embodiment of the present invention can independently process DPs input thereto by independently applying SISO, MISO and MIMO schemes to the data pipes respectively corresponding to data paths. Consequently, the apparatus for transmitting broadcast signals for future broadcast services according to an embodiment of the present invention can control QoS for each service or service component transmitted through each DP.

(a) shows the BICM block shared by the base profile and the handheld profile and (b) shows the BICM block of the advanced profile.

The BICM block shared by the base profile and the handheld profile and the BICM block of the advanced profile can include plural processing blocks for processing each DP.

A description will be given of each processing block of the BICM block for the base profile and the handheld profile and the BICM block for the advanced profile.

A processing block 5000 of the BICM block for the base profile and the handheld profile can include a Data FEC encoder 5010, a bit interleaver 5020, a constellation mapper 5030, an SSD (Signal Space Diversity) encoding block 5040 and a time interleaver 5050.

The Data FEC encoder 5010 can perform the FEC encoding on the input BBF to generate FECBLOCK procedure using outer coding (BCH), and inner coding (LDPC). The outer coding (BCH) is optional coding method. Details of operations of the Data FEC encoder 5010 will be described later.

The bit interleaver 5020 can interleave outputs of the Data FEC encoder 5010 to achieve optimized performance with combination of the LDPC codes and modulation scheme while providing an efficiently implementable structure. Details of operations of the bit interleaver 5020 will be described later.

The constellation mapper 5030 can modulate each cell word from the bit interleaver 5020 in the base and the handheld profiles, or cell word from the Cell-word demultiplexer 5010-1 in the advanced profile using either QPSK, QAM-16, non-uniform QAM (NUQ-64, NUQ-256, NUQ-1024) or non-uniform constellation (NUC-16, NUC-64, NUC-256, NUC-1024) to give a power-normalized constellation point, $e_l$. This constellation mapping is applied only for DPs. Observe that QAM-16 and NUQs are square shaped, while NUCs have arbitrary shape. When each constellation is rotated by any multiple of 90 degrees, the rotated constellation exactly overlaps with its original one. This "rotation-sense" symmetric property makes the capacities and the average powers of the real and imaginary components equal to each other. Both NUQs and NUCs are defined specifically for each code rate and the particular one used is signaled by the parameter DP_MOD filed in PLS2 data.

The SSD encoding block 5040 can precode cells in two (2D), three (3D), and four (4D) dimensions to increase the reception robustness under difficult fading conditions.

The time interleaver 5050 can operates at the DP level. The parameters of time interleaving (TI) may be set differently for each DP. Details of operations of the time interleaver 5050 will be described later.

A processing block 5000-1 of the BICM block for the advanced profile can include the Data FEC encoder, bit interleaver, constellation mapper, and time interleaver. However, the processing block 5000-1 is distinguished from the processing block 5000 further includes a cell-word demultiplexer 5010-1 and a MIMO encoding block 5020-1.

Also, the operations of the Data FEC encoder, bit interleaver, constellation mapper, and time interleaver in the processing block 5000-1 correspond to those of the Data FEC encoder 5010, bit interleaver 5020, constellation mapper 5030, and time interleaver 5050 described and thus description thereof is omitted.

The cell-word demultiplexer 5010-1 is used for the DP of the advanced profile to divide the single cell-word stream into dual cell-word streams for MIMO processing. Details of operations of the cell-word demultiplexer 5010-1 will be described later.

The MIMO encoding block 5020-1 can processing the output of the cell-word demultiplexer 5010-1 using MIMO encoding scheme. The MIMO encoding scheme was optimized for broadcasting signal transmission. The MIMO technology is a promising way to get a capacity increase but it depends on channel characteristics. Especially for broadcasting, the strong LOS component of the channel or a difference in the received signal power between two antennas caused by different signal propagation characteristics makes it difficult to get capacity gain from MIMO. The proposed MIMO encoding scheme overcomes this problem using a rotation-based pre-coding and phase randomization of one of the MIMO output signals.

MIMO encoding is intended for a 2×2 MIMO system requiring at least two antennas at both the transmitter and the receiver. Two MIMO encoding modes are defined in this proposal; full-rate spatial multiplexing (FR-SM) and full-rate full-diversity spatial multiplexing (FRFD-SM). The FR-SM encoding provides capacity increase with relatively small complexity increase at the receiver side while the FRFD-SM encoding provides capacity increase and additional diversity gain with a great complexity increase at the receiver side. The proposed MIMO encoding scheme has no restriction on the antenna polarity configuration.

MIMO processing is required for the advanced profile frame, which means all DPs in the advanced profile frame are processed by the MIMO encoder. MIMO processing is applied at DP level. Pairs of the Constellation Mapper outputs NUQ ($e_{1,i}$ and $e_{2,i}$) are fed to the input of the MIMO Encoder. Paired MIMO Encoder output (g1,i and g2,i) is transmitted by the same carrier k and OFDM symbol l of their respective TX antennas.

The above-described blocks may be omitted or replaced by blocks having similar or identical functions.

Figure 6:
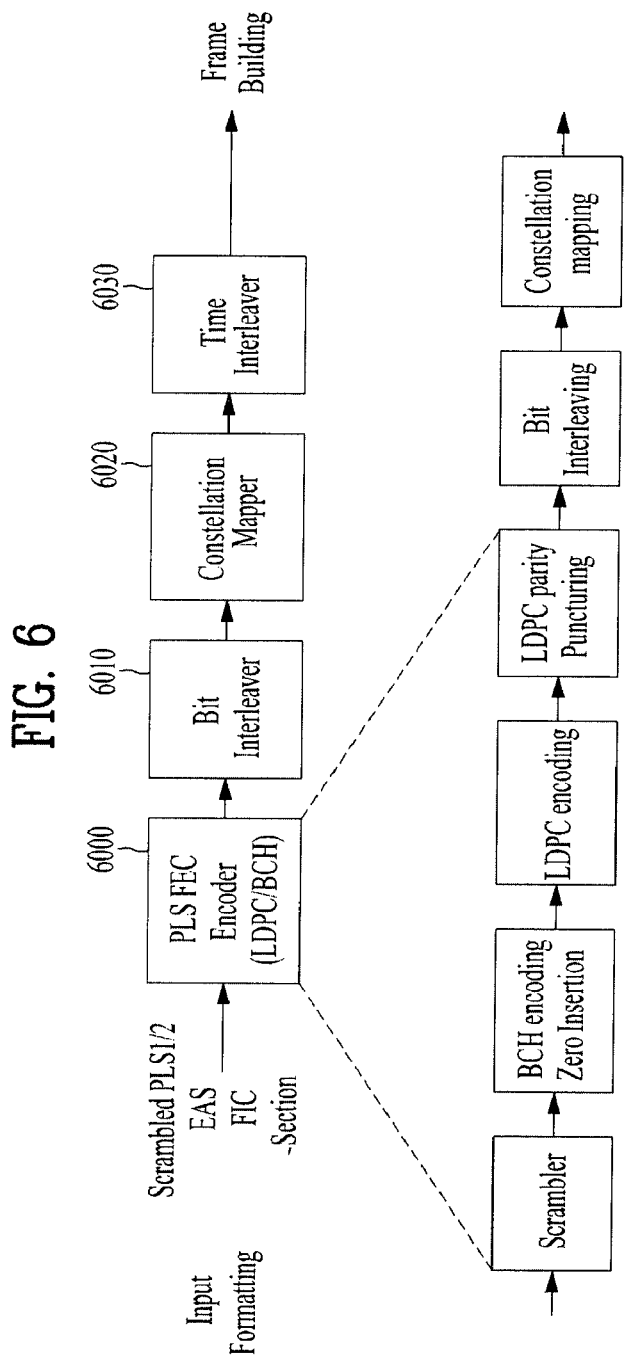
FIG. 6 illustrates a BICM block according to another embodiment of the present invention.

FIG. 6 illustrates a BICM block according to another embodiment of the present invention.

The BICM block illustrated in FIG. 6 corresponds to an embodiment of the BICM block 1010 described with reference to FIG. 1.

FIG. 6 illustrates a BICM block for protection of physical layer signaling (PLS), emergency alert channel (EAC) and fast information channel (FIC). EAC is a part of a frame that carries EAS information data and FIC is a logical channel in a frame that carries the mapping information between a service and the corresponding base DP. Details of the EAC and FIC will be described later.

Referring to FIG. 6, the BICM block for protection of PLS, EAC and FIC can include a PLS FEC encoder 6000, a bit interleaver 6010, a constellation mapper 6020 and time interleaver 6030.

Also, the PLS FEC encoder 6000 can include a scrambler, BCH encoding/zero insertion block, LDPC encoding block and LDPC parity puncturing block. Description will be given of each block of the BICM block.

The PLS FEC encoder 6000 can encode the scrambled PLS 1/2 data, EAC and FIC section.

The scrambler can scramble PLS1 data and PLS2 data before BCH encoding and shortened and punctured LDPC encoding.

The BCH encoding/zero insertion block can perform outer encoding on the scrambled PLS 1/2 data using the shortened BCH code for PLS protection and insert zero bits after the BCH encoding. For PLS1 data only, the output bits of the zero insertion may be permutted before LDPC encoding.

The LDPC encoding block can encode the output of the BCH encoding/zero insertion block using LDPC code. To generate a complete coded block, $C_{ldpc}$, parity bits, $P_{ldpc}$ are encoded systematically from each zero-inserted PLS information block, $I_{ldpc}$ and appended after it.

$$C_{ldpc} = [I_{ldpc} P_{ldpc}] = [i_0, i_1, \ldots, i_{K_{ldpc}-1}, p_0, p_1, \ldots, p_{N_{ldpc}-K_{ldpc}-1}]$$ [Math figure 1]

The LDPC code parameters for PLS1 and PLS2 are as following table 4.

TABLE 4

| Signaling Type | $K_{sig}$ | $K_{bch}$ | $N_{bch\_parity}$ | $K_{ldpc}$ (=$N_{bch}$) | $N_{ldpc}$ | $N_{ldpc\_parity}$ | code rate | $Q_{ldpc}$ |
|---|---|---|---|---|---|---|---|---|
| PLS1 | 342 | 1020 | 60 | 1080 | 4320 | 3240 | 1/4 | 36 |
| PLS2 | <1021 | | | | | | | |
| | >1020 | 2100 | | 2160 | 7200 | 5040 | 3/10 | 56 |

The LDPC parity puncturing block can perform puncturing on the PLS1 data and PLS 2 data.

When shortening is applied to the PLS1 data protection, some LDPC parity bits are punctured after LDPC encoding. Also, for the PLS2 data protection, the LDPC parity bits of PLS2 are punctured after LDPC encoding. These punctured bits are not transmitted.

The bit interleaver 6010 can interleave the each shortened and punctured PLS1 data and PLS2 data.

The constellation mapper 6020 can map the bit interleaved PLS1 data and PLS2 data onto constellations.

The time interleaver 6030 can interleave the mapped PLS1 data and PLS2 data.

The above-described blocks may be omitted or replaced by blocks having similar or identical functions.

Figure 7:
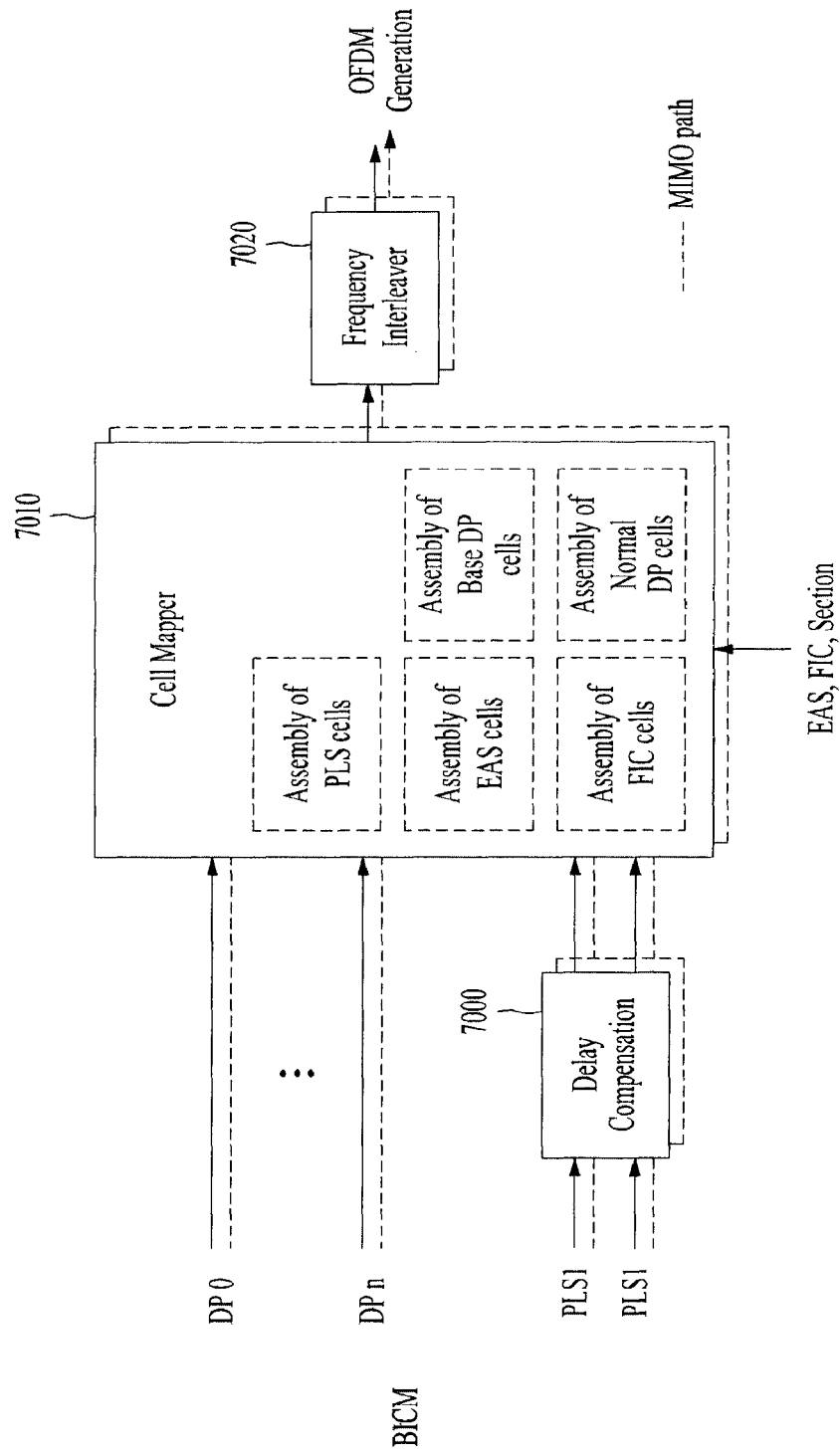
FIG. 7 illustrates a frame building block according to one embodiment of the present invention.

FIG. 7 illustrates a frame building block according to one embodiment of the present invention.

The frame building block illustrated in FIG. 7 corresponds to an embodiment of the frame building block 1020 described with reference to FIG. 1.

Referring to FIG. 7, the frame building block can include a delay compensation block 7000, a cell mapper 7010 and a frequency interleaver 7020. Description will be given of each block of the frame building block.

The delay compensation block 7000 can adjust the timing between the data pipes and the corresponding PLS data to ensure that they are co-timed at the transmitter end. The PLS data is delayed by the same amount as data pipes are by addressing the delays of data pipes caused by the Input Formatting block and BICM block. The delay of the BICM block is mainly due to the time interleaver. In-band signaling data carries information of the next TI group so that they are carried one frame ahead of the DPs to be signaled. The Delay Compensating block delays in-band signaling data accordingly.

The cell mapper 7010 can map PLS, EAC, FIC, DPs, auxiliary streams and dummy cells into the active carriers of the OFDM symbols in the frame. Details of the frame will be described later.

The frequency interleaver 7020 can randomly interleave data cells received from the cell mapper 7010 to provide frequency diversity. Also, the frequency interleaver 7020 can operate on very OFDM symbol pair comprised of two sequential OFDM symbols using a different interleaving-seed order to get maximum interleaving gain in a single frame. Details of operations of the frequency interleaver 7020 will be described later.

The above-described blocks may be omitted or replaced by blocks having similar or identical functions.

Figure 8:
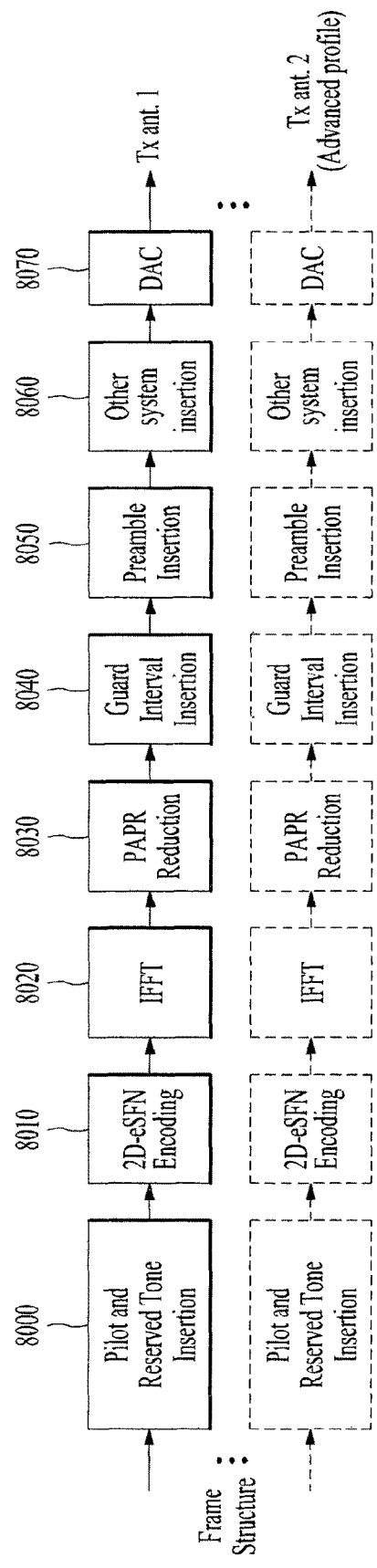
FIG. 8 illustrates an OFMD generation block according to an embodiment of the present invention.

FIG. 8 illustrates an OFMD generation block according to an embodiment of the present invention.

The OFMD generation block illustrated in FIG. 8 corresponds to an embodiment of the OFMD generation block 1030 described with reference to FIG. 1.

The OFDM generation block modulates the OFDM carriers by the cells produced by the Frame Building block, inserts the pilots, and produces the time domain signal for transmission. Also, this block subsequently inserts guard intervals, and applies PAPR (Peak-to-Average Power Radio) reduction processing to produce the final RF signal.

Referring to FIG. 8, the frame building block can include a pilot and reserved tone insertion block 8000, a 2D-eSFN encoding block 8010, an IFFT (Inverse Fast Fourier Transform) block 8020, a PAPR reduction block 8030, a guard interval insertion block 8040, a preamble insertion block 8050, other system insertion block 8060 and a DAC block 8070. Description will be given of each block of the frame building block.

The pilot and reserved tone insertion block 8000 can insert pilots and the reserved tone.

Various cells within the OFDM symbol are modulated with reference information, known as pilots, which have transmitted values known a priori in the receiver. The information of pilot cells is made up of scattered pilots, continual pilots, edge pilots, FSS (frame signaling symbol) pilots and FES (frame edge symbol) pilots. Each pilot is transmitted at a particular boosted power level according to pilot type and pilot pattern. The value of the pilot information is derived from a reference sequence, which is a series of values, one for each transmitted carrier on any given symbol. The pilots can be used for frame synchronization, frequency synchronization, time synchronization, channel estimation, and transmission mode identification, and also can be used to follow the phase noise.

Reference information, taken from the reference sequence, is transmitted in scattered pilot cells in every symbol except the preamble, FSS and FES of the frame. Continual pilots are inserted in every symbol of the frame. The number and location of continual pilots depends on both the FFT size and the scattered pilot pattern. The edge carriers are edge pilots in every symbol except for the preamble symbol. They are inserted in order to allow frequency interpolation up to the edge of the spectrum. FSS pilots are inserted in FSS(s) and FES pilots are inserted in FES. They are inserted in order to allow time interpolation up to the edge of the frame.

The system according to an embodiment of the present invention supports the SFN network, where distributed MISO scheme is optionally used to support very robust transmission mode. The 2D-eSFN is a distributed MISO scheme that uses multiple TX antennas, each of which is located in the different transmitter site in the SFN network.

The 2D-eSFN encoding block 8010 can process a 2D-eSFN processing to distorts the phase of the signals transmitted from multiple transmitters, in order to create both time and frequency diversity in the SFN configuration. Hence, burst errors due to low flat fading or deep-fading for a long time can be mitigated.

The IFFT block 8020 can modulate the output from the 2D-eSFN encoding block 8010 using OFDM modulation scheme. Any cell in the data symbols which has not been designated as a pilot (or as a reserved tone) carries one of the data cells from the frequency interleaver. The cells are mapped to OFDM carriers.

The PAPR reduction block 8030 can perform a PAPR reduction on input signal using various PAPR reduction algorithm in the time domain.

The guard interval insertion block 8040 can insert guard intervals and the preamble insertion block 8050 can insert preamble in front of the signal. Details of a structure of the preamble will be described later. The other system insertion block 8060 can multiplex signals of a plurality of broadcast transmission/reception systems in the time domain such that data of two or more different broadcast transmission/reception systems providing broadcast services can be simultaneously transmitted in the same RF signal bandwidth. In this case, the two or more different broadcast transmission/reception systems refer to systems providing different broadcast services. The different broadcast services may refer to a terrestrial broadcast service, mobile broadcast service, etc. Data related to respective broadcast services can be transmitted through different frames.

The DAC block 8070 can convert an input digital signal into an analog signal and output the analog signal. The signal output from the DAC block 7800 can be transmitted through multiple output antennas according to the physical layer profiles. A Tx antenna according to an embodiment of the present invention can have vertical or horizontal polarity.

The above-described blocks may be omitted or replaced by blocks having similar or identical functions according to design.

Figure 9:
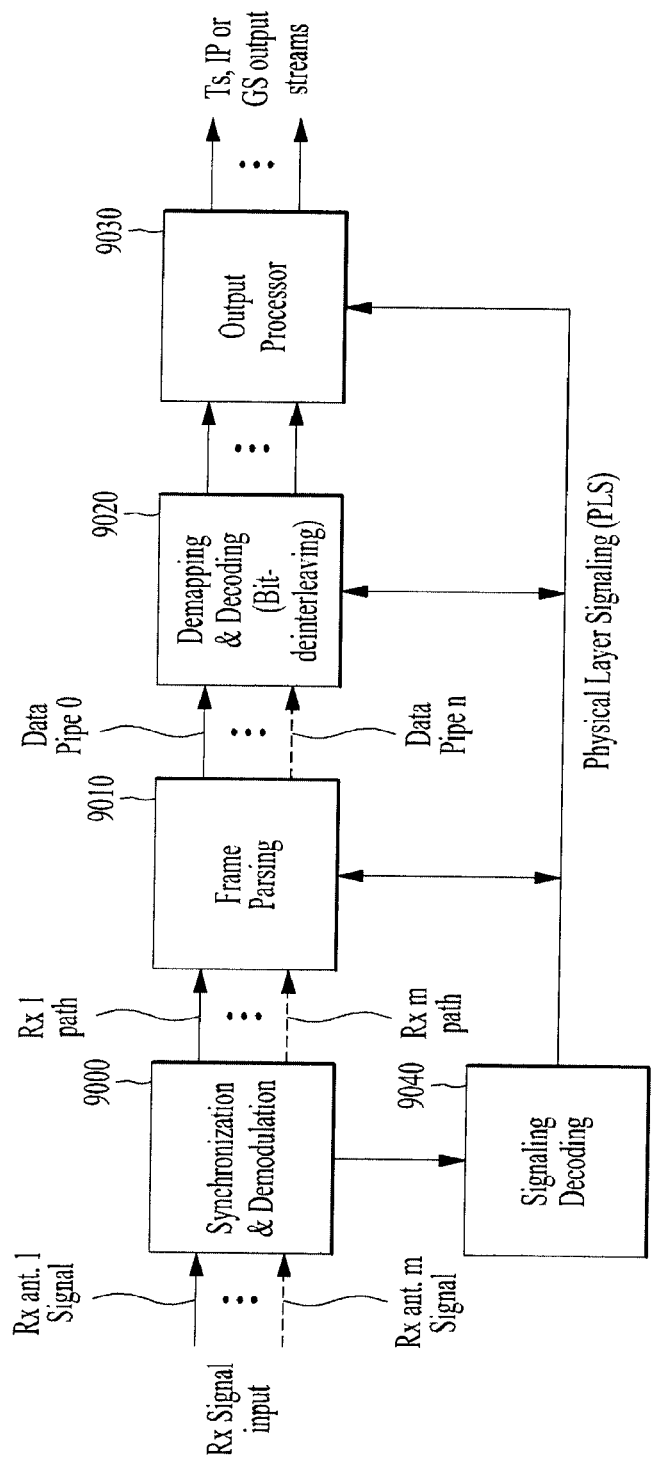
FIG. 9 illustrates a structure of an apparatus for receiving broadcast signals for future broadcast services according to an embodiment of the present invention.

FIG. 9 illustrates a structure of an apparatus for receiving broadcast signals for future broadcast services according to an embodiment of the present invention.

The apparatus for receiving broadcast signals for future broadcast services according to an embodiment of the present invention can correspond to the apparatus for transmitting broadcast signals for future broadcast services, described with reference to FIG. 1.

The apparatus for receiving broadcast signals for future broadcast services according to an embodiment of the present invention can include a synchronization & demodulation module 9000, a frame parsing module 9010, a demapping & decoding module 9020, an output processor 9030 and a signaling decoding module 9040. A description will be given of operation of each module of the apparatus for receiving broadcast signals.

The synchronization & demodulation module 9000 can receive input signals through m Rx antennas, perform signal detection and synchronization with respect to a system corresponding to the apparatus for receiving broadcast signals and carry out demodulation corresponding to a reverse procedure of the procedure performed by the apparatus for transmitting broadcast signals.

The frame parsing module 9010 can parse input signal frames and extract data through which a service selected by a user is transmitted. If the apparatus for transmitting broadcast signals performs interleaving, the frame parsing module 9010 can carry out deinterleaving corresponding to a reverse procedure of interleaving. In this case, the positions of a signal and data that need to be extracted can be obtained by decoding data output from the signaling decoding module 9040 to restore scheduling information generated by the apparatus for transmitting broadcast signals.

The demapping & decoding module 9020 can convert the input signals into bit domain data and then deinterleave the same as necessary. The demapping & decoding module 9020 can perform demapping for mapping applied for transmission efficiency and correct an error generated on a transmission channel through decoding. In this case, the demapping & decoding module 9020 can obtain transmission parameters necessary for demapping and decoding by decoding the data output from the signaling decoding module 9040.

The output processor 9030 can perform reverse procedures of various compression/signal processing procedures which are applied by the apparatus for transmitting broadcast signals to improve transmission efficiency. In this case, the output processor 9030 can acquire necessary control information from data output from the signaling decoding module 9040. The output of the output processor 9030 corresponds to a signal input to the apparatus for transmitting broadcast signals and may be MPEG-TSs, IP streams (v4 or v6) and generic streams.

The signaling decoding module 9040 can obtain PLS information from the signal demodulated by the synchronization & demodulation module 9000. As described above, the frame parsing module 9010, demapping & decoding module 9020 and output processor 9030 can execute functions thereof using the data output from the signaling decoding module 9040.

Figure 10:
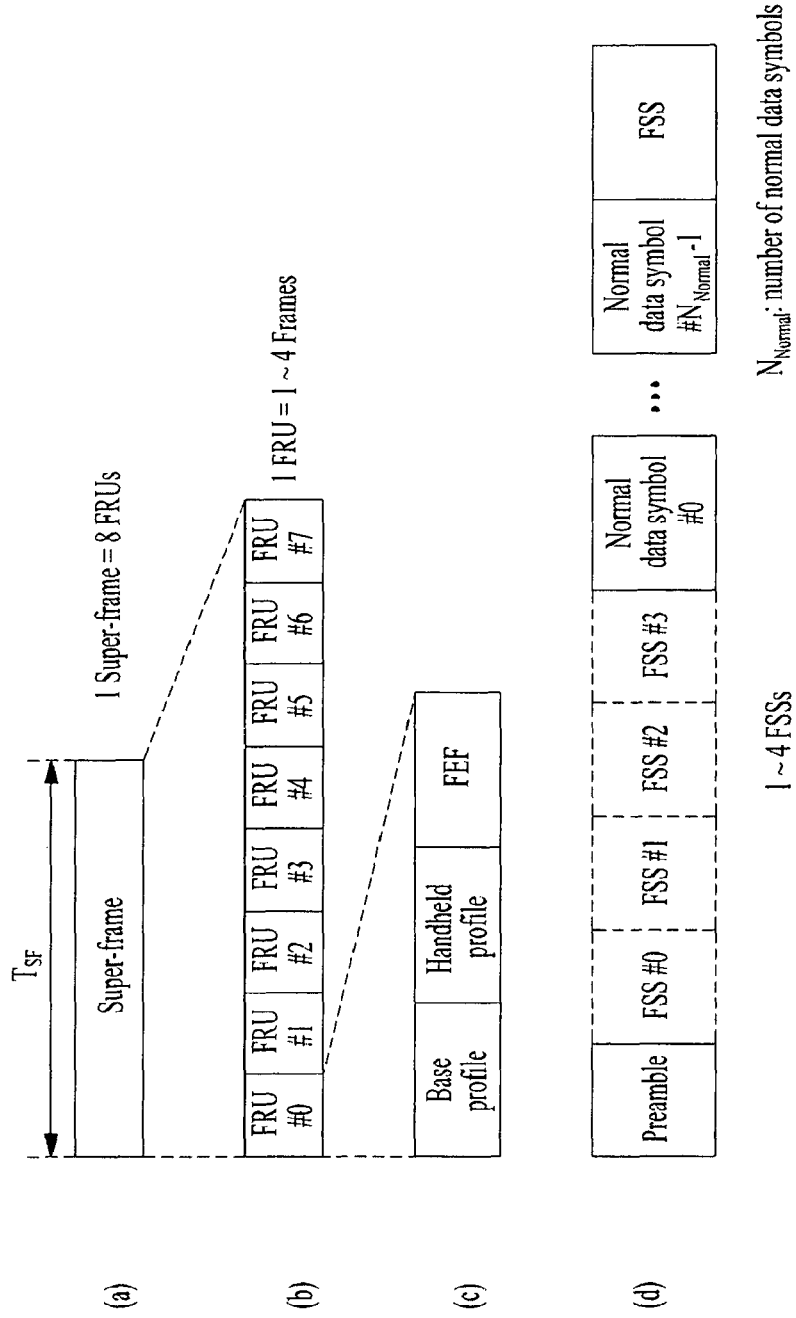
FIG. 10 illustrates a frame structure according to an embodiment of the present invention.

FIG. 10 illustrates a frame structure according to an embodiment of the present invention.

FIG. 10 shows an example configuration of the frame types and FRUs in a super-frame. (a) shows a super frame according to an embodiment of the present invention, (b) shows FRU (Frame Repetition Unit) according to an embodiment of the present invention, (c) shows frames of variable PHY profiles in the FRU and (d) shows a structure of a frame.

A super-frame may be composed of eight FRUs. The FRU is a basic multiplexing unit for TDM of the frames, and is repeated eight times in a super-frame.

Each frame in the FRU belongs to one of the PHY profiles, (base, handheld, advanced) or FEF. The maximum allowed number of the frames in the FRU is four and a given PHY profile can appear any number of times from zero times to four times in the FRU (e.g., base, base, handheld, advanced). PHY profile definitions can be extended using reserved values of the PHY_PROFILE in the preamble, if required.

The FEF part is inserted at the end of the FRU, if included. When the FEF is included in the FRU, the minimum number of FEFs is 8 in a super-frame. It is not recommended that FEF parts be adjacent to each other.

One frame is further divided into a number of OFDM symbols and a preamble. As shown in (d), the frame comprises a preamble, one or more frame signaling symbols (FSS), normal data symbols and a frame edge symbol (FES).

The preamble is a special symbol that enables fast Future-cast UTB system signal detection and provides a set of basic transmission parameters for efficient transmission and reception of the signal. The detailed description of the preamble will be will be described later.

The main purpose of the FSS(s) is to carry the PLS data. For fast synchronization and channel estimation, and hence fast decoding of PLS data, the FSS has more dense pilot pattern than the normal data symbol. The FES has exactly the same pilots as the FSS, which enables frequency-only interpolation within the FES and temporal interpolation, without extrapolation, for symbols immediately preceding the FES.

Figures 11, 12:
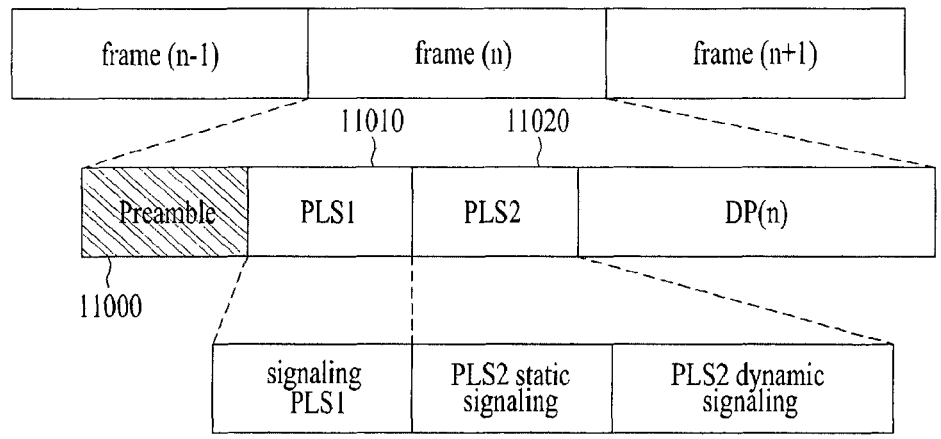
FIG. 11 illustrates a signaling hierarchy structure of the frame according to an embodiment of the present invention.
FIG. 12 illustrates preamble signaling data according to an embodiment of the present invention.

FIG. 11 illustrates a signaling hierarchy structure of the frame according to an embodiment of the present invention.

FIG. 11 illustrates the signaling hierarchy structure, which is split into three main parts: the preamble signaling data 11000, the PLS1 data 11010 and the PLS2 data 11020. The purpose of the preamble, which is carried by the preamble symbol in every frame, is to indicate the transmission type and basic transmission parameters of that frame. The PLS1 enables the receiver to access and decode the PLS2 data, which contains the parameters to access the DP of interest. The PLS2 is carried in every frame and split into two main parts: PLS2-STAT data and PLS2-DYN data. The static and dynamic portion of PLS2 data is followed by padding, if necessary.

FIG. 12 illustrates preamble signaling data according to an embodiment of the present invention.

Preamble signaling data carries 21 bits of information that are needed to enable the receiver to access PLS data and trace DPs within the frame structure. Details of the preamble signaling data are as follows:

PHY_PROFILE: This 3-bit field indicates the PHY profile type of the current frame. The mapping of different PHY profile types is given in below table 5.

TABLE 5

| Value | PHY profile |
|---|---|
| 000 | Base profile |
| 001 | Handheld profile |
| 010 | Advanced profiled |
| 011~110 | Reserved |
| 111 | FEF |

FFT_SIZE: This 2 bit field indicates the FFT size of the current frame within a frame-group, as described in below table 6.

TABLE 6

| Value | FFT size |
|---|---|
| 00 | 8K FFT |
| 01 | 16K FFT |
| 10 | 32K FFT |
| 11 | Reserved |

GI_FRACTION: This 3 bit field indicates the guard interval fraction value in the current super-frame, as described in below table 7.

TABLE 7

| Value | GI_FRACTION |
|---|---|
| 000 | 1/5 |
| 001 | 1/10 |
| 010 | 1/20 |
| 011 | 1/40 |
| 100 | 1/80 |
| 101 | 1/160 |
| 110~111 | Reserved |

EAC_FLAG: This 1 bit field indicates whether the EAC is provided in the current frame. If this field is set to '1', emergency alert service (EAS) is provided in the current frame. If this field set to '0', EAS is not carried in the current frame. This field can be switched dynamically within a super-frame.

PILOT_MODE: This 1-bit field indicates whether the pilot mode is mobile mode or fixed mode for the current frame in the current frame-group. If this field is set to '0', mobile pilot mode is used. If the field is set to '1', the fixed pilot mode is used.

PAPR_FLAG: This 1-bit field indicates whether PAPR reduction is used for the current frame in the current frame-group. If this field is set to value '1', tone reservation is used for PAPR reduction. If this field is set to '0', PAPR reduction is not used.

FRU_CONFIGURE: This 3-bit field indicates the PHY profile type configurations of the frame repetition units (FRU) that are present in the current super-frame. All profile types conveyed in the current super-frame are identified in this field in all preambles in the current super-frame. The 3-bit field has a different definition for each profile, as show in below table 8.

TABLE 8

| | Current PHY_PROFILE = '000' (base) | Current PHY_PROFILE = '001' (handheld) | Current PHY_PROFILE = '010' (advanced) | Current PHY_PROFILE = '111' (FEF) |
|---|---|---|---|---|
| FRU_CONFIGURE = 000 | Only base profile present | Only handheld profile present | Only advanced profile present | Only FEF present |
| FRU_CONFIGURE = 1XX | Handheld profile present | Base profile present | Base profile present | Base profile present |
| FRU_CONFIGURE = X1X | Advanced profile present | Advanced profile present | Handheld profile present | Handheld profile present |
| FRU_CONFIGURE = XX1 | FEF present | FEF present | FEF present | Advanced profile present |

RESERVED: This 7-bit field is reserved for future use.

FIG. 13 illustrates PLS1 data according to an embodiment of the present invention.

PLS1 data provides basic transmission parameters including parameters required to enable the reception and decoding of the PLS2. As above mentioned, the PLS1 data remain unchanged for the entire duration of one frame-group. The detailed definition of the signaling fields of the PLS1 data are as follows:

PREAMBLE_DATA: This 20-bit field is a copy of the preamble signaling data excluding the EAC_FLAG.

NUM_FRAME_FRU: This 2-bit field indicates the number of the frames per FRU.

PAYLOAD_TYPE: This 3-bit field indicates the format of the payload data carried in the frame-group. PAYLOAD_TYPE is signaled as shown in table 9.

TABLE 9

| value | Payload type |
|---|---|
| 1XX | TS stream is transmitted |
| X1X | IP stream is transmitted |
| XX1 | GS stream is transmitted |

NUM_FSS: This 2-bit field indicates the number of FSS symbols in the current frame.

SYSTEM_VERSION: This 8-bit field indicates the version of the transmitted signal format. The SYSTEM_VERSION is divided into two 4-bit fields, which are a major version and a minor version.

Major version: The MSB four bits of SYSTEM_VERSION field indicate major version information. A change in the major version field indicates a non-backward-compatible change. The default value is '0000'. For the version described in this standard, the value is set to '0000'.

Minor version: The LSB four bits of SYSTEM_VERSION field indicate minor version information. A change in the minor version field is backward-compatible.

CELL_ID: This is a 16-bit field which uniquely identifies a geographic cell in an ATSC network. An ATSC cell coverage area may consist of one or more frequencies, depending on the number of frequencies used per Futurecast UTB system. If the value of the CELL_ID is not known or unspecified, this field is set to '0'.

NETWORK_ID: This is a 16-bit field which uniquely identifies the current ATSC network.

SYSTEM_ID: This 16-bit field uniquely identifies the Futurecast UTB system within the ATSC network. The Futurecast UTB system is the terrestrial broadcast system whose input is one or more input streams (TS, IP, GS) and whose output is an RF signal. The Futurecast UTB system carries one or more PHY profiles and FEF, if any. The same Futurecast UTB system may carry different input streams and use different RF frequencies in different geographical areas, allowing local service insertion. The frame structure and scheduling is controlled in one place and is identical for all transmissions within a Futurecast UTB system. One or more Futurecast UTB systems may have the same SYSTEM_ID meaning that they all have the same physical layer structure and configuration.

The following loop consists of FRU_PHY_PROFILE, FRU_FRAME_LENGTH, FRU_GI_FRACTION, and RESERVED which are used to indicate the FRU configuration and the length of each frame type. The loop size is fixed so that four PHY profiles (including a FEF) are signaled within the FRU. If NUM_FRAME_FRU is less than 4, the unused fields are filled with zeros.

FRU_PHY_PROFILE: This 3-bit field indicates the PHY profile type of the $(i+1)^{th}$ (i is the loop index) frame of the associated FRU. This field uses the same signaling format as shown in the table 8.

FRU_FRAME_LENGTH: This 2-bit field indicates the length of the $(i+1)^{th}$ frame of the associated FRU. Using FRU_FRAME_LENGTH together with FRU_GI_FRACTION, the exact value of the frame duration can be obtained.

FRU_GI_FRACTION: This 3-bit field indicates the guard interval fraction value of the $(i+1)^{th}$ frame of the associated FRU. FRU_GI_FRACTION is signaled according to the table 7.

RESERVED: This 4-bit field is reserved for future use.

The following fields provide parameters for decoding the PLS2 data.

PLS2_FEC_TYPE: This 2-bit field indicates the FEC type used by the PLS2 protection. The FEC type is signaled according to table 10. The details of the LDPC codes will be described later.

TABLE 10

| Content | PLS2 FEC type |
|---|---|
| 00 | 4K-1/4 and 7K-3/10 LDPC codes |
| 01~11 | Reserved |

PLS2_MOD: This 3-bit field indicates the modulation type used by the PLS2. The modulation type is signaled according to table 11.

TABLE 11

| Value | PLS2_MODE |
|---|---|
| 000 | BPSK |
| 001 | QPSK |
| 010 | QAM-16 |
| 011 | NUQ-64 |
| 100~111 | Reserved |

PLS2_SIZE_CELL: This 15-bit field indicates $C_{total\_partial\_block}$, the size (specified as the number of QAM cells) of the collection of full coded blocks for PLS2 that is carried in the current frame-group. This value is constant during the entire duration of the current frame-group.

PLS2_STAT_SIZE_BIT: This 14-bit field indicates the size, in bits, of the PLS2-STAT for the current frame-group. This value is constant during the entire duration of the current frame-group.

PLS2_DYN_SIZE_BIT: This 14-bit field indicates the size, in bits, of the PLS2-DYN for the current frame-group. This value is constant during the entire duration of the current frame-group.

PLS2_REP_FLAG: This 1-bit flag indicates whether the PLS2 repetition mode is used in the current frame-group. When this field is set to value '1', the PLS2 repetition mode is activated. When this field is set to value '0', the PLS2 repetition mode is deactivated.

PLS2_REP_SIZE_CELL: This 15-bit field indicates $C_{total\_partial\_block}$, the size (specified as the number of QAM cells) of the collection of partial coded blocks for PLS2 carried in every frame of the current frame-group, when PLS2 repetition is used. If repetition is not used, the value of this field is equal to 0. This value is constant during the entire duration of the current frame-group.

PLS2_NEXT_FEC_TYPE: This 2-bit field indicates the FEC type used for PLS2 that is carried in every frame of the next frame-group. The FEC type is signaled according to the table 10.

PLS2_NEXT_MOD: This 3-bit field indicates the modulation type used for PLS2 that is carried in every frame of the next frame-group. The modulation type is signaled according to the table 11.

PLS2_NEXT_REP_FLAG: This 1-bit flag indicates whether the PLS2 repetition mode is used in the next frame-group. When this field is set to value '1', the PLS2 repetition mode is activated. When this field is set to value '0', the PLS2 repetition mode is deactivated.

PLS2_NEXT_REP_SIZE_CELL: This 15-bit field indicates $C_{total\_full\_block}$. The size (specified as the number of QAM cells) of the collection of full coded blocks for PLS2 that is carried in every frame of the next frame-group, when PLS2 repetition is used. If repetition is not used in the next frame-group, the value of this field is equal to 0. This value is constant during the entire duration of the current frame-group.

PLS2_NEXT_REP_STAT_SIZE_BIT: This 14-bit field indicates the size, in bits, of the PLS2-STAT for the next frame-group. This value is constant in the current frame-group.

PLS2_NEXT_REP_DYN_SIZE_BIT: This 14-bit field indicates the size, in bits, of the PLS2-DYN for the next frame-group. This value is constant in the current frame-group.

PLS2_AP_MODE: This 2-bit field indicates whether additional parity is provided for PLS2 in the current frame-group. This value is constant during the entire duration of the current frame-group. The below table 12 gives the values of this field. When this field is set to '00', additional parity is not used for the PLS2 in the current frame-group.

TABLE 12

| Value | PLS2-AP mode |
|---|---|
| 00 | AP is not provided |
| 01 | AP1 mode |
| 10~11 | Reserved |

PLS2_AP_SIZE_CELL: This 15-bit field indicates the size (specified as the number of QAM cells) of the additional parity bits of the PLS2. This value is constant during the entire duration of the current frame-group.

PLS2_NEXT_AP_MODE: This 2-bit field indicates whether additional parity is provided for PLS2 signaling in every frame of next frame-group. This value is constant during the entire duration of the current frame-group. The table 12 defines the values of this field PLS2_NEXT_AP_SIZE_CELL: This 15-bit field indicates the size (specified as the number of QAM cells) of the additional parity bits of the PLS2 in every frame of the next frame-group. This value is constant during the entire duration of the current frame-group.

RESERVED: This 32-bit field is reserved for future use.

CRC_32: A 32-bit error detection code, which is applied to the entire PLS1 signaling.

FIG. 14 illustrates PLS2 data according to an embodiment of the present invention.

FIG. 14 illustrates PLS2-STAT data of the PLS2 data. The PLS2-STAT data are the same within a frame-group, while the PLS2-DYN data provide information that is specific for the current frame.

The details of fields of the PLS2-STAT data are as follows:

FIC_FLAG: This 1-bit field indicates whether the FIC is used in the current frame-group. If this field is set to '1', the FIC is provided in the current frame. If this field set to '0', the FIC is not carried in the current frame. This value is constant during the entire duration of the current frame-group.

AUX_FLAG: This 1-bit field indicates whether the auxiliary stream(s) is used in the current frame-group. If this field is set to '1', the auxiliary stream is provided in the current frame. If this field set to '0', the auxiliary stream is not carried in the current frame. This value is constant during the entire duration of current frame-group.

NUM_DP: This 6-bit field indicates the number of DPs carried within the current frame. The value of this field ranges from 1 to 64, and the number of DPs is NUM_DP+1.

DP_ID: This 6-bit field identifies uniquely a DP within a PHY profile.

DP_TYPE: This 3-bit field indicates the type of the DP. This is signaled according to the below table 13.

TABLE 13

| Value | DP Type |
|---|---|
| 000 | DP Type 1 |
| 001 | DP Type 2 |
| 010~111 | reserved |

DP_GROUP_ID: This 8-bit field identifies the DP group with which the current. DP is associated. This can be used by a receiver to access the DPs of the service components associated with a particular service, which will have the same DP_GROUP_ID.

BASE_DP_ID: This 6-bit field indicates the DP carrying service signaling data (such as PSI/SI) used in the Management layer. The DP indicated by BASE_DP_ID may be either a normal DP carrying the service signaling data along with the service data or a dedicated DP carrying only the service signaling data DP_FEC_TYPE: This 2-bit field indicates the FEC type used by the associated DP. The FEC type is signaled according to the below table 14.

TABLE 14

| Value | FEC_TYPE |
|---|---|
| 00 | 16K LDPC |
| 01 | 64K LDPC |
| 10~11 | Reserved |

DP_COD: This 4-bit field indicates the code rate used by the associated DP. The code rate is signaled according to the below table 15.

TABLE 15

| Value | Code rate |
|---|---|
| 0000 | 5/15 |
| 0001 | 6/15 |
| 0010 | 7/15 |
| 0011 | 8/15 |
| 0100 | 9/15 |
| 0101 | 10/15 |
| 0110 | 11/15 |
| 0111 | 12/15 |
| 1000 | 13/15 |
| 1001~1111 | Reserved |

DP_MOD: This 4-bit field indicates the modulation used by the associated DP. The modulation is signaled according to the below table 16.

TABLE 16

| Value | Modulation |
|---|---|
| 0000 | QPSK |
| 0001 | QAM-16 |
| 0010 | NUQ-64 |
| 0011 | NUQ-256 |
| 0100 | NUQ-1024 |
| 0101 | NUC-16 |
| 0110 | NUC-64 |
| 0111 | NUC-256 |
| 1000 | NUC-1024 |
| 1001~1111 | reserved |

DP_SSD_FLAG: This 1-bit field indicates whether the SSD mode is used in the associated DP. If this field is set to value '1', SSD is used. If this field is set to value '0', SSD is not used.

The following field appears only if PHY_PROFILE is equal to '010', which indicates the advanced profile:

DP_MIMO: This 3-bit field indicates which type of MIMO encoding process is applied to the associated DP. The type of MIMO encoding process is signaled according to the table 17.

TABLE 17

| Value | MIMO encoding |
|---|---|
| 000 | FR-SM |
| 001 | FRFD-SM |
| 010~111 | reserved |

DP_TI_TYPE: This 1-bit field indicates the type of time-interleaving. A value of '0' indicates that one TI group corresponds to one frame and contains one or more TI-blocks. A value of '1' indicates that one TI group is carried in more than one frame and contains only one TI-block.

DP_TI_LENGTH: The use of this 2-bit field (the allowed values are only 1, 2, 4, 8) is determined by the values set within the DP_TI_TYPE field as follows:

If the DP_TI_TYPE is set to the value '1', this field indicates $P_I$, the number of the frames to which each TI group is mapped, and there is one TI-block per TI group ($N_{TI}=1$). The allowed $P_I$ values with 2-bit field are defined in the below table 18.

If the DP_TI_TYPE is set to the value '0', this field indicates the number of TI-blocks $N_{TI}$ per TI group, and there is one TI group per frame ($P_I=1$). The allowed $P_I$ values with 2-bit field are defined in the below table 18.

TABLE 18

| 2-bit field | $P_I$ | $N_{TI}$ |
|---|---|---|
| 00 | 1 | 1 |
| 01 | 2 | 2 |
| 10 | 4 | 3 |
| 11 | 8 | 4 |

DP_FRAME_INTERVAL: This 2-bit field indicates the frame interval ($I_{JUMP}$) within the frame-group for the associated DP and the allowed values are 1, 2, 4, 8 (the corresponding 2-bit field is '00', '01', '10', or '11', respectively). For DPs that do not appear every frame of the frame-group, the value of this field is equal to the interval between successive frames. For example, if a DP appears on the frames 1, 5, 9, 13, etc., this field is set to '4'. For DPs that appear in every frame, this field is set to '1'.

DP_TI_BYPASS: This 1-bit field determines the availability of time interleaver. If time interleaving is not used for a DP, it is set to '1'. Whereas if time interleaving is used it is set to '0'.

DP_FIRST_FRAME_IDX: This 5-bit field indicates the index of the first frame of the super-frame in which the current DP occurs. The value of DP_FIRST_FRAME_IDX ranges from 0 to 31

DP_NUM_BLOCK_MAX: This 10-bit field indicates the maximum value of DP_NUM_BLOCKS for this DP. The value of this field has the same range as DP_NUM_BLOCKS.

DP_PAYLOAD_TYPE: This 2-bit field indicates the type of the payload data carried by the given DP. DP_PAYLOAD_TYPE is signaled according to the below table 19.

TABLE 19

| Value | Payload Type |
|---|---|
| 00 | TS. |
| 01 | IP |
| 10 | GS |
| 11 | reserved |

DP_INBAND_MODE: This 2-bit field indicates whether the current DP carries in-band signaling information. The in-band signaling type is signaled according to the below table 20.

TABLE 20

| Value | In-band mode |
|---|---|
| 00 | In-band signaling is not carried. |
| 01 | INBAND-PLS is carried only |
| 10 | INBAND-ISSY is carried only |
| 11 | INBAND-PLS and INBAND-ISSY are carried |

DP_PROTOCOL_TYPE: This 2-bit field indicates the protocol type of the payload carried by the given DP. It is signaled according to the below table 21 when input payload types are selected.

TABLE 21

| Value | If DP_PAYLOAD_TYPE Is TS | If DP_PAYLOAD_TYPE Is IP | If DP_PAYLOAD_TYPE Is GS |
|---|---|---|---|
| 00 | MPEG2-TS | IPv4 | (Note) |
| 01 | Reserved | IPv6 | Reserved |
| 10 | Reserved | Reserved | Reserved |
| 11 | Reserved | Reserved | Reserved |

DP_CRC_MODE: This 2-bit field indicates whether CRC encoding is used in the Input Formatting block. The CRC mode is signaled according to the below table 22.

TABLE 22

| Value | CRC mode |
|---|---|
| 00 | Not used |
| 01 | CRC-8 |
| 10 | CRC-16 |
| 11 | CRC-32 |

DNP_MODE: This 2-bit field indicates the null-packet deletion mode used by the associated DP when DP_PAYLOAD_TYPE is set to TS ('00'). DNP_MODE is signaled according to the below table 23. If DP_PAYLOAD_TYPE is not TS ('00'), DNP_MODE is set to the value '00'.

TABLE 23

| Value | Null-packet deletion mode |
|---|---|
| 00 | Not used |
| 01 | DNP-NORMAL |
| 10 | DNP-OFFSET |
| 11 | reserved |

ISSY_MODE: This 2-bit field indicates the ISSY mode used by the associated DP when DP_PAYLOAD_TYPE is set to TS ('00'). The ISSY_MODE is signaled according to the below table 24 If DP_PAYLOAD_TYPE is not TS ('00'), ISSY_MODE is set to the value '00'.

TABLE 24

| Value | ISSY mode |
|---|---|
| 00 | Not used |
| 01 | ISSY-UP |
| 10 | ISSY-BBF |
| 11 | reserved |

HC_MODE_TS: This 2-bit field indicates the TS header compression mode used by the associated DP when DP_PAYLOAD_TYPE is set to TS ('00'). The HC_MODE_TS is signaled according to the below table 25.

TABLE 25

| Value | Header compression mode |
|---|---|
| 00 | HC_MODE_TS 1 |
| 01 | HC_MODE_TS 2 |
| 10 | HC_MODE_TS 3 |
| 11 | HC_MODE_TS 4 |

HC_MODE_IP: This 2-bit field indicates the IP header compression mode when DP_PAYLOAD_TYPE is set to IP ('01'). The HC_MODE_IP is signaled according to the below table 26.

TABLE 26

| Value | Header compression mode |
|---|---|
| 00 | No compression |
| 01 | HC_MODE_IP 1 |
| 10~11 | reserved |

PID: This 13-bit field indicates the PID number for TS header compression when DP_PAYLOAD_TYPE is set to TS ('00') and HC_MODE_TS is set to '01' or '10'.

RESERVED: This 8-bit field is reserved for future use.

The following field appears only if FIC_FLAG is equal to '1':

FIC_VERSION: This 8-bit field indicates the version number of the FIC.

FIC_LENGTH_BYTE: This 13-bit field indicates the length, in bytes, of the FIC.

RESERVED: This 8-bit field is reserved for future use.

The following field appears only if AUX_FLAG is equal to '1':

NUM_AUX: This 4-bit field indicates the number of auxiliary streams. Zero means no auxiliary streams are used.

AUX_CONFIG_RFU: This 8-bit field is reserved for future use.

AUX_STREAM_TYPE: This 4-bit is reserved for future use for indicating the type of the current auxiliary stream.

AUX_PRIVATE_CONFIG: This 28-bit field is reserved for future use for signaling auxiliary streams.

Figures 15, 16:
FIG. 15 illustrates PLS2 data according to another embodiment of the present invention.
FIG. 16 illustrates a logical structure of a frame according to an embodiment of the present invention.

FIG. 15 illustrates PLS2 data according to another embodiment of the present invention.

FIG. 15 illustrates PLS2-DYN data of the PLS2 data. The values of the PLS2-DYN data may change during the duration of one frame-group, while the size of fields remains constant.

The details of fields of the PLS2-DYN data are as follows:

FRAME_INDEX: This 5-bit field indicates the frame index of the current frame within the super-frame. The index of the first frame of the super-frame is set to '0'.

PLS_CHANGE_COUNTER: This 4-bit field indicates the number of super-frames ahead where the configuration will change. The next super-frame with changes in the configuration is indicated by the value signaled within this field. If this field is set to the value '0000', it means that no scheduled change is foreseen: e.g., value '1' indicates that there is a change in the next super-frame.

FIC_CHANGE_COUNTER: This 4-bit field indicates the number of super-frames ahead where the configuration (i.e., the contents of the FIC) will change. The next super-frame with changes in the configuration is indicated by the value signaled within this field. If this field is set to the value '0000', it means that no scheduled change is foreseen: e.g. value '0001' indicates that there is a change in the next super-frame.

RESERVED: This 16-bit field is reserved for future use.

The following fields appear in the loop over NUM_DP, which describe the parameters associated with the DP carried in the current frame.

(a) DP_ID: This 6-bit field indicates uniquely the DP within a PHY profile.

DP_START: This 15-bit (or 13-bit) field indicates the start position of the first of the DPs using the DPU addressing scheme. The DP_START field has differing length according to the PHY profile and FFT size as shown in the below table 27.

TABLE 27

| PHY profile | DP_START field size | |
|---|---|---|
| | 64K | 16K |
| Base | 13 bit | 15 bit |
| Handheld | — | 13 bit |
| Advanced | 13 bit | 15 bit |

DP_NUM_BLOCK: This 10-bit field indicates the number of FEC blocks in the current TI group for the current DP. The value of DP_NUM_BLOCK ranges from 0 to 1023

(a) RESERVED: This 8-bit field is reserved for future use.

The following fields indicate the FIC parameters associated with the EAC.

EAC_FLAG: This 1-bit field indicates the existence of the EAC in the current frame. This bit is the same value as the EAC_FLAG in the preamble.

EAS_WAKE_UP_VERSION_NUM: This 8-bit field indicates the version number of a wake-up indication.

If the EAC_FLAG field is equal to '1', the following 12 bits are allocated for EAC_LENGTH_BYTE field. If the EAC_FLAG field is equal to '0', the following 12 bits are allocated for EAC_COUNTER.

EAC_LENGTH_BYTE: This 12-bit field indicates the length, in byte, of the EAC.

EAC_COUNTER: This 12-bit field indicates the number of the frames before the frame where the EAC arrives.

The following field appears only if the AUX_FLAG field is equal to '1':

(a) AUX_PRIVATE_DYN: This 48-bit field is reserved for future use for signaling auxiliary streams. The meaning of this field depends on the value of AUX_STREAM_TYPE in the configurable PLS2-STAT.

CRC_32: A 32-bit error detection code, which is applied to the entire PLS2.

FIG. 16 illustrates a logical structure of a frame according to an embodiment of the present invention.

As above mentioned, the PLS, EAC, FIC, DPs, auxiliary streams and dummy cells are mapped into the active carriers of the OFDM symbols in the frame. The PLS1 and PLS2 are first mapped into one or more FSS(s). After that, EAC cells, if any, are mapped immediately following the PLS field, followed next by FIC cells, if any. The DPs are mapped next after the PLS or EAC, FIC, if any. Type 1 DPs follows first, and Type 2 DPs next. The details of a type of the DP will be described later. In some case, DPs may carry some special data for EAS or service signaling data. The auxiliary stream or streams, if any, follow the DPs, which in turn are followed by dummy cells. Mapping them all together in the above mentioned order, i.e. PLS, EAC, FIC, DPs, auxiliary streams and dummy data cells exactly fill the cell capacity in the frame.

Figure 17:
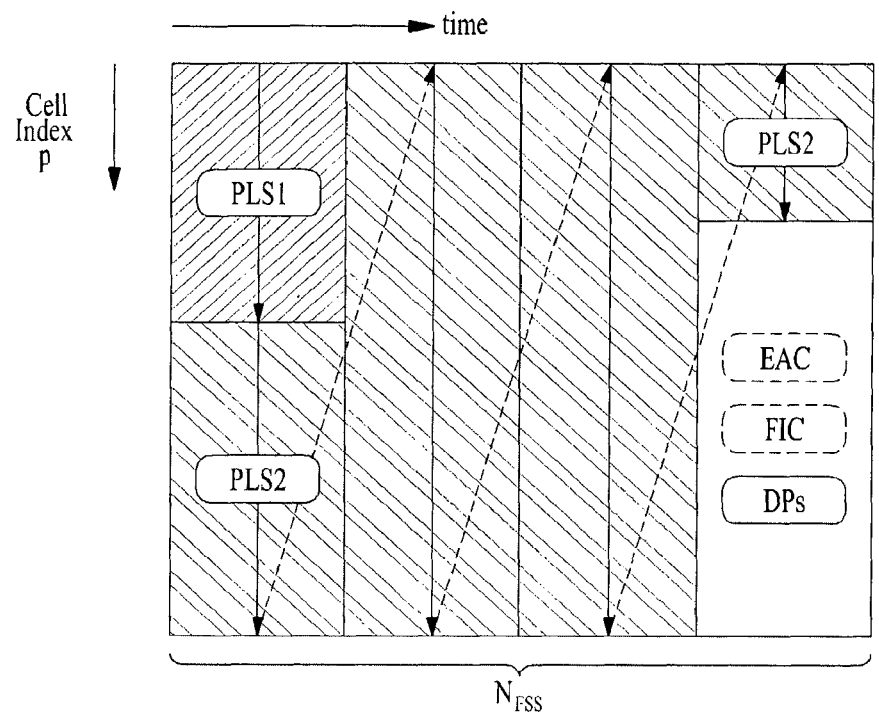
FIG. 17 illustrates PLS mapping according to an embodiment of the present invention.

FIG. 17 illustrates PLS mapping according to an embodiment of the present invention.

PLS cells are mapped to the active carriers of FSS(s). Depending on the number of cells occupied by PLS, one or more symbols are designated as FSS(s), and the number of FSS(s) $N_{FSS}$ is signaled by NUM_FSS in PLS1. The FSS is a special symbol for carrying PLS cells. Since robustness and latency are critical issues in the PLS, the FSS(s) has higher density of pilots allowing fast synchronization and frequency-only interpolation within the FSS.

PLS cells are mapped to active carriers of the $N_{FSS}$ FSS(s) in a top-down manner as shown in an example in FIG. 17. The PLS1 cells are mapped first from the first cell of the first FSS in an increasing order of the cell index. The PLS2 cells follow immediately after the last cell of the PLS1 and mapping continues downward until the last cell index of the first FSS. If the total number of required PLS cells exceeds the number of active carriers of one FSS, mapping proceeds to the next FSS and continues in exactly the same manner as the first FSS.

After PLS mapping is completed, DPs are carried next. If EAC, FIC or both are present in the current frame, they are placed between PLS and "normal" DPs.

Figure 18:
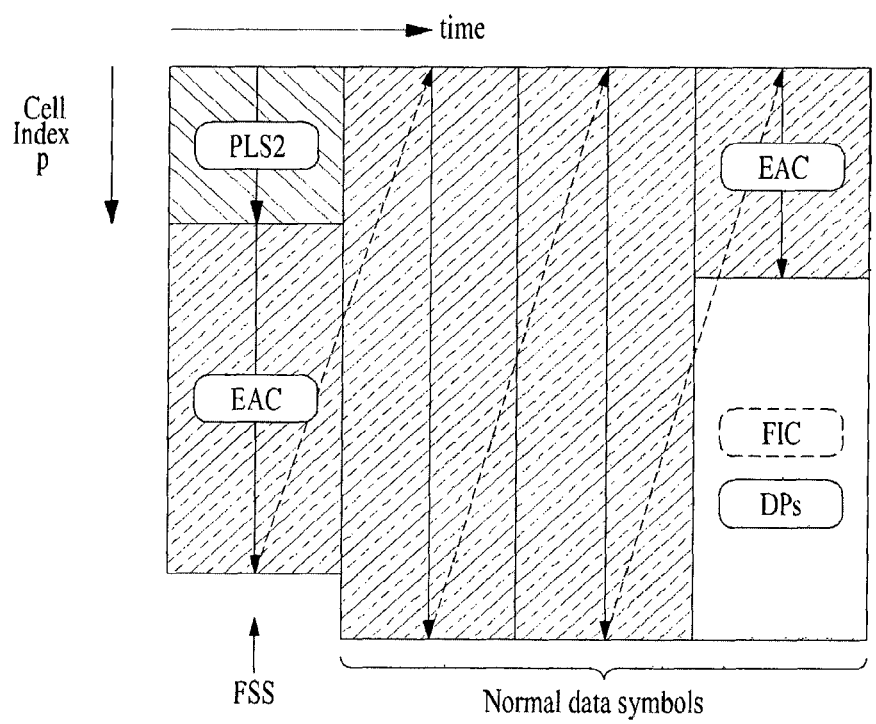
FIG. 18 illustrates EAC mapping according to an embodiment of the present invention.

FIG. 18 illustrates EAC mapping according to an embodiment of the present invention.

EAC is a dedicated channel for carrying EAS messages and links to the DPs for EAS. EAS support is provided but EAC itself may or may not be present in every frame. EAC, if any, is mapped immediately after the PLS2 cells. EAC is not preceded by any of the FIC, DPs, auxiliary streams or dummy cells other than the PLS cells. The procedure of mapping the EAC cells is exactly the same as that of the PLS.

The EAC cells are mapped from the next cell of the PLS2 in increasing order of the cell index as shown in the example in FIG. 18. Depending on the EAS message size, EAC cells may occupy a few symbols, as shown in FIG. 18.

EAC cells follow immediately after the last cell of the PLS2, and mapping continues downward until the last cell index of the last FSS. If the total number of required EAC cells exceeds the number of remaining active carriers of the last FSS mapping proceeds to the next symbol and continues in exactly the same manner as FSS(s). The next symbol for mapping in this case is the normal data symbol, which has more active carriers than a FSS.

After EAC mapping is completed, the FIC is carried next, if any exists. If FIC is not transmitted (as signaled in the PLS2 field), DPs follow immediately after the last cell of the EAC.

Figure 19:
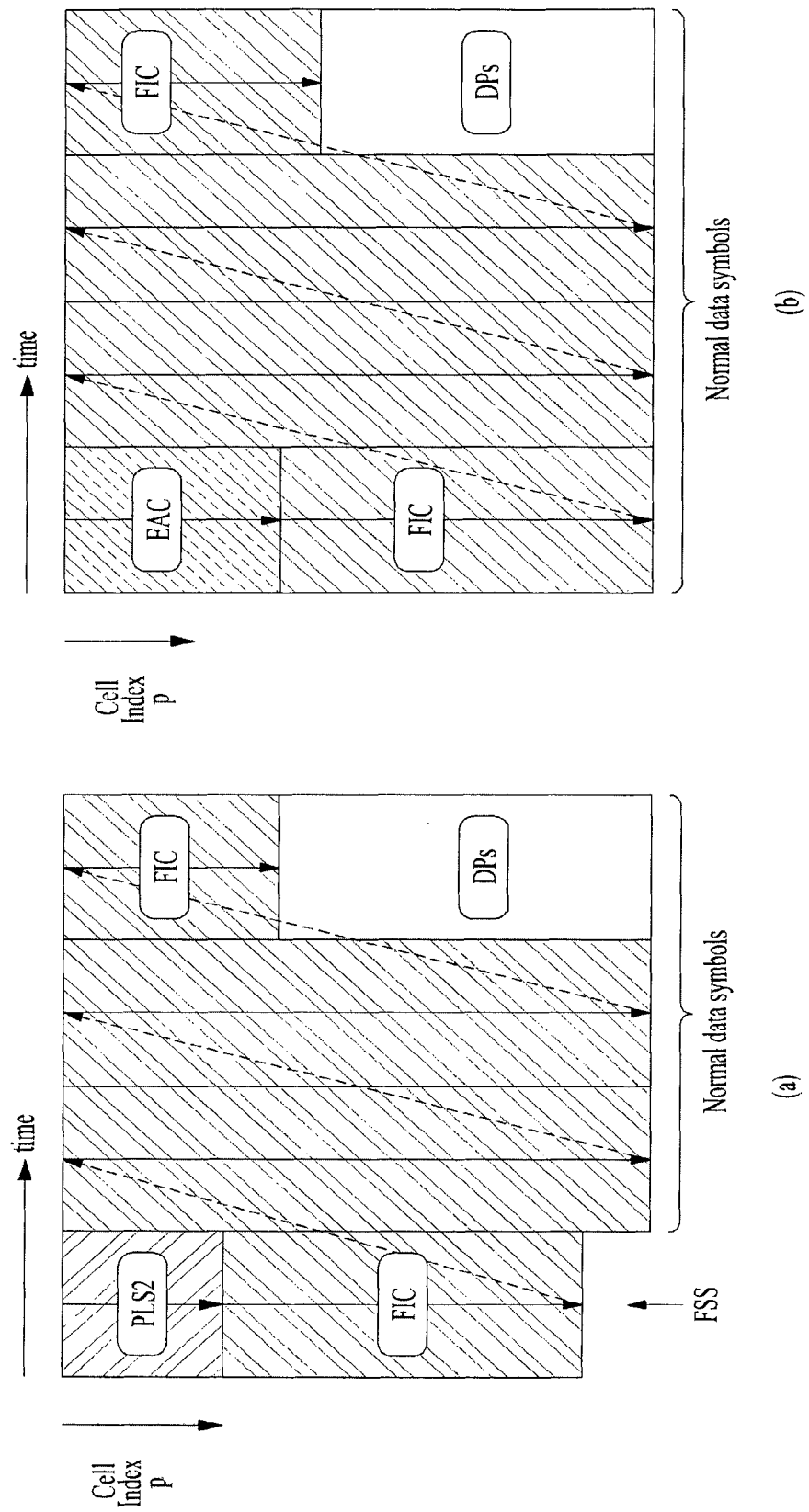
FIG. 19 illustrates FIC mapping according to an embodiment of the present invention.

FIG. 19 illustrates FIC mapping according to an embodiment of the present invention.

(a) shows an example mapping of FIC cell without EAC and (b) shows an example mapping of FIC cell with EAC.

FIC is a dedicated channel for carrying cross-layer information to enable fast service acquisition and channel scanning. This information primarily includes channel binding information between DPs and the services of each broadcaster. For fast scan, a receiver can decode FIC and obtain information such as broadcaster ID, number of services, and BASE_DP_ID. For fast service acquisition, in addition to FIC, base DP can be decoded using BASE_DP_ID. Other than the content it carries, a base DP is encoded and mapped to a frame in exactly the same way as a normal DP. Therefore, no additional description is required for a base DP. The FIC data is generated and consumed in the Management Layer. The content of FIC data is as described in the Management Layer specification.

The FIC data is optional and the use of FIC is signaled by the FIC_FLAG parameter in the static part of the PLS2. If FIC is used, FIC_FLAG is set to '1' and the signaling field for FIC is defined in the static part of PLS2. Signaled in this field are FIC_VERSION, and FIC_LENGTH_BYTE. FIC uses the same modulation, coding and time interleaving parameters as PLS2. FIC shares the same signaling parameters such as PLS2_MOD and PLS2_FEC. FIC data, if any, is mapped immediately after PLS2 or EAC if any. FIC is not preceded by any normal DPs, auxiliary streams or dummy cells. The method of mapping FIC cells is exactly the same as that of EAC which is again the same as PLS.

Without EAC after PLS, FIC cells are mapped from the next cell of the PLS2 in an increasing order of the cell index as shown in an example in (a). Depending on the FIC data size, FIC cells may be mapped over a few symbols, as shown in (b).

FIC cells follow immediately after the last cell of the PLS2, and mapping continues downward until the last cell index of the last FSS. If the total number of required FIC cells exceeds the number of remaining active carriers of the last FSS, mapping proceeds to the next symbol and continues in exactly the same manner as FSS(s). The next symbol for mapping in this case is the normal data symbol which has more active carriers than a FSS.

If EAS messages are transmitted in the current frame, EAC precedes FIC, and FIC cells are mapped from the next cell of the EAC in an increasing order of the cell index as shown in (b).

After FIC mapping is completed, one or more DPs are mapped, followed by auxiliary streams, if any, and dummy cells.

Figure 20:
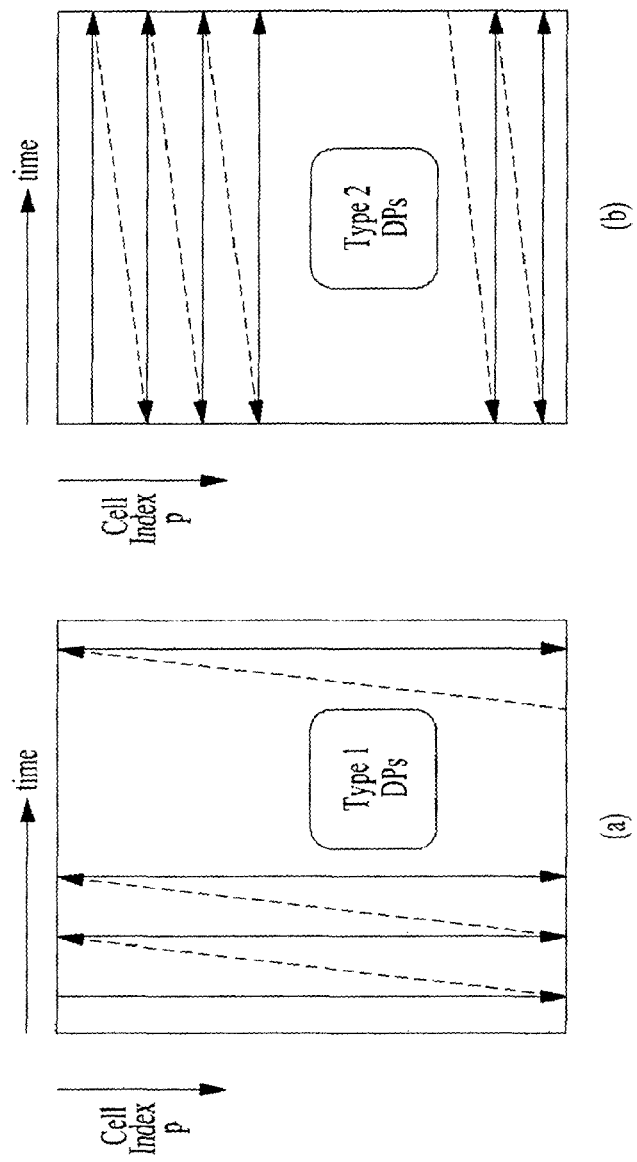
FIG. 20 illustrates a type of DP according to an embodiment of the present invention.

FIG. 20 illustrates a type of DP according to an embodiment of the present invention.

(a) shows type 1 DP and (b) shows type 2 DP.

After the preceding channels, i.e., PLS, EAC and FIC, are mapped, cells of the DPs are mapped. A DP is categorized into one of two types according to mapping method:

Type 1 DP: DP is mapped by TDM
Type 2 DP: DP is mapped by FDM

The type of DP is indicated by DP_TYPE field in the static part of PLS2. FIG. 20 illustrates the mapping orders of Type 1 DPs and Type 2 DPs. Type 1 DPs are first mapped in the increasing order of cell index, and then after reaching the last cell index, the symbol index is increased by one. Within the next symbol, the DP continues to be mapped in the increasing order of cell index starting from p=0. With a number of DPs mapped together in one frame, each of the Type 1 DPs are grouped in time, similar to TDM multiplexing of DPs.

Type 2 DPs are first mapped in the increasing order of symbol index, and then after reaching the last OFDM symbol of the frame, the cell index increases by one and the symbol index rolls back to the first available symbol and then increases from that symbol index. After mapping a number of DPs together in one frame, each of the Type 2 DPs are grouped in frequency together, similar to FDM multiplexing of DPs.

Type 1 DPs and Type 2 DPs can coexist in a frame if needed with one restriction; Type 1 DPs always precede Type 2 DPs. The total number of OFDM cells carrying Type 1 and Type 2 DPs cannot exceed the total number of OFDM cells available for transmission of DPs:

$$D_{DP1}+D_{DP2} \leq D_{DP} \quad \text{[Math figure 2]}$$

where $D_{DP1}$ is the number of OFDM cells occupied by Type 1 DPs, $D_{DP2}$ is the number of cells occupied by Type 2 DPs. Since PLS, EAC, FIC are all mapped in the same way as Type 1 DP, they all follow "Type 1 mapping rule". Hence, overall, Type 1 mapping always precedes Type 2 mapping.

Figure 21:
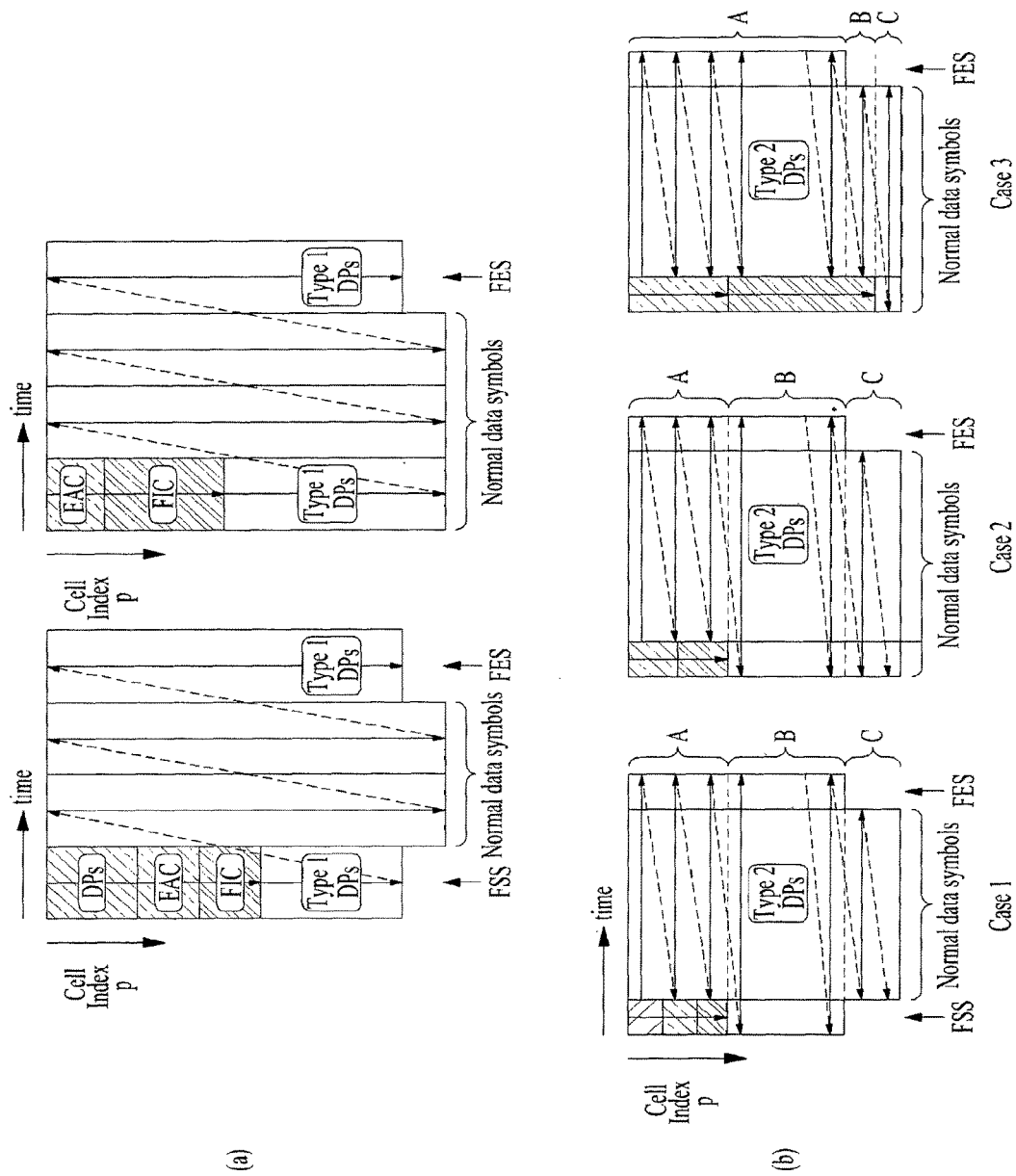
FIG. 21 illustrates DP mapping according to an embodiment of the present invention.

FIG. 21 illustrates DP mapping according to an embodiment of the present invention.

(a) shows an addressing of OFDM cells for mapping type 1 DPs and (b) shows an addressing of OFDM cells for mapping for type 2 DPs.

Addressing of OFDM cells for mapping Type 1 DPs $(0, \ldots, D_{DP1}-1)$ is defined for the active data cells of Type 1 DPs. The addressing scheme defines the order in which the cells from the TIs for each of the Type 1 DPs are allocated to the active data cells. It is also used to signal the locations of the DPs in the dynamic part of the PLS2.

Without EAC and FIC, address 0 refers to the cell immediately following the last cell carrying PLS in the last FSS. If EAC is transmitted and FIC is not in the corresponding frame, address 0 refers to the cell immediately following the last cell carrying EAC. If FIC is transmitted in the corresponding frame, address 0 refers to the cell immediately following the last cell carrying FIC. Address 0 for Type 1 DPs can be calculated considering two different cases as shown in (a). In the example in (a), PLS, EAC and FIC are assumed to be all transmitted. Extension to the cases where either or both of EAC and FIC are omitted is straightforward. If there are remaining cells in the FSS after mapping all the cells up to FIC as shown on the left side of (a).

Addressing of OFDM cells for mapping Type 2 DPs $(0, \ldots, D_{DP2}-1)$ is defined for the active data cells of Type 2 DPs. The addressing scheme defines the order in which the cells from the TIs for each of the Type 2 DPs are allocated to the active data cells. It is also used to signal the locations of the DPs in the dynamic part of the PLS2.

Three slightly different cases are possible as shown in (b). For the first case shown on the left side of (b), cells in the last FSS are available for Type 2 DP mapping. For the second case shown in the middle, FIC occupies cells of a normal symbol, but the number of FIC cells on that symbol is not larger than $C_{FSS}$. The third case, shown on the right side in (b), is the same as the second case except that the number of FIC cells mapped on that symbol exceeds $C_{FSS}$.

The extension to the case where Type 1 DP(s) precede Type 2 DP(s) is straightforward since PLS, EAC and FIC follow the same "Type 1 mapping rule" as the Type 1 DP(s).

Figure 22:
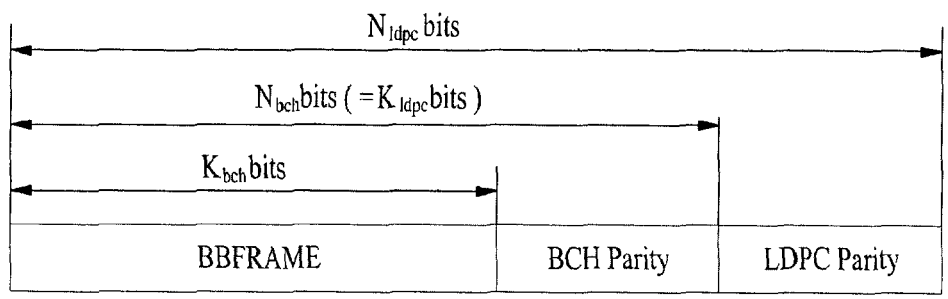
FIG. 22 illustrates an FEC structure according to an embodiment of the present invention.

FIG. 22 illustrates an FEC structure according to an embodiment of the present invention.

FIG. 22 illustrates an FEC structure according to an embodiment of the present invention before bit interleaving. As above mentioned, Data FEC encoder may perform the FEC encoding on the input BBF to generate FECBLOCK procedure using outer coding (BCH), and inner coding (LDPC). The illustrated FEC structure corresponds to the FECBLOCK. Also, the FECBLOCK and the FEC structure have same value corresponding to a length of LDPC codeword.

The BCH encoding is applied to each BBF ($K_{bch}$ bits), and then LDPC encoding is applied to BCH-encoded BBF ($K_{ldpc}$ bits=$N_{bch}$ bits) as illustrated in FIG. 22.

The value of $N_{ldpc}$ is either 64800 bits (long FECBLOCK) or 16200 bits (short FECBLOCK).

The below table 28 and table 29 show FEC encoding parameters for a long FECBLOCK and a short FECBLOCK, respectively.

TABLE 28

| LDPC Rate | $N_{ldpc}$ | $K_{ldpc}$ | $K_{bch}$ | BCH error correction capability | $N_{bch} - K_{bch}$ |
|---|---|---|---|---|---|
| 5/15 | 64800 | 21600 | 21408 | 12 | 192 |
| 6/15 |  | 25920 | 25728 |  |  |
| 7/15 |  | 30240 | 30048 |  |  |
| 8/15 |  | 34560 | 34368 |  |  |
| 9/15 |  | 38880 | 38688 |  |  |
| 10/15 |  | 43200 | 43008 |  |  |
| 11/15 |  | 47520 | 47328 |  |  |
| 12/15 |  | 51840 | 51648 |  |  |
| 13/15 |  | 56160 | 55968 |  |  |

TABLE 29

| LDPC Rate | $N_{ldpc}$ | $K_{ldpc}$ | $K_{bch}$ | BCH error correction capability | $N_{bch} - K_{bch}$ |
|---|---|---|---|---|---|
| 5/15 | 16200 | 5400 | 5232 | 12 | 168 |
| 6/15 |  | 6480 | 6312 |  |  |
| 7/15 |  | 7560 | 7392 |  |  |
| 8/15 |  | 8640 | 8472 |  |  |
| 9/15 |  | 9720 | 9552 |  |  |
| 10/15 |  | 10800 | 10632 |  |  |
| 11/15 |  | 11880 | 11712 |  |  |
| 12/15 |  | 12960 | 12792 |  |  |
| 13/15 |  | 14040 | 13872 |  |  |

The details of operations of the BCH encoding and LDPC encoding are as follows:

A 12-error correcting BCH code is used for outer encoding of the BBF. The BCH generator polynomial for short FECBLOCK and long FECBLOCK are obtained by multiplying together all polynomials.

LDPC code is used to encode the output of the outer BCH encoding. To generate a completed $B_{ldpc}$ (FECBLOCK), $P_{ldpc}$ (parity bits) is encoded systematically from each $I_{ldpc}$ (BCH-encoded BBF), and appended to $I_{ldpc}$. The completed $B_{ldpc}$ (FECBLOCK) are expressed as follow Math figure.

$$B_{ldpc} = [I_{ldpc} P_{ldpc}] = [i_0, i_1, \ldots, i_{K_{ldpc}-1}, p_0, p_1, \ldots, p_{N_{ldpc}-K_{ldpc}-1}]$$ [Math figure 3]

The parameters for long FECBLOCK and short FECBLOCK are given in the above table 28 and 29, respectively.

The detailed procedure to calculate $N_{ldpc}-K_{ldpc}$ parity bits for long FECBLOCK, is as follows:

1) Initialize the parity bits, $$p_0 = p_1 = p_2 = \cdots = p_{N_{ldpc}-K_{ldpc}-1} = 0$$ [Math figure 4]

2) Accumulate the first information bit—$i_0$, at parity bit addresses specified in the first row of an addresses of parity check matrix. The details of addresses of parity check matrix will be described later. For example, for rate 13/15:

$$p_{983} = p_{983} \oplus i_0 \quad p_{2815} = p_{2815} \oplus i_0$$

$$p_{4837} = p_{4837} \oplus i_0 \quad p_{4989} = p_{4989} \oplus i_0$$

$$p_{6138} = p_{6138} \oplus i_0 \quad p_{6458} = p_{6458} \oplus i_0$$

$$p_{6921} = p_{6921} \oplus i_0 \quad p_{6974} = p_{6974} \oplus i_0$$

$$p_{7572} = p_{7572} \oplus i_0 \quad p_{8260} = p_{8260} \oplus i_0$$

$$p_{8496} = p_{8496} \oplus i_0$$ [Math figure 5]

3) For the next 359 information bits, $i_s$, s=1, 2, . . . , 359 accumulate $i_s$ at parity bit addresses using following Math figure.

$$\{x + (s \bmod 360) \times Q_{ldpc}\} \bmod(N_{ldpc}-K_{ldpc})$$ [Math figure 6]

where x denotes the address of the parity bit accumulator corresponding to the first bit $i_0$, and $Q_{ldpc}$ is a code rate dependent constant specified in the addresses of parity check matrix. Continuing with the example, $Q_{ldpc}$=24 for rate 13/15, so for information bit $i_1$, the following operations are performed:

$$p_{1007} = p_{1007} \oplus i_1 \quad p_{2839} = p_{2839} \oplus i_1$$

$$p_{4861} = p_{4861} \oplus i_1 \quad p_{5013} = p_{5013} \oplus i_1$$

$$p_{6162} = p_{6162} \oplus i_1 \quad p_{6482} = p_{6482} \oplus i_1$$

$$p_{6945} = p_{6945} \oplus i_1 \quad p_{6998} = p_{6998} \oplus i_1$$

$$p_{7596} = p_{7596} \oplus i_1 \quad p_{8284} = p_{8284} \oplus i_1$$

$$p_{8520} = p_{8520} \oplus i_1$$ [Math figure 7]

4) For the 361$^{st}$ information bit $i_{360}$, the addresses of the parity bit accumulators are given in the second row of the addresses of parity check matrix. In a similar manner the addresses of the parity bit accumulators for the following 359 information bits $i_s$, s=361, 362, . . . , 719 are obtained using the Math figure 6, where x denotes the address of the parity bit accumulator corresponding to the information bit $i_{360}$, i.e., the entries in the second row of the addresses of parity check matrix.

5) In a similar manner, for every group of 360 new information bits, a new row from addresses of parity check matrixes used to find the addresses of the parity bit accumulators.

After all of the information bits are exhausted, the final parity bits are obtained as follows:

6) Sequentially perform the following operations starting with i=1

$$p_i = p_i \oplus p_{i-1}, i=1, 2, \ldots, N_{ldpc}-K_{ldpc}-1$$ [Math figure 8]

where final content of $p_i$, i=0, 1, . . . $N_{ldpc}-K_{ldpc}-1$ is equal to the parity bit $p_i$.

TABLE 30

| Code Rate | $Q_{ldpc}$ |
|---|---|
| 5/15 | 120 |
| 6/15 | 108 |
| 7/15 | 96 |
| 8/15 | 84 |
| 9/15 | 72 |
| 10/15 | 60 |
| 11/15 | 48 |
| 12/15 | 36 |
| 13/15 | 24 |

This LDPC encoding procedure for a short FECBLOCK is in accordance with t LDPC encoding procedure for the long FECBLOCK, except replacing the table 30 with table 31, and replacing the addresses of parity check matrix for the long FECBLOCK with the addresses of parity check matrix for the short FECBLOCK.

TABLE 31

| Code Rate | $Q_{ldpc}$ |
|---|---|
| 5/15 | 30 |
| 6/15 | 27 |
| 7/15 | 24 |
| 8/15 | 21 |
| 9/15 | 18 |
| 10/15 | 15 |
| 11/15 | 12 |
| 12/15 | 9 |
| 13/15 | 6 |

Figure 23:
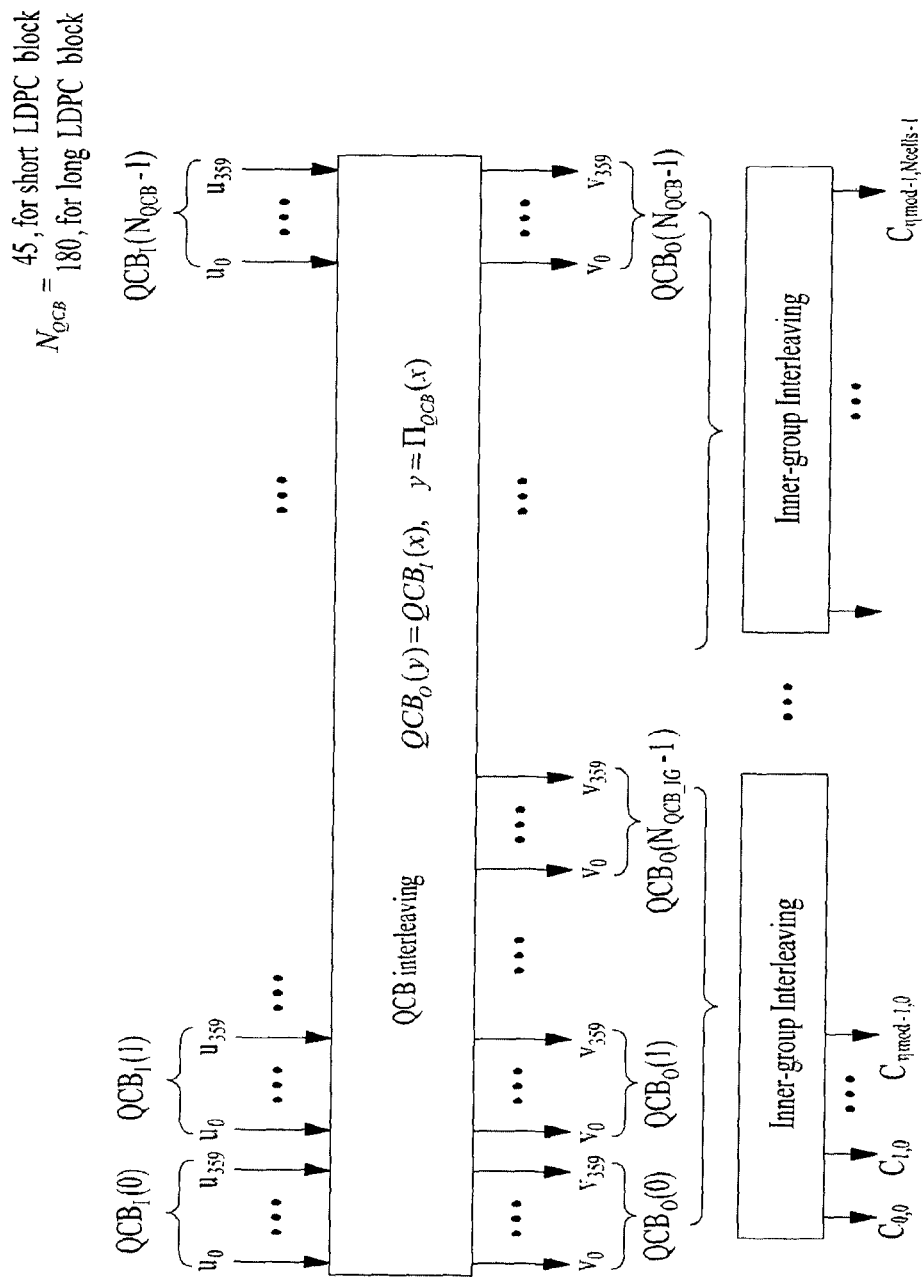
FIG. 23 illustrates a bit interleaving according to an embodiment of the present invention.

FIG. 23 illustrates a bit interleaving according to an embodiment of the present invention.

The outputs of the LDPC encoder are bit-interleaved, which consists of parity interleaving followed by Quasi-Cyclic Block (QCB) interleaving and inner-group interleaving.

(a) shows Quasi-Cyclic Block (QCB) interleaving and (b) shows inner-group interleaving.

The FECBLOCK may be parity interleaved. At the output of the parity interleaving, the LDPC codeword consists of 180 adjacent QC blocks in a long FECBLOCK and 45 adjacent QC blocks in a short. FECBLOCK. Each QC block in either a long or short FECBLOCK consists of 360 bits. The parity interleaved LDPC codeword is interleaved by QCB interleaving. The unit of QCB interleaving is a QC block. The QC blocks at the output of parity interleaving are permutated by QCB interleaving as illustrated in FIG. 23, where $N_{cells}=64800/\eta_{mod}$ or $16200/\eta_{mod}$ according to the FECBLOCK length. The QCB interleaving pattern is unique to each combination of modulation type and LDPC code rate.

After QCB interleaving, inner-group interleaving is performed according to modulation type and order ($\eta_{mod}$) which is defined in the below table 32. The number of QC blocks for one inner-group, $N_{QCB\_IG}$, is also defined.

TABLE 32

| Modulation type | $\eta_{mod}$ | $N_{QCB\_IG}$ |
|---|---|---|
| QAM-16 | 4 | 2 |
| NUC-16 | 4 | 4 |
| NUQ-64 | 6 | 3 |
| NUC-64 | 6 | 6 |
| NUQ-256 | 8 | 4 |
| NUC-256 | 8 | 8 |
| NUQ-1024 | 10 | 5 |
| NUC-1024 | 10 | 10 |

The inner-group interleaving process is performed with $N_{QCB\_IG}$ QC blocks of the QCB interleaving output. Inner-group interleaving has a process of writing and reading the bits of the inner-group using 360 columns and $N_{QCB\_IG}$ rows. In the write operation, the bits from the QCB interleaving output are written row-wise. The read operation is performed column-wise to read out m bits from each row, where m is equal to 1 for NUC and 2 for NUQ.

Figure 24:
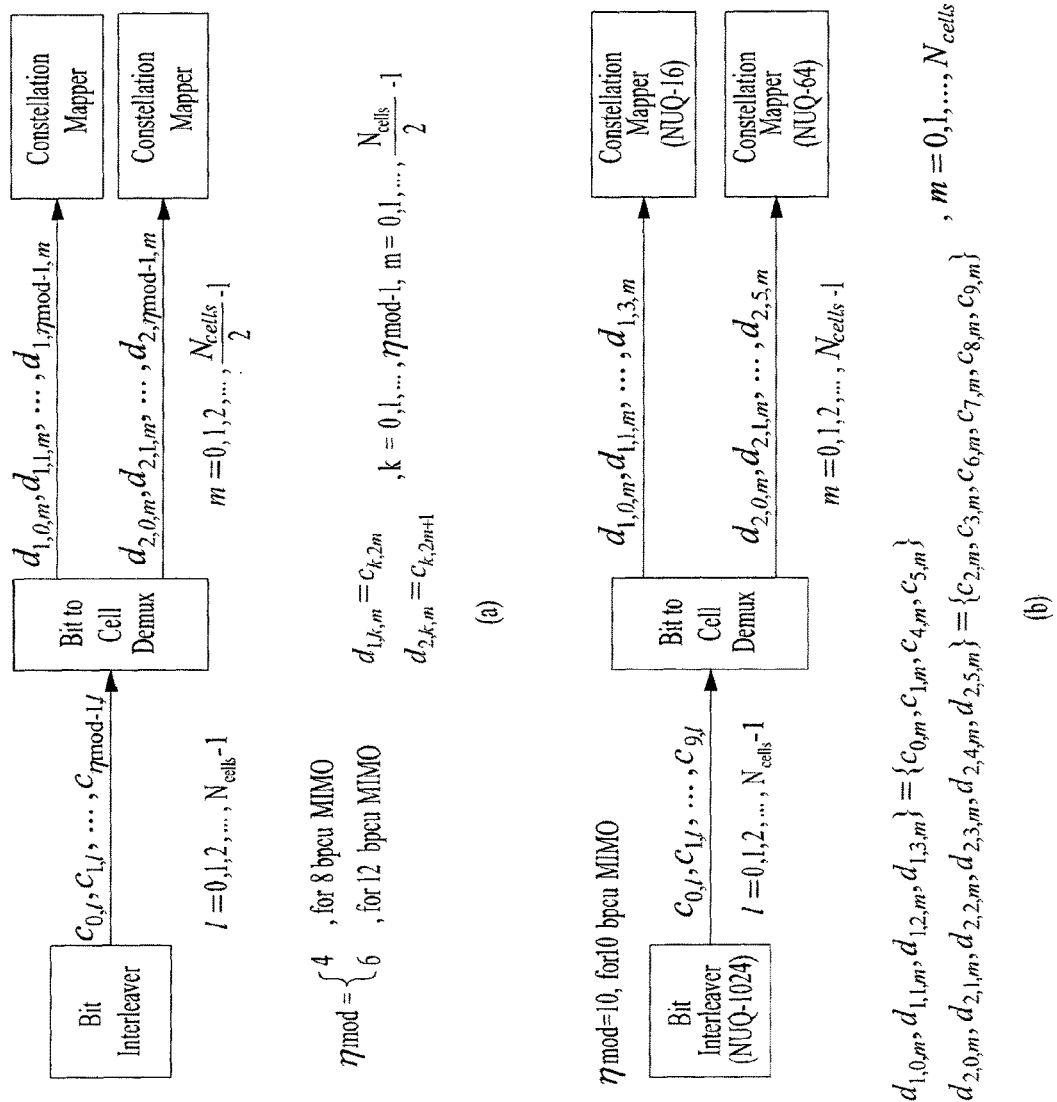
FIG. 24 illustrates a cell-word demultiplexing according to an embodiment of the present invention.

FIG. 24 illustrates a cell-word demultiplexing according to an embodiment of the present invention.

(a) shows a cell-word demultiplexing for 8 and 12 bpcu MIMO and (b) shows a cell-word demultiplexing for 10 bpcu MIMO.

Each cell word $(c_{0,l}, c_{1,l}, \ldots, c_{\eta mod-1,l})$ of the bit interleaving output is demultiplexed into $(d_{1,0,m}, d_{1,1,m} \ldots, d_{1,\eta mod-1,m})$ and $(d_{2,0,m}, d_{2,1,m} \ldots, d_{2,\eta mod-1,m})$ as shown in (a), which describes the cell-word demultiplexing process for one XFECBLOCK.

For the 10 bpcu MIMO case using different types of NUQ for MIMO encoding, the Bit Interleaver for NUQ-1024 is re-used. Each cell word $(c_{0,l}, c_{1,l}, \ldots, c_{9,l})$ of the Bit Interleaver output is demultiplexed into $(d_{1,0,m}, d_{1,1,m} \ldots, d_{1,3,m})$ and $(d_{2,0,m}, d_{2,1,m} \ldots, d_{2,5,m})$, as shown in (b).

FIG. 25 illustrates a time interleaving according to an embodiment of the present invention.

(a) to (c) show examples of TI mode.

The time interleaver operates at the DP level. The parameters of time interleaving (TI) may be set differently for each DP.

The following parameters, which appear in part of the PLS2-STAT data, configure the TI:

DP_TI_TYPE (allowed values: 0 or 1): Represents the TI mode; '0' indicates the mode with multiple TI blocks (more than one TI block) per TI group. In this case, one TI group is directly mapped to one frame (no inter-frame interleaving). '1' indicates the mode with only one TI block per TI group. In this case, the TI block may be spread over more than one frame (inter-frame interleaving).

DP_TI_LENGTH: If DP_TI_TYPE='0', this parameter is the number of TI blocks $N_{TI}$ per TI group. For DP_TI_TYPE='1', this parameter is the number of frames $P_I$ spread from one TI group.

DP_NUM_BLOCK_MAX (allowed values: 0 to 1023): Represents the maximum number of XFECBLOCKs per TI group.

DP_FRAME_INTERVAL (allowed values: 1, 2, 4, 8): Represents the number of the frames $I_{JUMP}$ between two successive frames carrying the same DP of a given PHY profile.

DP_TI_BYPASS (allowed values: 0 or 1): If time interleaving is not used for a DP, this parameter is set to '1'. It is set to '0' if time interleaving is used.

Additionally, the parameter DP_NUM_BLOCK from the PLS2-DYN data is used to represent the number of XFEC-BLOCKs carried by one TI group of the DP.

When time interleaving is not used for a DP, the following TI group, time interleaving operation, and TI mode are not considered. However, the Delay Compensation block for the dynamic configuration information from the scheduler will still be required. In each DP, the XFECBLOCKs received from the SSD/MIMO encoding are grouped into TI groups. That is, each TI group is a set of an integer number of XFECBLOCKs and will contain a dynamically variable number of XFECBLOCKs. The number of XFECBLOCKs in the TI group of index n is denoted by $N_{xBLOCK\_Group}(n)$ and is signaled as DP_NUM_BLOCK in the PLS2-DYN data. Note that $N_{xBLOCK\_Group}(n)$ may vary from the minimum value of 0 to the maximum value $N_{xBLOCK\_Group\_MAX}$ (corresponding to DP_NUM_BLOCK_MAX) of which the largest value is 1023.

Each TI group is either mapped directly onto one frame or spread over $P_I$ frames. Each TI group is also divided into more than one TI blocks($N_{TI}$), where each TI block corresponds to one usage of time interleaver memory. The TI blocks within the TI group may contain slightly different numbers of XFECBLOCKs. If the TI group is divided into multiple TI blocks, it is directly mapped to only one frame. There are three options for time interleaving (except the extra option of skipping the time interleaving) as shown in the below table 33.

TABLE 33

| Modes | Descriptions |
|---|---|
| Option-1 | Each TI group contains one TI block and is mapped directly to one frame as shown in (a). This option is signaled in the PLS2-STAT by DP_TI_TYPE = '0' and DP_TI_LENGTH = '1'($N_{TI}$ = 1). |
| Option-2 | Each TI group contains one TI block and is mapped to more than one frame. (b) shows an example, where one TI group is mapped to two frames, i.e., DP_TI_LENGTH = '2' ($P_I$ = 2) and DP_FRAME_INTERVAL ($I_{JUMP}$ = 2). This provides greater time diversity for low data-rate services. This option is signaled in the PLS2-STAT by DP_TI_TYPE = '1'. |
| Option-3 | Each TI group is divided into multiple TI blocks and is mapped directly to one frame as shown in (c). Each TI block may use full TI memory, so as to provide the maximum bit-rate for a DP. This option is signaled in the PLS2-STAT signaling by DP_TI_TYPE = '0' and DP_TI_LENGTH = $N_{TI}$, while $P_I$ = 1. |

In each DP, the TI memory stores the input XFECBLOCKs (output XFECBLOCKs from the SSD/MIMO encoding block) Assume that input XFECBLOCKs are defined as $$(d_{n,s,0,0}, d_{n,s,0,1}, \ldots, d_{n,s,0,N_{cells}-1}, d_{n,s,1,0}, \ldots, d_{n,s,1,N_{cells}-1}, \ldots,$$
$$d_{n,s,N_{xBLOCK\_TI}(n,s)-1,0}, \ldots, d_{n,s,N_{xBLOCK\_TI}(n,s)-1,N_{cells}-1}),$$

where $d_{n,s,r,q}$ is the $q^{th}$ cell of the $r^{th}$ XFECBLOCK in the $s^{th}$ TI block of the $n^{th}$ TI group and represents the outputs of SSD and MIMO encodings as follows $$d_{n,s,r,q} = \begin{cases} f_{n,s,r,q}, & \text{the output of SSD } \ldots \text{ encoding} \\ g_{n,s,r,q}, & \text{the output of MIMO encoding} \end{cases}.$$

In addition, assume that output XFECBLOCKs from the time interleaver are defined as $$(h_{n,s,0}, h_{n,s,1}, \ldots, h_{n,s,i}, \ldots, h_{n,s,N_{xBLOCK\_TI}(n,s) \times N_{cells}-1}),$$

where $h_{n,s,i}$ is the $i^{th}$ output cell (for i=0, ..., $N_{xBLOCK\_TI}$ (n,s)×$N_{cells}$−1) in the $s^{th}$ TI block of the $n^{th}$ TI group.

Typically, the time interleaver will also act as a buffer for DP data prior to the process of frame building. This is achieved by means of two memory banks for each DP. The first TI-block is written to the first bank. The second TI-block is written to the second bank while the first bank is being read from and so on.

The TI is a twisted row-column block interleaver. For the $s^{th}$ TI block of the $n^{th}$ TI group, the number of rows $N_r$ of a TI memory is equal to the number of cells $N_{cells}$, i.e., $N_r = N_{cells}$ while the number of columns $N_c$ is equal to the number $N_{xBLOCK\_TI}(n,s)$.

Figure 26:
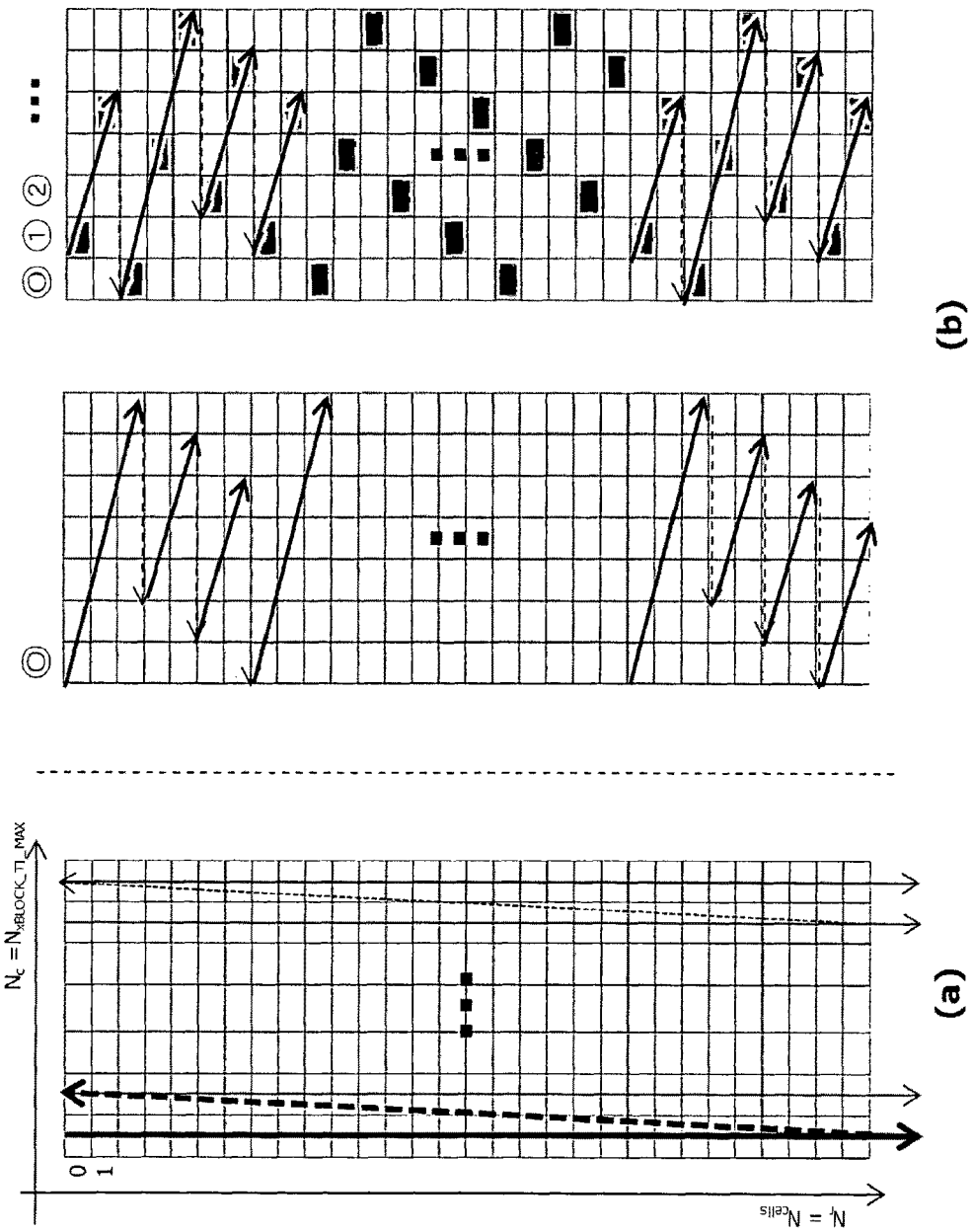
FIG. 26 illustrates the basic operation of a twisted row-column block interleaver according to an embodiment of the present invention.

FIG. 26 illustrates the basic operation of a twisted row-column block interleaver according to an embodiment of the present invention.

(a) shows a writing operation in the time interleaver and (b) shows a reading operation in the time interleaver The first XFECBLOCK is written column-wise into the first column of the TI memory, and the second XFECBLOCK is written into the next column, and so on as shown in (a). Then, in the interleaving array, cells are read out diagonal-wise. During diagonal-wise reading from the first row (rightwards along the row beginning with the left-most column) to the last row, $N_r$ cells are read out as shown in (b). In detail, assuming $z_{n,s,i}$(i=0, ..., $N_rN_c$) as the TI memory cell position to be read sequentially, the reading process in such an interleaving array is performed by calculating the row index $R_{n,s,i}$, the column index $C_{n,s,i}$, and the associated twisting parameter $T_{n,s,i}$ as follows expression.

[Math figure 9]
$$\text{GENERATE}(R_{n,s,i}, C_{n,s,i}) = \{$$
$$R_{n,s,i} = \text{mod}(i, N_r),$$
$$T_{n,s,i} = \text{mod}(S_{shift} \times R_{n,s,i}, N_c),$$
$$C_{n,s,i} = \text{mod}\left(T_{n,s,i} + \left\lfloor \frac{i}{N_r} \right\rfloor, N_c\right)$$
$$\}$$

where $S_{shift}$ is a common shift value for the diagonal-wise reading process regardless of $N_{xBLOCK\_TI}(n,s)$ and it is determined by $N_{xBLOCK\_TI\_MAX}$ given in the PLS2-STAT as follows expression.

[Math figure 10]

$$\begin{cases} N'_{xBLOCK\_TI\_MAX} = N_{xBLOCK\_TI\_MAX} + 1, & \text{if } N_{xBLOCK\_TI\_MAX} \text{mod} 2 = 0 \\ N'_{xBLOCK\_TI\_MAX} = N_{xBLOCK\_TI\_MAX}, & \text{if } N_{xBLOCK\_TI\_MAX} \text{mod} 2 = 1 \end{cases},$$

$$S_{shift} = \frac{N'_{xBLOCK\_TI\_MAX} - 1}{2}.$$

As a result, the cell positions to be read are calculated by a coordinate as $z_{n,s,i} = N_r C_{n,s,i} + R_{n,s,i}$.

Figure 27:
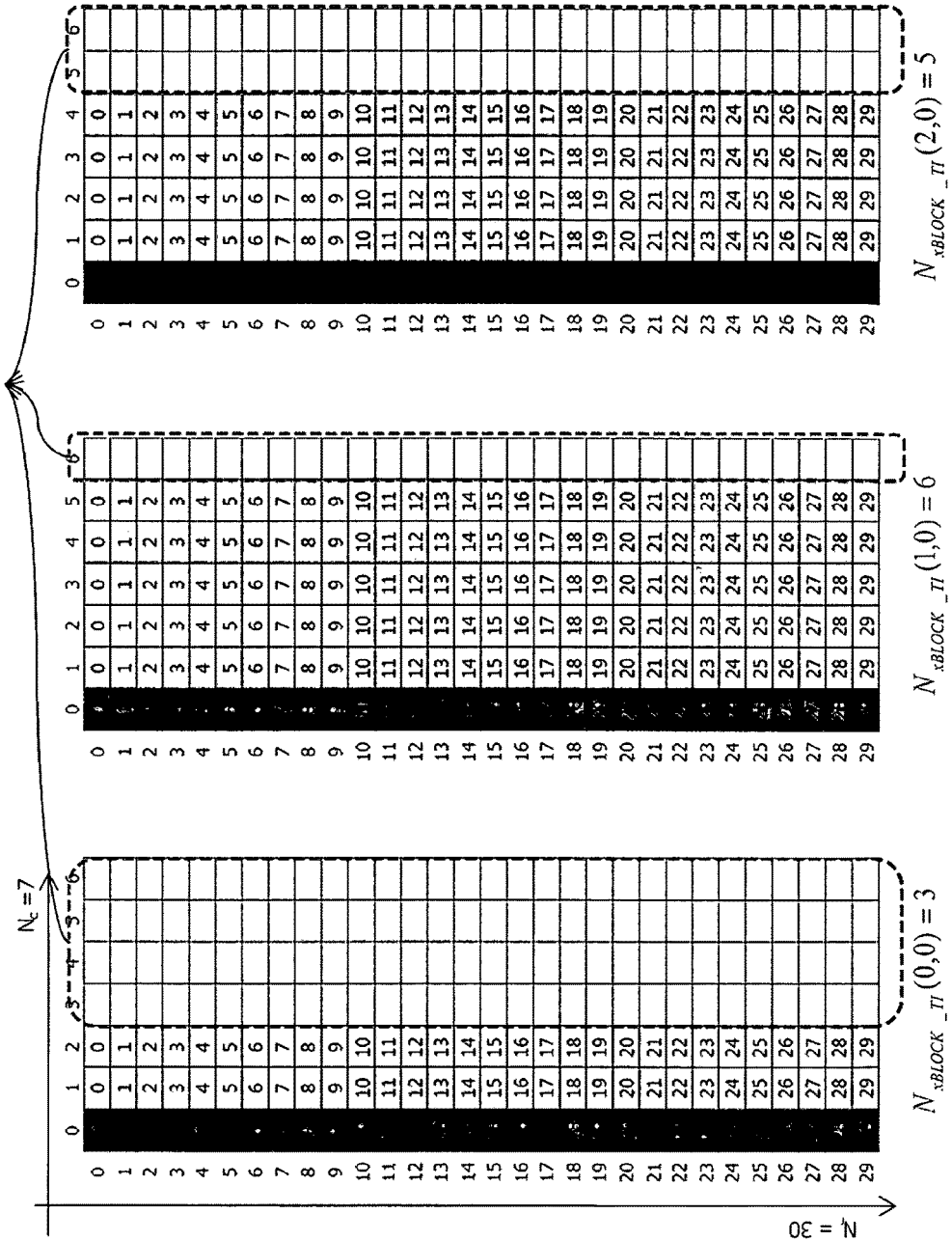
FIG. 27 illustrates an operation of a twisted row-column block interleaver according to another embodiment of the present invention.

FIG. 27 illustrates an operation of a twisted row-column block interleaver according to another embodiment of the present invention.

More specifically, FIG. 27 illustrates the interleaving array in the TI memory for each TI group, including virtual XFECBLOCKs when $N_{xBLOCK\_TI}(0,0)=3$, $N_{xBLOCK\_TI}(1,0)=6$, $N_{xBLOCK\_TI}(2,0)=5$.

The variable number $N_{xBLOCK\_TI}(n,s)=N$, will be less than or equal to $N'_{xBLOCK\_TI\_MAX}$. Thus, in order to achieve a single-memory deinterleaving at the receiver side, regardless of $N_{xBLOCK\_TI}(n,s)$ the interleaving array for use in a twisted row-column block interleaver is set to the size of $N_r \times N_c = N_{cells} \times N'_{xBLOCK\_TI\_MAX}$ by inserting the virtual XFECBLOCKs into the TI memory and the reading process is accomplished as follow expression.

$$p = 0; \qquad \text{[Math figure 11]}$$
$$\text{for } i = 0; \ i < N_{cells} N'_{xBLOCK\_TI\_MAX}; \ i = i+1$$
$$\{\text{GENERATE}(R_{n,s,i}, C_{n,s,i});$$
$$V_i = N_r C_{n,s,j} + R_{n,s,j}$$
$$\text{if } V_i < N_{cells} N_{xBLOCK\_TI}(n,s)$$
$$\{$$
$$Z_{n,s,p} = V_i; \ p = p+1;$$
$$\}$$
$$\}$$

The number of TI groups is set to 3. The option of time interleaver is signaled in the PLS2-STAT data by DP_TI_TYPE='0', DP_FRAME_INTERVAL='1', and DP_TI_LENGTH='1', i.e., $N_{TI}=1$, $I_{jump}=1$, and $P_I=1$. The number of XFECBLOCKs, each of which has $N_{cells}=30$ cells, per TI group is signaled in the PLS2-DYN data by $N_{xBLOCK\_TI}(0,0)=3$, $N_{xBLOCK\_TI}(1,0)=6$, and $N_{xBLOCK\_TI}(2,0)=5$, respectively. The maximum number of XFECBLOCK is signaled in the PLS2-STAT data by $N_{xBLOCK\_Group\_MAX}$, which leads to $\lfloor N_{xBLOCK\_Group\_MAX}/N_{TI}\rfloor = N_{xBLOCK\_TI\_MAX}=6$.

Figure 28:
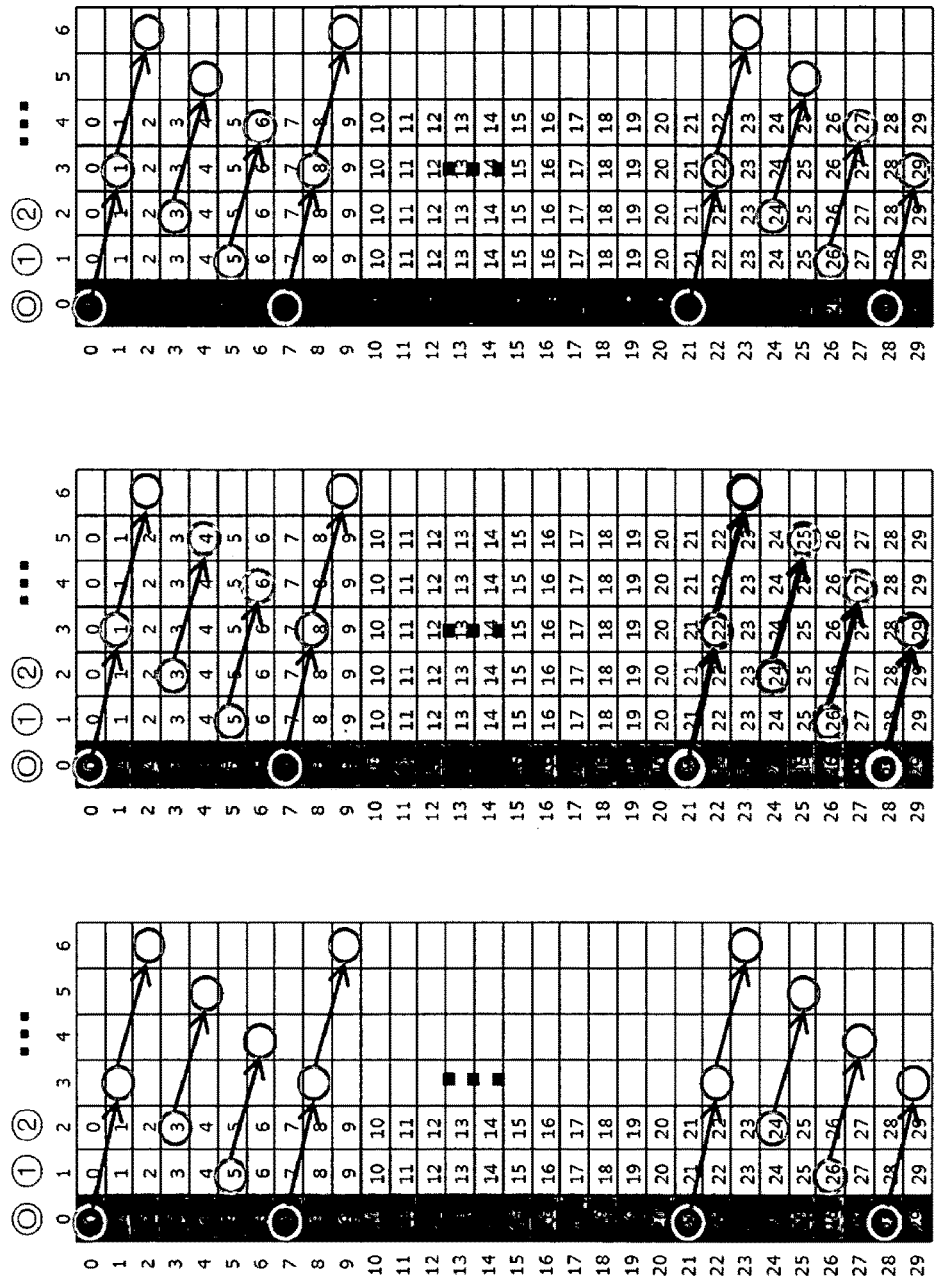
FIG. 28 illustrates a diagonal-wise reading pattern of a twisted row-column block interleaver according to an embodiment of the present invention.

FIG. 28 illustrates a diagonal-wise reading pattern of a twisted row-column block interleaver according to an embodiment of the present invention.

More specifically FIG. 28 shows a diagonal-wise reading pattern from each interleaving array with parameters of $N'_{xBLOCK\_TI\_MAX}=7$ and $S_{shift}=(7-1)/2=3$. Note that in the reading process shown as pseudocode above, if $V_i \geq N_{cells} N_{xBLOCK\_TI}(n,s)$, the value of $V_i$ is skipped and the next calculated value of $V_i$ is used.

Figure 29:
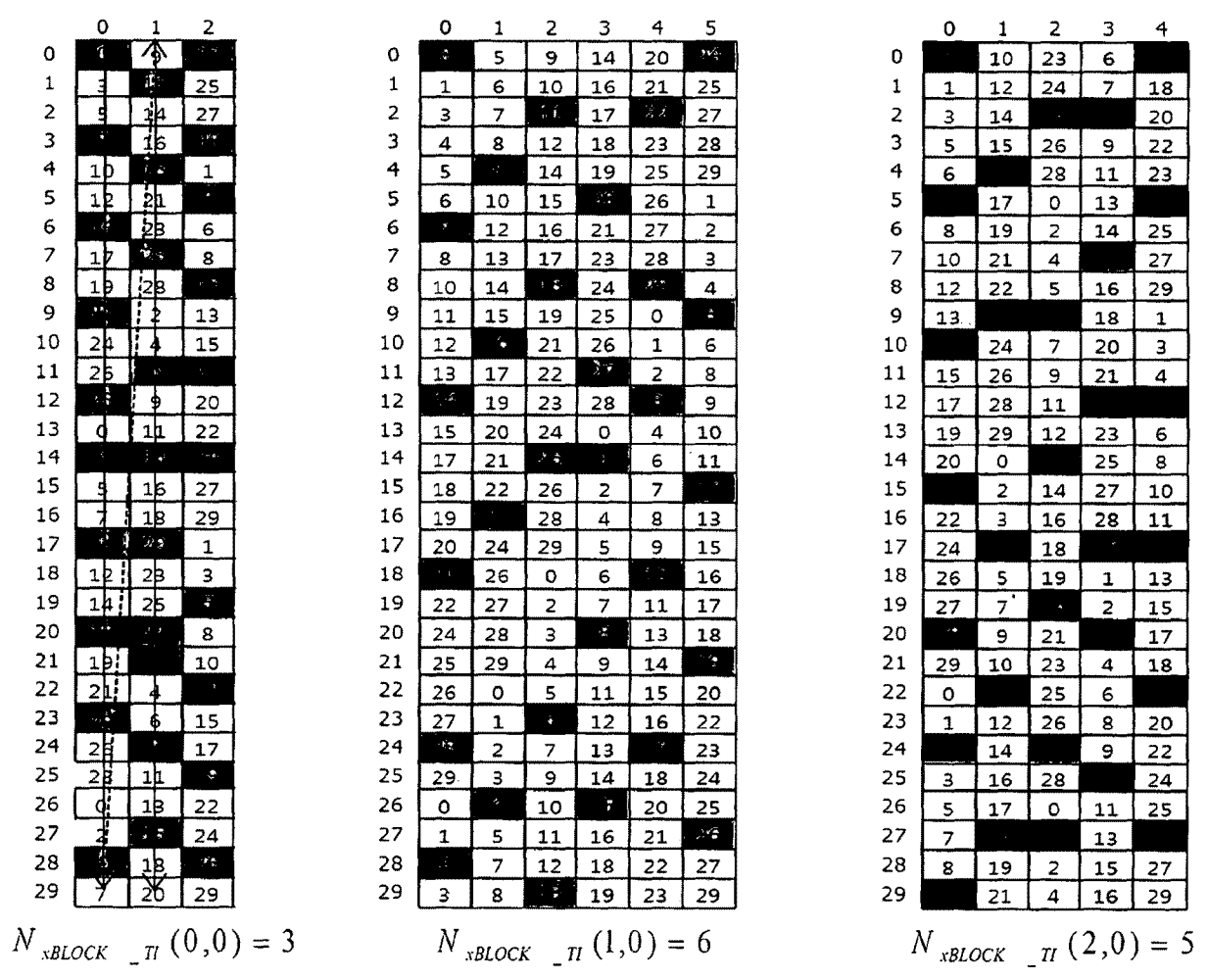

FIG. 29 illustrates interlaved XFECBLOCKs from each interleaving array according to an embodiment of the present invention.

FIG. 29 illustrates the interleaved XFECBLOCKs from each interleaving array with parameters of $N'_{xBLOCK\_TI\_MAX}=7$ and $S_{shift}=3$.

Figure 30:
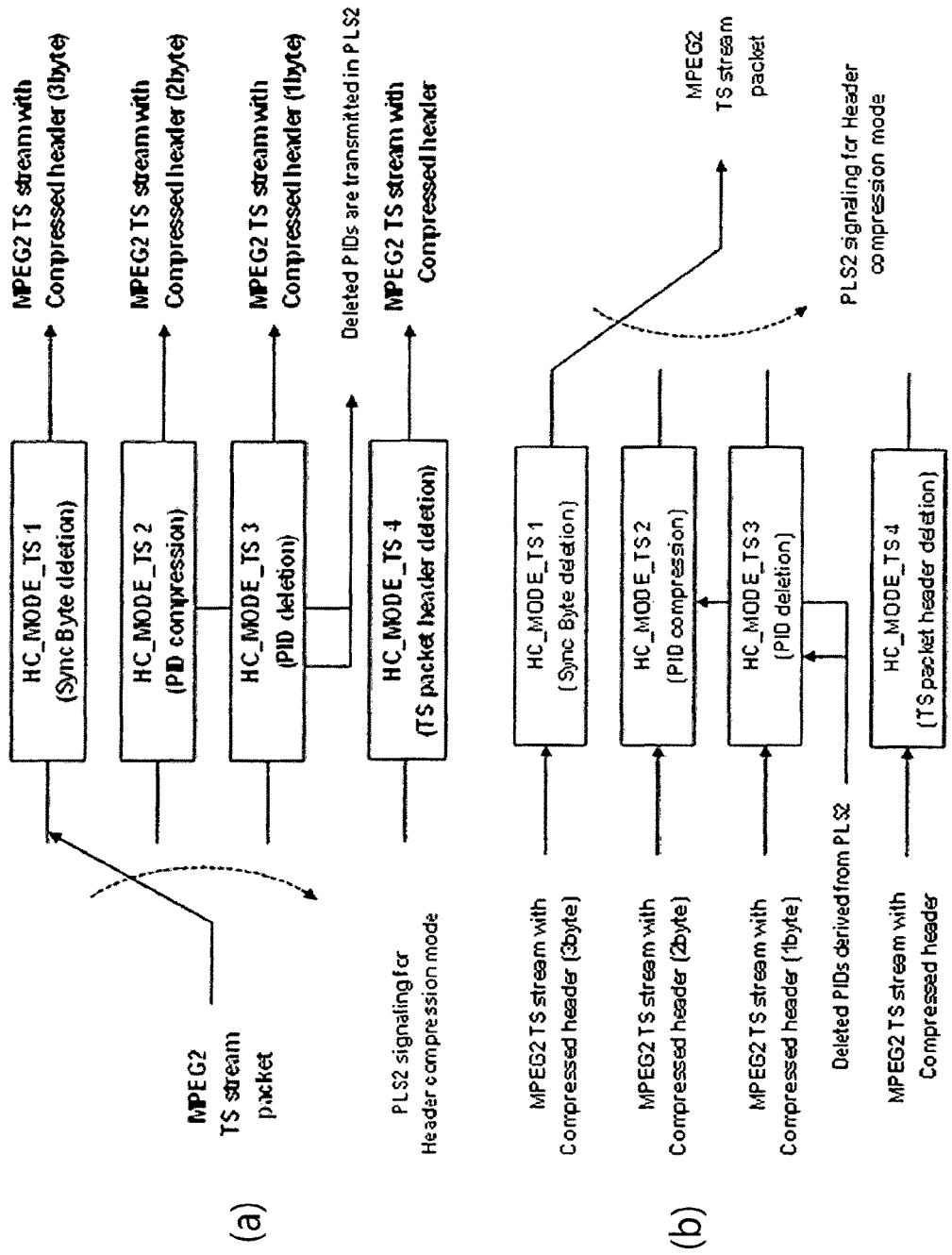
FIG. 30 illustrates an operation of TS packet header compression and decompression according to an embodiment of the present invention.

FIG. 30 illustrates an operation of TS packet header compression and decompression according to an embodiment of the present invention.
(a) shows an operation of TS packet header compression according to an embodiment of the present invention and (b) shows an operation of TS packet header decompression according to an embodiment of the present invention.

As above mentioned, for Transport Stream, the receiver has a-priori information about the sync-byte configuration (0x47) and the packet length (188 Byte). If the input TS stream carries content that has only one PID, i.e., for only one service component (video, audio, etc.) or service sub-component (SVC base layer, SVC enhancement layer, MVC base view or MVC dependent views), TS packet header compression can be applied (optionally) to the Transport Stream. Also, if the input TS carries content that has only one PMT and multiple video and audio PIDs in one DP, TS packet header compression (optional) can be applied to it as well. (a) illustrates the TS packet header compression process at the transmission side, and (b) illustrates the TS packet header de-compression process at the receiver side.

The system according to an embodiment of the present invention may provide three types of packet header compression modes for TS. The packet header compression modes for TS are signaled in the PLS2 data.

Sync byte deletion: HC_MODE_TS='00'
PID compression: HC_MODE_TS='01'
PID deletion: HC_MODE_TS='10'
TS packet header deletion: HC_MODE_TS='11'

Also, as above mentioned, IP packet header compression is used optionally if the input steam is an IP stream. The IP packet header compression mode HC_MODE_IP 1 may be signaled in PLS2-STAT data.

Figure 31:
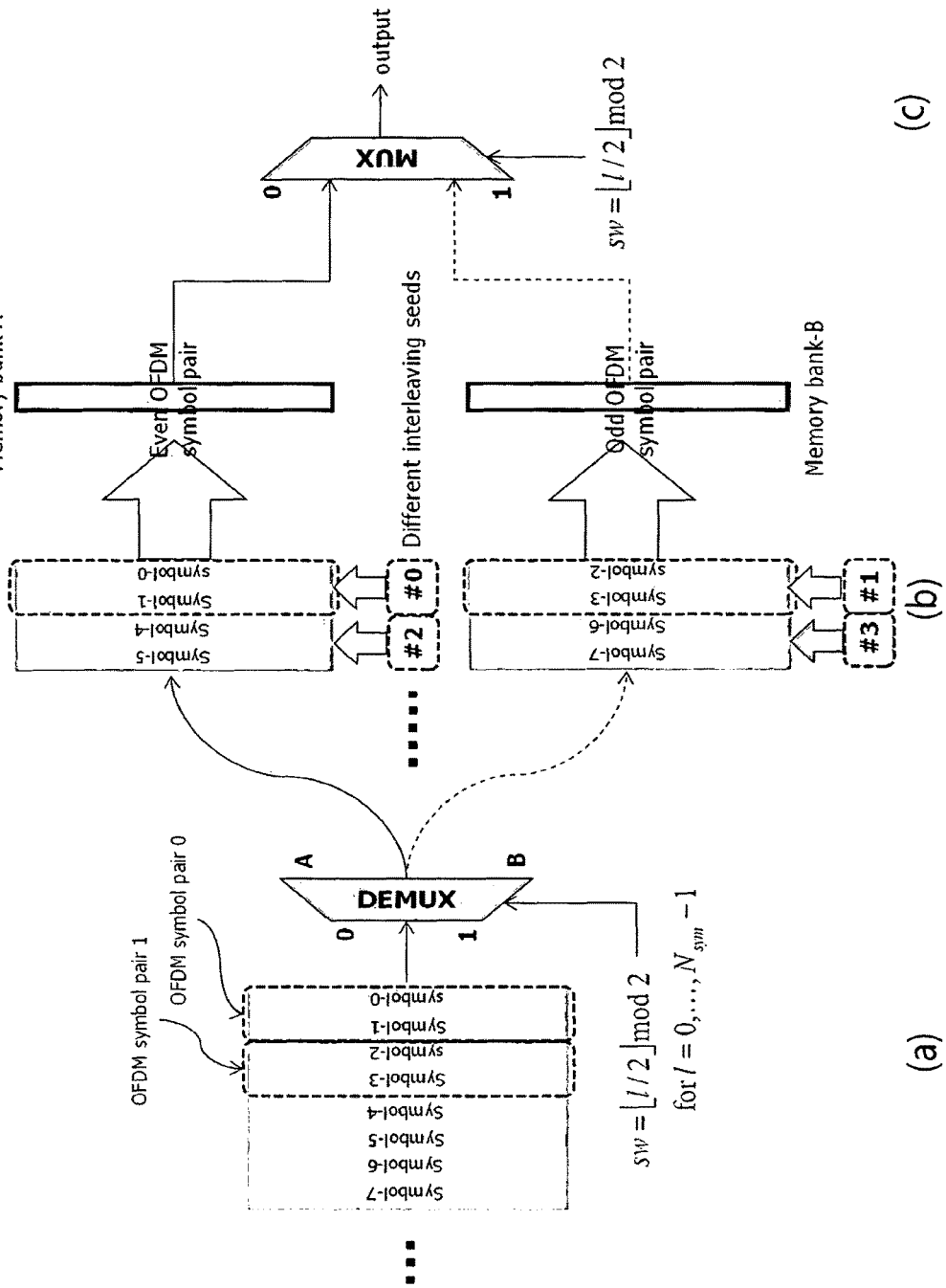
FIG. 31 illustrates a frequency interleaving according to an embodiment of the present invention.

FIG. 31 illustrates a frequency interleaving according to an embodiment of the present invention.

FIG. 31 illustrates basic operation of the Frequency Interleaver using two memory banks at the transmitter, which enables a single-memory deinterleaving at the receiver.

(a) shows demultiplexing process, (b) shows interleaving process and (c) shows multiplexing process.

In FIG. 31, two memory banks are used for each OFDM symbol pair. Operationally, the first (even-indexed) OFDM symbol pair is interleaved in memory bank-A, while the second (odd-indexed) OFDM symbol pair is interleaved in memory bank-B and so on, alternating between A and B. The DEMUX and MUX blocks, $sw=\lfloor l/2 \rfloor \mod 2$ for $l=0, \ldots, N_{sym}-1$, control the input sequential OFDM symbols to be interleaved, and the output OFDM symbol pair to be transmitted, respectively. Different interleaving seeds are used for every OFDM symbol pair.

Figure 32:
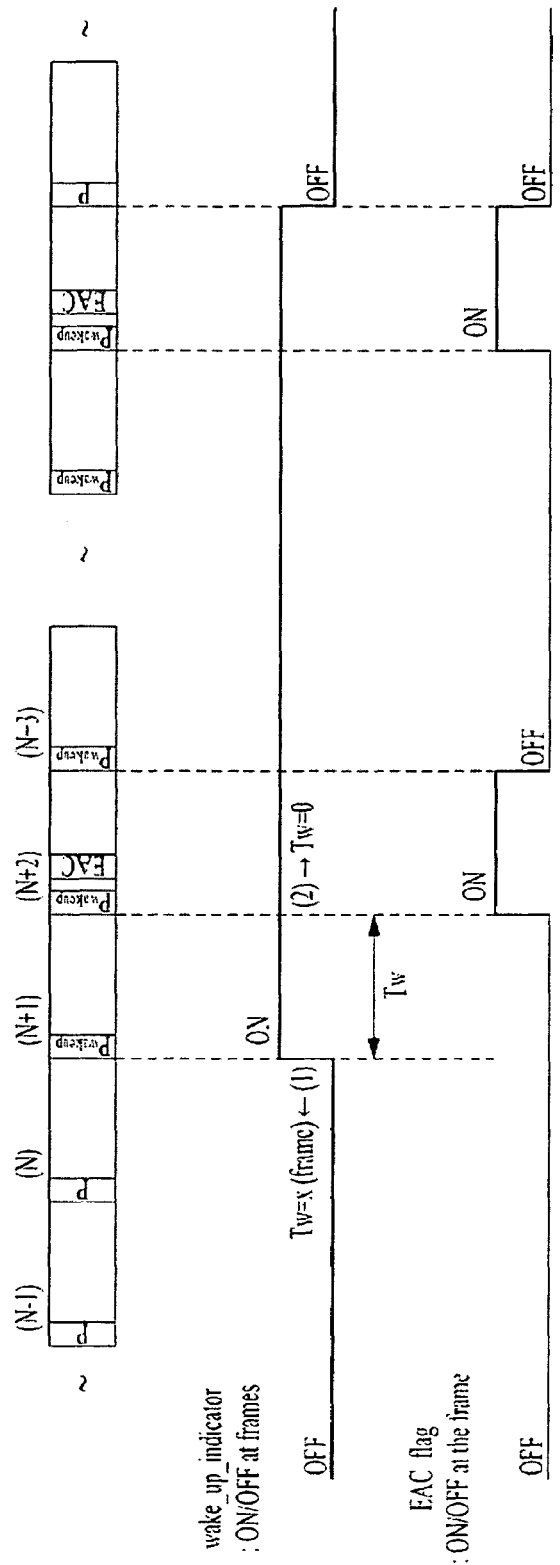
FIG. 32 illustrates frame structure with EAC according to an embodiment of the present invention.

FIG. 32 illustrates frame structure with EAC according to an embodiment of the present invention.

The present invention provides a fast and robust Emergency Alert System (EAS) feature that can deliver emergency alert messages without delay.

The present invention defines an Emergency Alert Channel (EAC) that can deliver the emergency alerting message, such as the Common Alerting Protocol (CAP) data, directly in the physical layer so that it can be received robustly by all receivers, whether fixed or mobile. EAC is as robust as PLSC for reception under any channel conditions. The allocation and mapping of EAC within a frame is described above.

EAC is located after the PLSC when a frame has an EAC. If the frame includes a FIC, EAC is inserted between PLSC and FIC. EAC carries a core text message or table such as a CAP message. In addition, EAC may include information related to the core text message. EAC has flag signals to indicate the presence of additional information and indicate which DP or DPs within the frame deliver additional information. The illustration shows one example of a frame with EAC and DPs that deliver additional information related to EAC.

EAC can carry a maximum 4 Kbytes of data including an emergency alert message within a frame. For more than 4

Kbytes, the emergency alert message can be carried through multiple frames. The content, syntax, and semantics for EAC can be specified by the Management Layer.

The present invention provides two-step wake-up signaling to collect EAS information through EAC. In the first step, the scrambled sequence of the preamble provides signaling when an emergency occurs. This time domain sequence can wake up a receiver quickly in an emergency situation. The preamble also carries a 1-bit flag (EAC_flag) in the preamble signaling data.

For the second step of wake-up, the system provides signaling information to decode EAC in the PLS2. The PLS2 carries three types of signaling information related to EAS,
1) EAC_flag: 1-bit
2) EAS_wake_up_version_num: 8-bits
3) EAC_length_byte: 12-bits EAC_flag has the same value as in the preamble. The EAS_wake_up_version_num can be used by the receiver to decide whether EAC is new and should be decoded. The field EAC_length_byte indicates the length of EAC in bytes.

Figure 33:
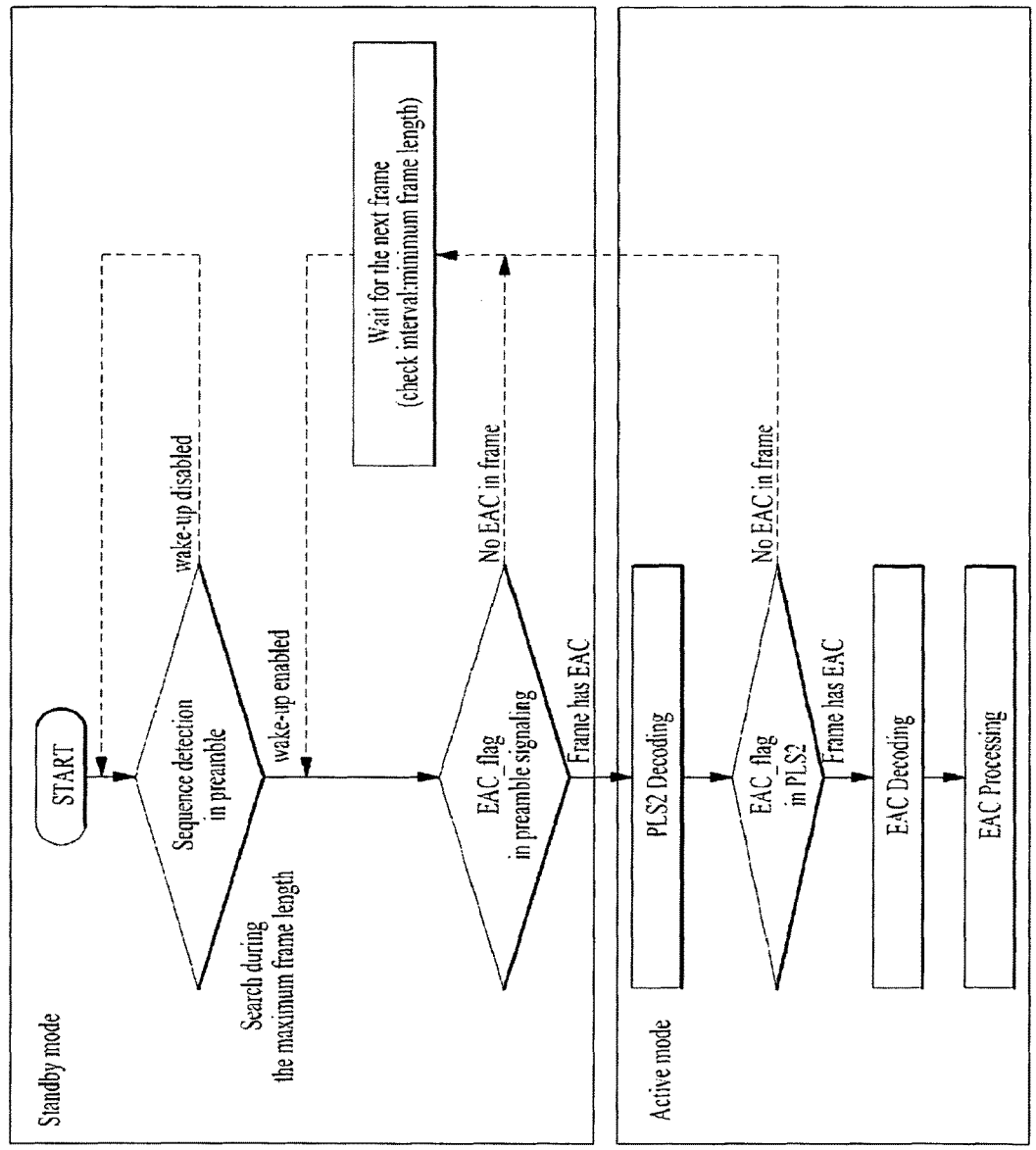
FIG. 33 illustrates frame structure with EAC according to an embodiment of the present invention.

FIG. 33 illustrates frame structure with EAC according to an embodiment of the present invention.

The present invention provides Frame-based scheduling for the fast access to an emergency alert message. The preamble provides a "wake_up_indicator" to indicate when a receiver should decide whether to wake up. The preamble also provides "EAC_flag" to indicate whether EAC is within the current frame. The wake_up_indicator is set according to the EAS message, and is determined independently for each broadcast channel.

The illustration shows one example of frame-based scheduling and timing diagram of two signals. When a receiver is in standby mode and is periodically checking for a wake-up indication, the receiver can receive and quickly decode the first incoming EAS data of the EAC with the pre-notification of the 'wake_up_indication' ahead of 'EAC_flag'.

'TW' in the illustration indicates the number of the frames by which the "wake-up_indicator" of the preamble is set to 'ON' before 'EAC_flag' is set to 'ON'. 'TW' is greater than or equal to zero.

The present invention provides an in-band signaling method. The 'EAC_flag' is also carried in the in-band signaling field. When an emergency alert occurs while decoding a particular service, it can be recognized using the in-band signaling.

Figure 34:
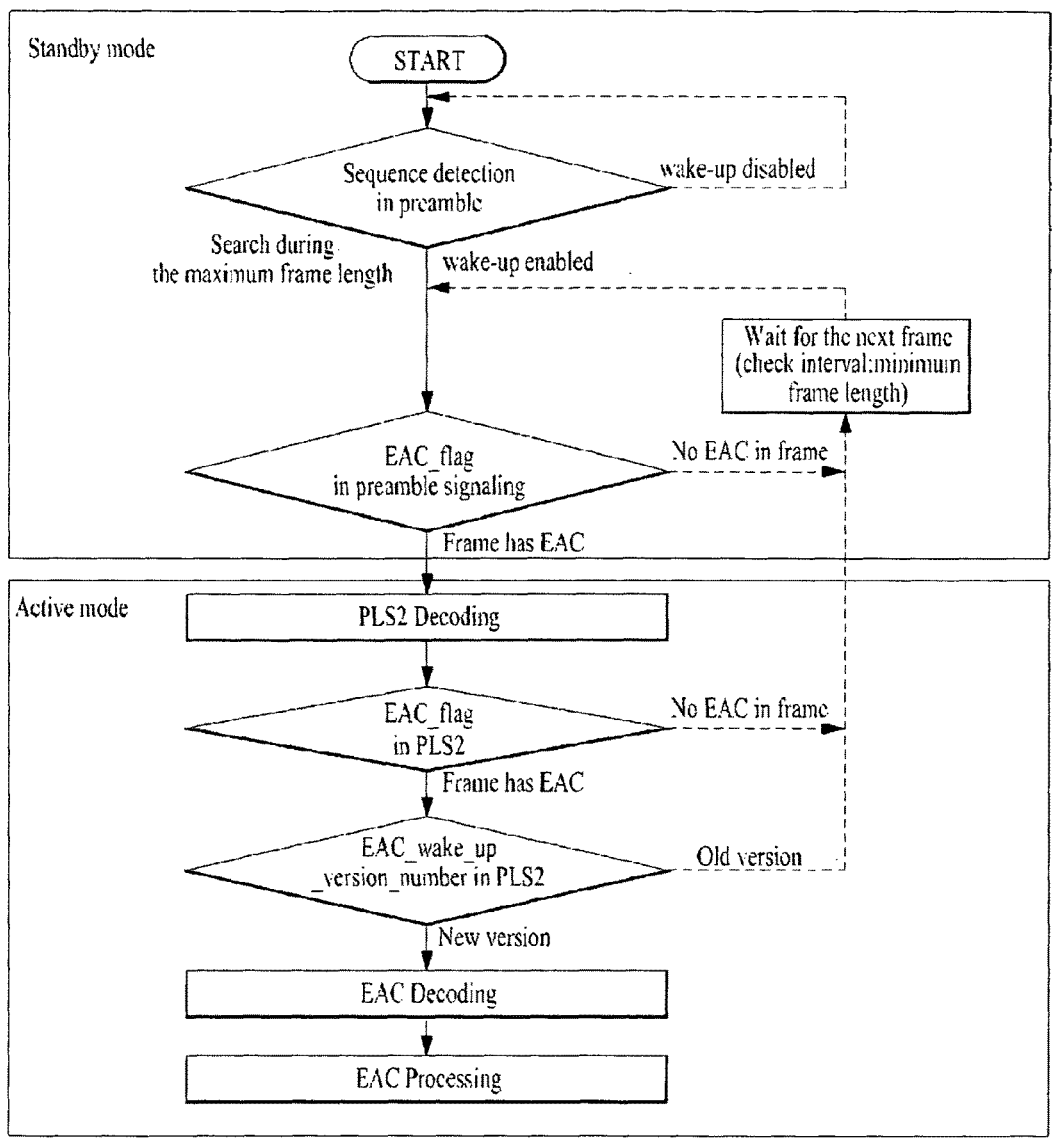
FIG. 34 illustrates receiver flow for responding to the wake-up indicator according to an embodiment of the present invention.

FIG. 34 illustrates receiver flow for responding to the wake-up indicator according to an embodiment of the present invention.

The illustration describes a mechanism by which receivers in a standby mode can react to a certain alert message via a wake-up function. Wake-up capable receivers are expected to monitor the signal from one of the broadcasters that have been noted to have sent emergency alert messages via EAC.

The illustration shows an example of receiver flow for responding to the wake-up indicator while minimizing power consumption.

A receiver in standby mode detect the EAS sequence in preamble. The receiver search for the sequence during the maximum frame length. If the sequence is not detected, the wake-up is disabled. If the sequence is detected, the wake-up is enabled.

If there is no EAC_flag in preamble signaling, EAC is not in the frame. In this case, the receiver wait for the next frame. The check interval equals to minimum frame length.

If there is a EAC_flag in preamble signaling, it means that the frame has EAC. In this case, the receiver goes into the Active mode.

The receiver in the active mode decodes the PLS2. If PLS2 has no EAC_flag, it means that frame has no EAC, so the receiver will wait for the next frame. If PLS2 has a EAC_flag, it means that frame has EAC. In latter case, the receiver will decode the EAC, and conduct EAS processing.

Figure 35:
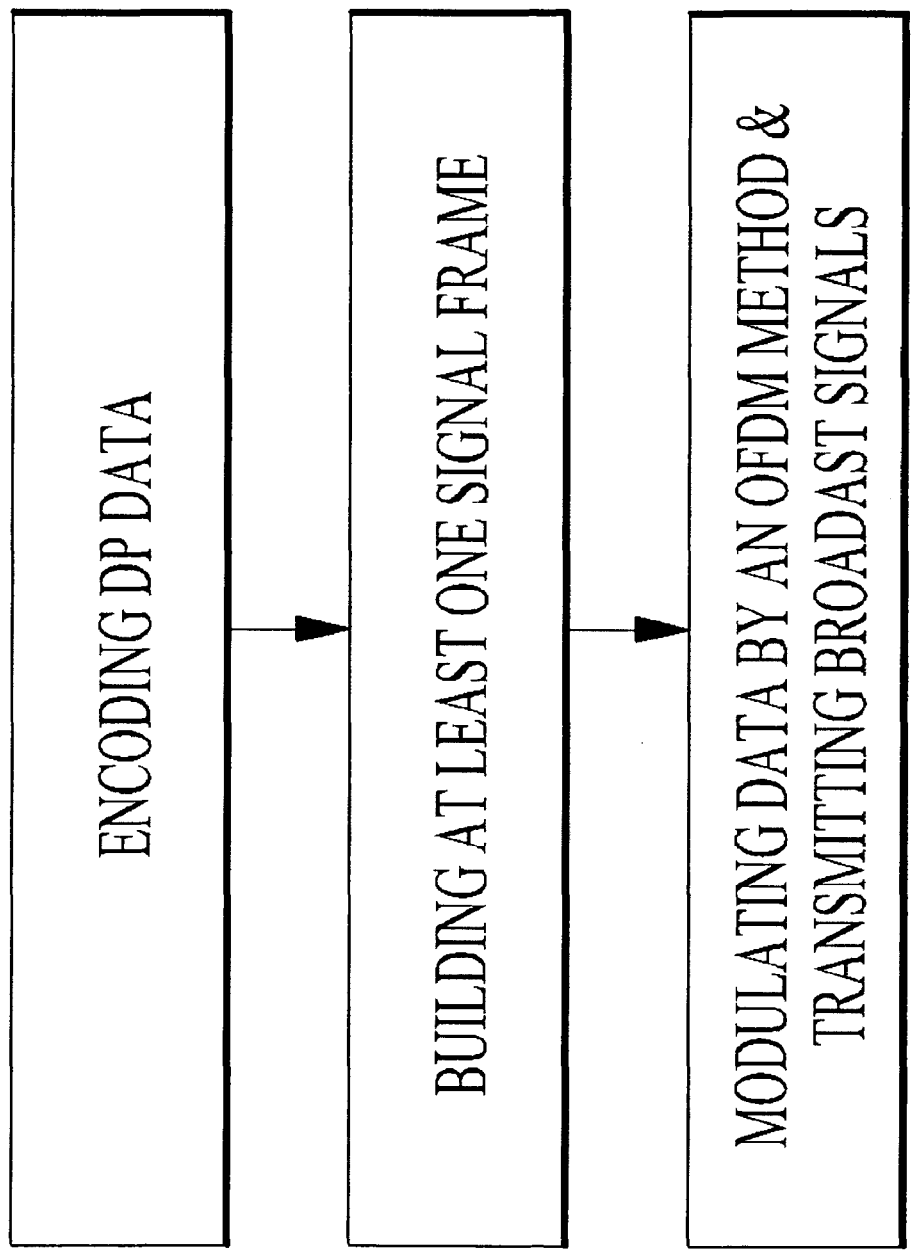
FIG. 35 illustrates receiver flow for wake-up versioning according to an embodiment of the present invention.

FIG. 35 illustrates receiver flow for wake-up versioning according to an embodiment of the present invention.

When a wake-up indication has been dismissed by the user, it can be possible for the receiver to ignore or obtain subsequent repeated transmission of the wake-up signal for the same emergency alert event. This can be done by checking the version number for the wake-up indication signal as described in the illustration.

The process is the same with the process of responding to the wake-up indicator, except that the receiver in active mode check version for the wake-up indication signal before decoding EAC.

The receiver check the EAS_wake_up_version_number in PLS2. If the wake-up signal is old version, the receiver will wait for the next frame. If the wake-up signal is new version, the receiver will decode the EAC.

Figure 36:
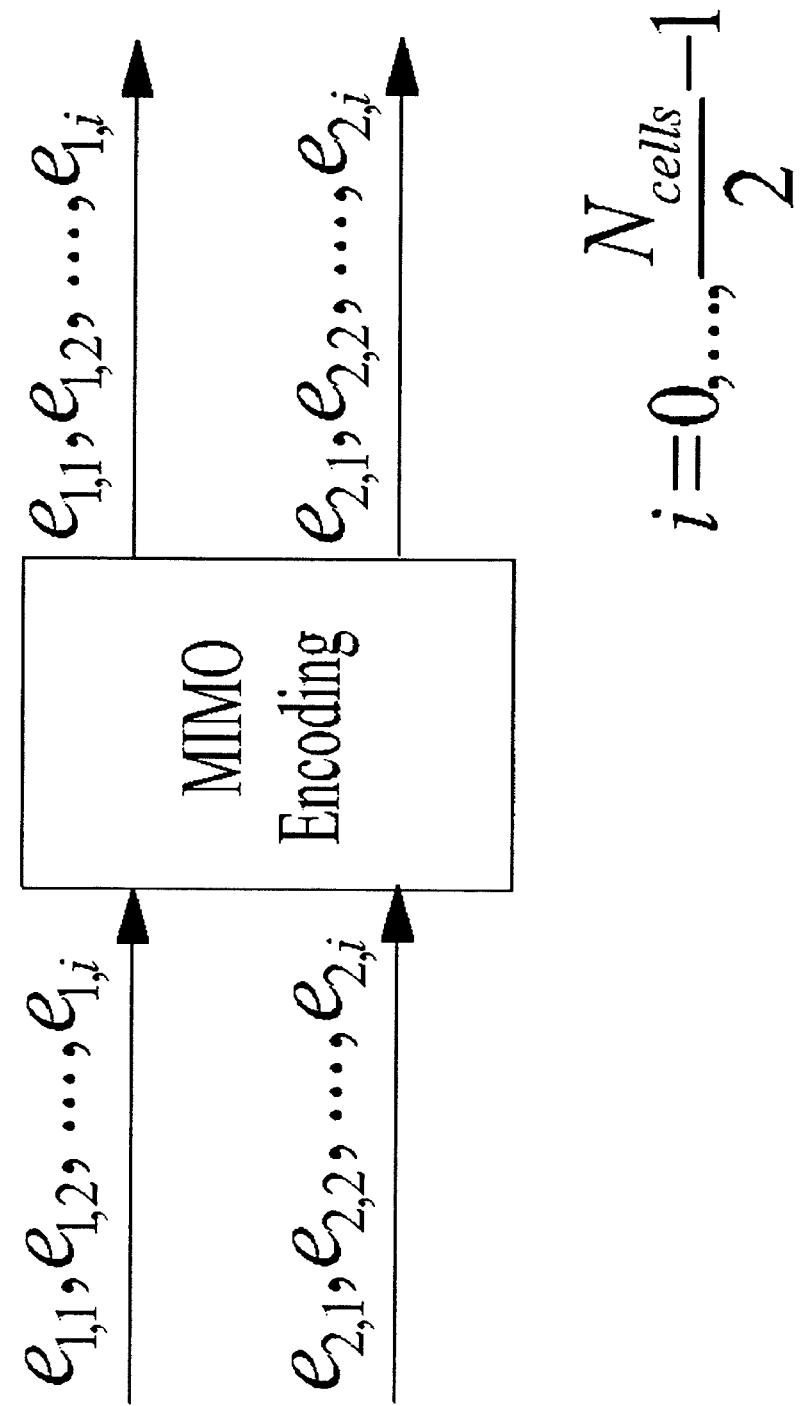
FIG. 36 illustrates a MIMO encoding block diagram according to an embodiment of the present invention.

FIG. 36 illustrates a MIMO encoding block diagram according to an embodiment of the present invention.

The MIMO encoding scheme according to an embodiment of the present invention is optimized for broadcasting signal transmission. The MIMO technology is a promising way to get a capacity increase but it depends on channel characteristics. Especially for broadcasting, the strong LOS component of the channel or a difference in the received signal power between two antennas caused by different signal propagation characteristics can make it difficult to get capacity gain from MIMO. The MIMO encoding scheme according to an embodiment of the present invention overcomes this problem using a rotation-based pre-coding and phase randomization of one of the MIMO output signals.

MIMO encoding can be intended for a 2×2 MIMO system requiring at least two antennas at both the transmitter and the receiver. Two MIMO encoding modes are defined in the present invention; full-rate spatial multiplexing (FR-SM) and full-rate full-diversity spatial multiplexing (FRFD-SM). The FR-SM encoding provides capacity increase with relatively small complexity increase at the receiver side while the FRFD-SM encoding provides capacity increase and additional diversity gain with a relatively great complexity increase at the receiver side. These two MIMO encoding schemes have no restriction on the antenna polarity configuration.

MIMO processing can be required for the advanced profile frame, which means all DPs in the advanced profile frame are processed by the MIMO encoder. MIMO processing can be applied at DP level. Pairs of the Constellation Mapper outputs NUQ (e1,i and e2,i) can be fed to the input of the MIMO Encoder. Paired MIMO Encoder output (g1,i and g2,i) can be transmitted by the same carrier k and OFDM symbol l of their respective TX antennas.

The illustrated diagram shows the MIMO Encoding block, where i is the index of the cell pair of the same XFECBLOCK and Ncells is the number of cells per one XFECBLOCK.

The full-rate SM (FR-SM) encoding process can include two steps. The first step can be multiplying the rotation matrix with the pair of the input symbols for the two TX antenna paths, and the second step can be applying complex phase rotation to the symbols for TX antenna 2. The FR-SM encoding operation is expressed in equations as follows:

$$\begin{bmatrix} g_{1,i} \\ g_{2,i} \end{bmatrix} = \frac{1}{\sqrt{1+a^2}} \begin{bmatrix} 1 & 0 \\ 0 & e^{j\phi(i)} \end{bmatrix} \begin{bmatrix} 1 & a \\ a & -1 \end{bmatrix} \begin{bmatrix} e_{1,i} \\ e_{2,i} \end{bmatrix},$$ [Math figure 12]

$$\phi(i) = \frac{2\pi}{N}i, (N=9), i=0, \ldots, \frac{N_{cells}}{2}-1$$

The full-rate and full-diversity SM (FRFD-SM) encoding process can take two pairs of NUQ symbols as input to provide two pairs of MIMO output symbols. The FRFD-SM encoding operation is expressed in equations as follows:

$$\begin{bmatrix} g_{1,2i} & g_{1,2i+1} \\ g_{2,2i} & g_{2,2i+1} \end{bmatrix} = \frac{1}{\sqrt{1+a^2}} \begin{bmatrix} 1 & 0 \\ 0 & e^{j\phi(i)} \end{bmatrix}$$ [Math figure 13]

$$\begin{bmatrix} e_{1,2i} + ae_{2,2i} & ae_{1,2i+1} - e_{2,2i+1} \\ e_{1,2i+1} + ae_{2,2i+1} & ae_{1,2i} - e_{2,2i} \end{bmatrix},$$

$$\phi(i) = \frac{2\pi}{N}i, (N=9), i=0, \ldots, \frac{N_{cells}}{4}-1$$

FIG. 37 illustrates MIMO parameter table according to an embodiment of the present invention.

The FR-SM encoding process can be applied for 8 bpcu and 12 bpcu with 16K and 64K FECBLOCK. FR-SM encoding can use the parameters defined in the illustrated MIMO parameter table for each combination of a value of bits per channel use and code rate of an FECBLOCK. Detailed constellations corresponding to the illustrated MIMO parameter table are described above.

The FRFD-SM encoding process can use the FR-SM parameters defined in the illustrated MIMO parameter table for each combination of a value of bit per channel use and code rate of an FECBLOCK. Detailed constellations corresponding to the illustrated MIMO parameter table are described above.

FIG. 38 illustrates MIMO parameter table according to other embodiment of the present invention.

For the 10 bpcu MIMO case, FR-SM encoding can use the parameters defined in the illustrated MIMO parameter table. These parameters are especially useful when there is a power imbalance between horizontal and vertical transmission (e.g. 6 dB in current U.S. Elliptical pole network). The QAM-16 can be used for the TX antenna of which the transmission power is deliberately attenuated.

The FRFD-SM encoding process can use the FR-SM parameters defined in the illustrated MIMO parameter table for each combination of a value of bit per channel use and code rate of an FECBLOCK. Detailed constellations corresponding to the illustrated MIMO parameter table are described above.

Figure 39:
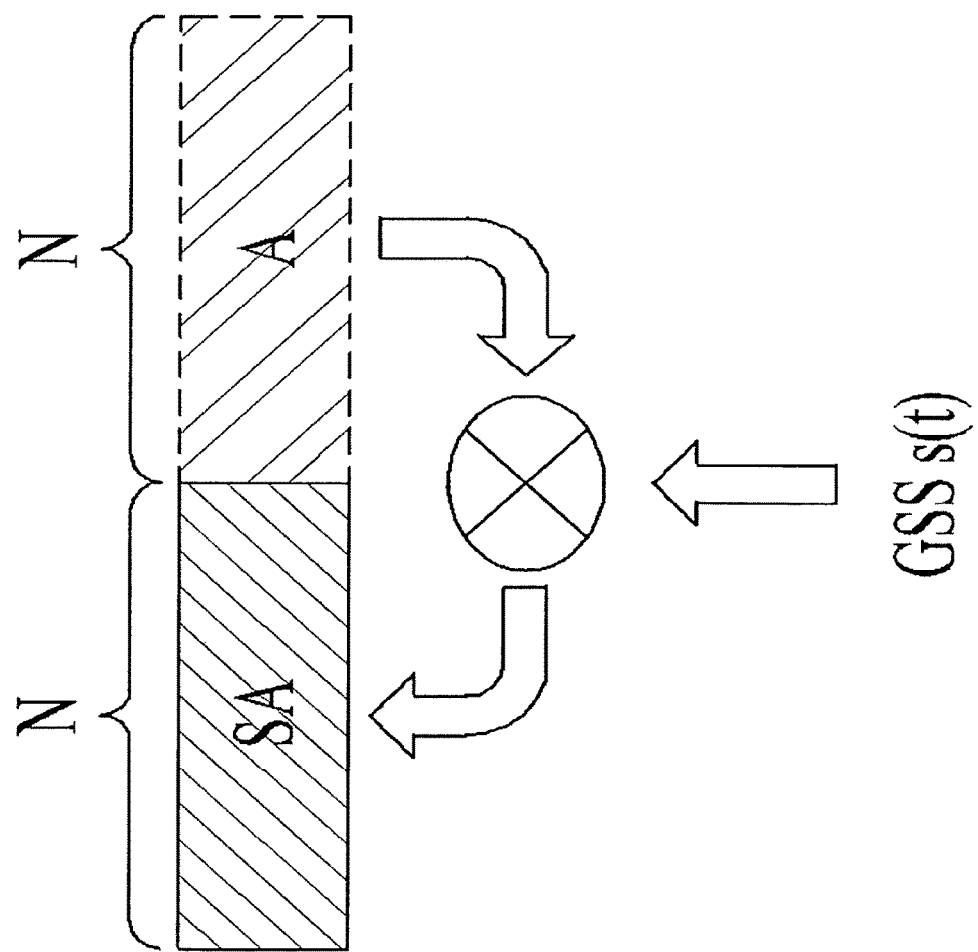
FIG. 39 illustrates time-domain structure of the normal preamble according to an embodiment of the present invention.

FIG. 39 illustrates time-domain structure of the normal preamble according to an embodiment of the present invention.

The present invention uses the preamble symbol for many purposes. Four main purposes are as follows.
1) System signal discovery
2) Transmission of basic system parameters
3) Initial acquisition of synchronization offset in the receiver
4) Signaling of Emergency Alert System events There are two types of preamble having different level of robustness—a normal and a robust preamble. The normal preamble can be used in both the base profile and the advanced profile. The robust preamble can be used in the handheld profile.

The normal preamble includes the OFDM symbol A of length N=1024, for example, and the scrambled version SA of the symbol A for the guard interval.

Figure 40:
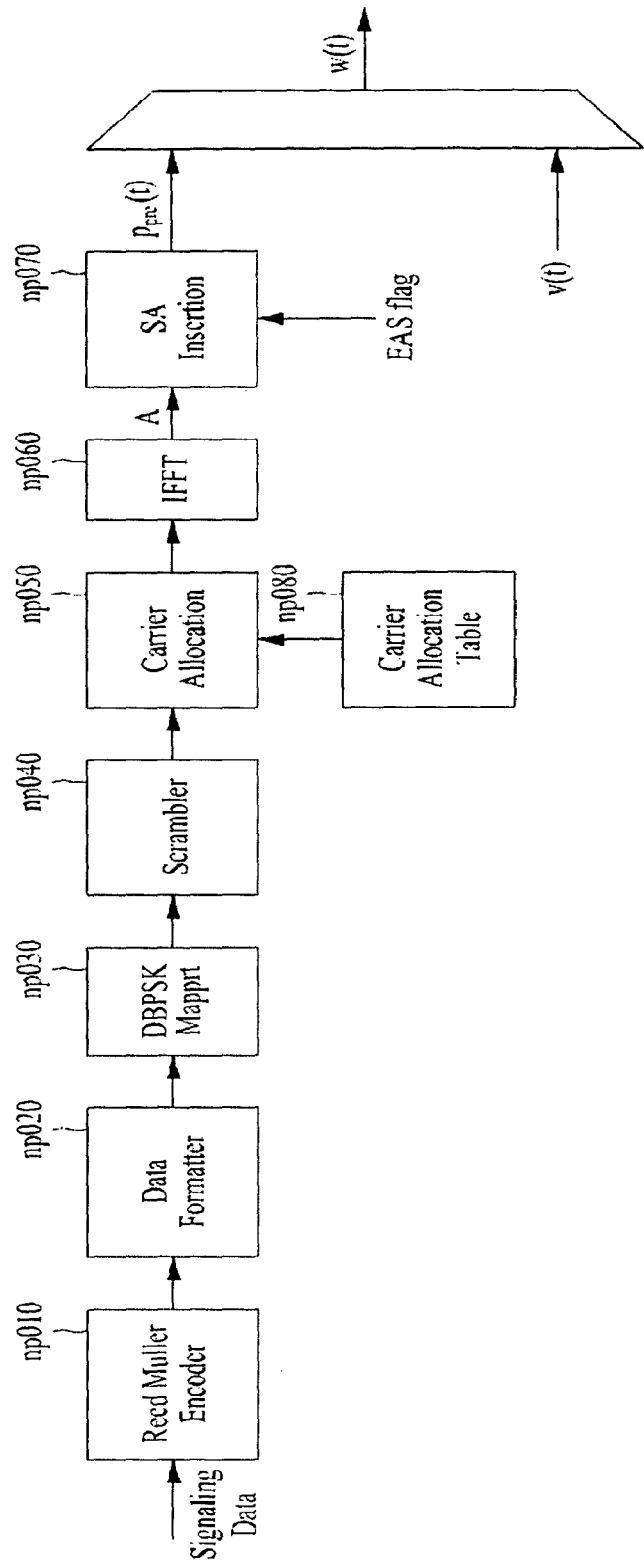
FIG. 40 illustrates block diagram of the normal preamble symbol insertion according to an embodiment of the present invention.

FIG. 40 illustrates block diagram of the normal preamble symbol insertion according to an embodiment of the present invention.

The generation process of the normal preamble is shown in the illustrated block diagram. The block diagram of the normal preamble symbol insertion includes Reed Muller Encoder(np010), Data Formatter(np020), DBPSK Mapper (np030), Scrambler(np040), Carrier Allocation(np050), IFFT(np060), SA Insertion(np070) and/or Carrier Allocation Table(np080).

The preamble data can be composed of 3 signaling fields, namely S1, S2 and S3. Each signaling field can includes 7 signaling bits, and the preamble carries 21 signaling bits in total.

Each signaling field is encoded with a first-order Reed Muller (64, 7) code. The Reed Muller generator matrix G is of dimension (7×64), which can be divided into 8 sub-matrixes ($G_1 \sim G_8$) of size (7×8). The Reed Muller generator matrix G can be expressed as follows.

$$G = [G_1 G_2 G_3 G_4 G_5 G_6 G_7 G_8]$$ [Math figure 14]

Each field $S_i$ (i=0, 1, 2) is encoded into Reed Muller codeword $C_i$ (i=0, 1, 2) as follows.

$$C_i = m_i \times G = \{C_{i,0}, C_{i,1}, \ldots, C_{i,63}\}$$ [Math figure 15]

The $m_i$ is the 7-bit signaling bit vector representing the field $S_i$.

The data formatter(np020) repeats and uniformly shuffles each Reed Muller codeword to generate the resulting modulation sequence MS. The MS can be expressed as follows.

$$MS = \{MS_0, MS_1, MS_2, \ldots MS_{383}\}$$ [Math figure 16]

$$= \{C_{1,0}, C_{2,0}, C_{3,0}, C_{1,1}, C_{2,1}, C_{3,1}, \ldots, C_{1,63}, C_{2,63},$$

$$C_{3,63}, C_{1,0}, C_{2,0}, C_{3,0}, C_{1,1}, C_{2,1}, C_{3,1}, \ldots, C_{1,63},$$

$$C_{2,63}, C_{3,63}\}$$

The shuffling enables each codeword to get maximum frequency diversity.

After shuffling, the modulation sequence is modulated by differential BPSK:

$$MS\_DIFF = DBPSK(MS)$$ [Math figure 17]

The following rule applies to the differential modulation of the element $MS_i$:

$$MS\_DIFF_i = \begin{cases} MS\_DIFF_{i-1} & \text{if } MS_i = 0 \\ -MS\_DIFF_{i-1} & \text{if } MS_i = 1 \end{cases}$$ [Math figure 18]

$(i = 0 \sim 383)$ where $MS\_DIFF_{-1} = 1$ by definition.

The differential modulation enables the non-coherent detection of the signaling fields so that the channel estimation is not necessary at the receiver side.

The sequence MS_DIFF is scrambled by a signaling scrambler sequence (SSS).

$$MS\_SCR\_A = SCRAMBLING \quad \text{[Math figure 19]}$$

The scrambled modulation sequence, MS_SCR_A, is allocated to the active carriers of the normal preamble symbol. The allocation can be made by using the carrier allocation table.

To match the power of the preamble symbol to the power of a data symbol, the boosting applied to the active carriers of the preamble is the amplitude ratio of certain value. The value of the amplitude ratio can be as follows.

$$\sqrt{(6785/(384*8))} \text{ or } 3.44 \text{ dB} \quad \text{[Math figure 20]}$$

The data OFDM symbol A of the normal preamble is generated by modulating each carrier according to the following expression:

$$p_A(t) = \frac{1}{\sqrt{384}} \sum_{i=0}^{383} MS\_SCR\_A_i \times e^{j2\pi \frac{k_p(i)-512}{1024T} i} \quad \text{[Math figure 21]}$$

where $k_p(i)$ for i=0, 1, ..., 383 are the indices of the 384 active carriers, in an increasing order. $MS\_SCR\_A_i$ for i=0, 1, ..., 383 are the modulation values for the active carriers, and T is the elementary time period.

For the reliable detection of the preamble, the data OFDM symbol $p_A(t)$ is copied to the guard interval position and scrambled with the guard interval scrambler sequence (GSS) gss(t):

$$p_{SA}(t) = p_A(t) * gss(t) \quad \text{[Math figure 22]}$$

The sequence gss(t) is defined as follows:

$$gss(t) = s_{EAS}(t) \text{ if EAS event} \quad \text{[Math figure 23]}$$

The sequence $s_{Normal}(t)$ is defined as below.

$$s_{Normal}(t) = s_{Normal\_I}(t) + j s_{Normal\_Q}(t), \text{ where } j = \sqrt{-1} \quad \text{[Math figure 24]}$$

$$s_{Normal\_I}(t) = \begin{cases} 1/\sqrt{2} & t = 0 \sim 20T \\ -1/\sqrt{2} & t = 21T \sim 60T \\ 1/\sqrt{2} & t = 61T \sim 116T \\ -1/\sqrt{2} & t = 117T \sim 188T \\ 1/\sqrt{2} & t = 189T \sim 292T \\ -1/\sqrt{2} & t = 293T \sim 428T \\ 1/\sqrt{2} & t = 429T \sim 628T \\ -1/\sqrt{2} & t = 629T \sim 892T \\ 1/\sqrt{2} & t = 893T \sim 1023T \end{cases} \quad \text{[Math figure 25]}$$

$$s_{Normal\_Q}(t) = \begin{cases} 1/\sqrt{2} & t = 0 \sim 40T \\ -1/\sqrt{2} & t = 41T \sim 79T \\ 1/\sqrt{2} & t = 80T \sim 152T \\ -1/\sqrt{2} & t = 153T \sim 223T \\ 1/\sqrt{2} & t = 224T \sim 360T \\ -1/\sqrt{2} & t = 361T \sim 495T \\ 1/\sqrt{2} & t = 496T \sim 760T \\ -1/\sqrt{2} & t = 761T \sim 1023T \end{cases} \quad \text{[Math figure 26]}$$

The sequence $s_{EAS}(t)$ is defined as follows.

$$s_{EAS}(t) = s_{EAS\_I}(t) + j s_{EAS\_Q}(t), \text{ where } j = \sqrt{-1} \quad \text{[Math figure 27]}$$

$$s_{EAS\_I}(t) = \begin{cases} 1/\sqrt{2} & t = 0 \sim 20T \\ -1/\sqrt{2} & t = 21T \sim 60T \\ 1/\sqrt{2} & t = 61T \sim 116T \\ -1/\sqrt{2} & t = 117T \sim 188T \\ 1/\sqrt{2} & t = 189T \sim 292T \\ -1/\sqrt{2} & t = 293T \sim 428T \\ 1/\sqrt{2} & t = 429T \sim 511T \\ -1/\sqrt{2} & t = 512T \sim 628T \\ 1/\sqrt{2} & t = 629T \sim 892T \\ -1/\sqrt{2} & t = 893T \sim 1023T \end{cases} \quad \text{[Math figure 28]}$$

$$s_{EAS\_Q}(t) = \begin{cases} 1/\sqrt{2} & t = 0 \sim 40T \\ -1/\sqrt{2} & t = 41T \sim 79T \\ 1/\sqrt{2} & t = 80T \sim 152T \\ -1/\sqrt{2} & t = 153T \sim 223T \\ 1/\sqrt{2} & t = 224T \sim 360T \\ -1/\sqrt{2} & t = 361T \sim 495T \\ 1/\sqrt{2} & t = 496T \sim 511T \\ -1/\sqrt{2} & t = 512T \sim 760T \\ 1/\sqrt{2} & t = 761T \sim 1023T \end{cases} \quad \text{[Math figure 29]}$$

The time-domain baseband waveform $p_{pre}(t)$ of the normal preamble symbol is therefore defined as follows:

$$p_{pre}(t) = \begin{cases} p_{SA}(t) & 0 \le t < 1024T \\ p_A(t) & 1024T \le t < 2048T \\ 0 & \text{otherwise} \end{cases} \quad \text{[Math figure 30]}$$

$p_{pre}(t)$ is multiplexed with the input v(t) of the preamble insertion block to produce the final output w(t) as shown in the illustration.

FIG. 41 illustrates sub-matrixes of Reed Muller generator matrix G according to an embodiment of the present invention.

The Reed Muller generator matrix G is of dimension (7×64), which can be divided into 8 sub-matrixes ($G_1$~$G_8$) of size (7×8). The illustration describes embodiments of each sub-matrixes.

Figure 42:
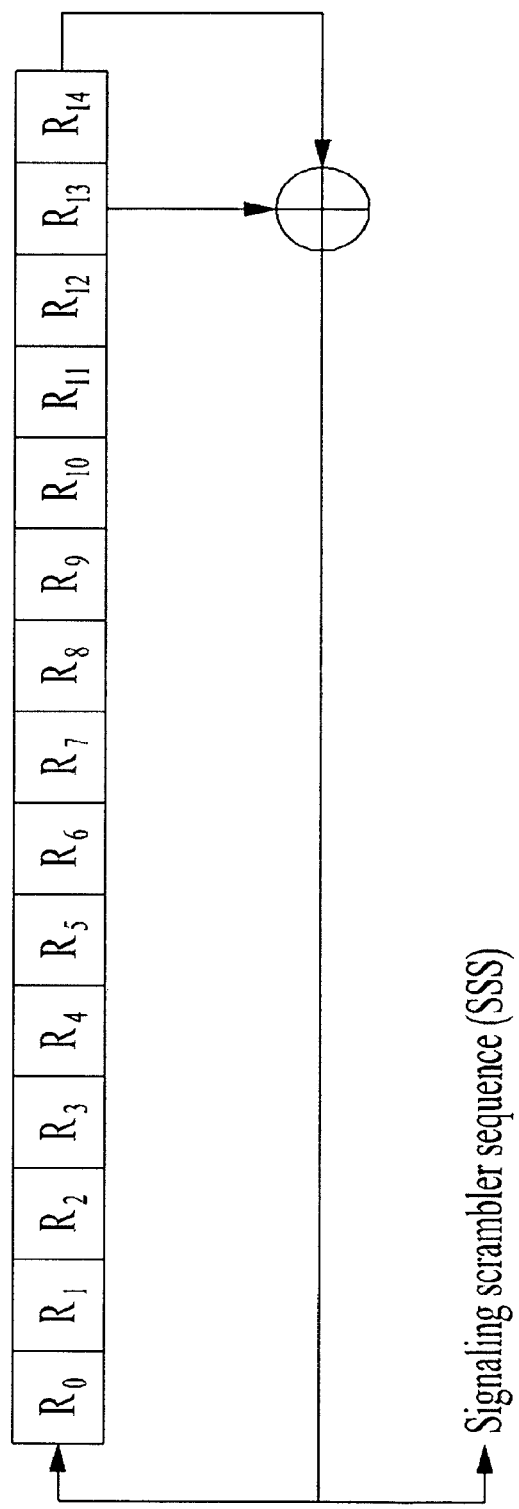
FIG. 42 illustrates a Signaling Scrambler Sequence (SSS) generator according to an embodiment of the present invention.

FIG. 42 illustrates a Signaling Scrambler Sequence (SSS) generator according to an embodiment of the present invention.

As described above, the sequence MS_DIFF is scrambled by a signaling scrambler sequence (SSS).

The generator polynomial of the sequence SSS is as follows.

$$1 + X^{14} + X^{15} \quad \text{[Math figure 31]}$$

For the normal preamble, the initial value of the shift register can be set to ($R_{14}$ $R_{13}$ $R_{12}$ $R_{11}$ $R_{10}$ $R_9$ $R_8$ $R_7$ $R_6$ $R_5$ $R_4$ $R_3$ $R_2$ $R_1$ $R_0$)=(101110110110000). The shift register is re-initialized at every preamble symbol. The initial value is optimized to minimize PAPR of the preamble symbol.

Before scrambling, each bit of the sequence SSS having value '0' is converted into '+1' and each bit having value '1' is converted into '−1':

$$MS\_SCR\_A_i = MS\_DIFF_i \times 2(\tfrac{1}{2} - SSS\_A_i) \quad \text{[Math figure 32]}$$

where $SSS\_A_i$ is the $i^{th}$ element of the SSS_A and $MS\_SCR\_A_i$ is the $i^{th}$ element of the scrambled modulation sequence MS_SCR_A, which is allocated to the active carriers of the normal preamble symbol.

FIG. 43 illustrates distribution of the active carriers according to an embodiment of the present invention.

In the preamble symbol, there are 384 active carriers. Locations of the active carriers in the preamble, kp(0)~kp(383), are listed in the illustration. There are 1024 carriers including active carriers and unused carriers in the preamble symbol(0~1023). Each number in the illustration represents location where the active carriers are distributed in the preamble symbol.

Figure 44:
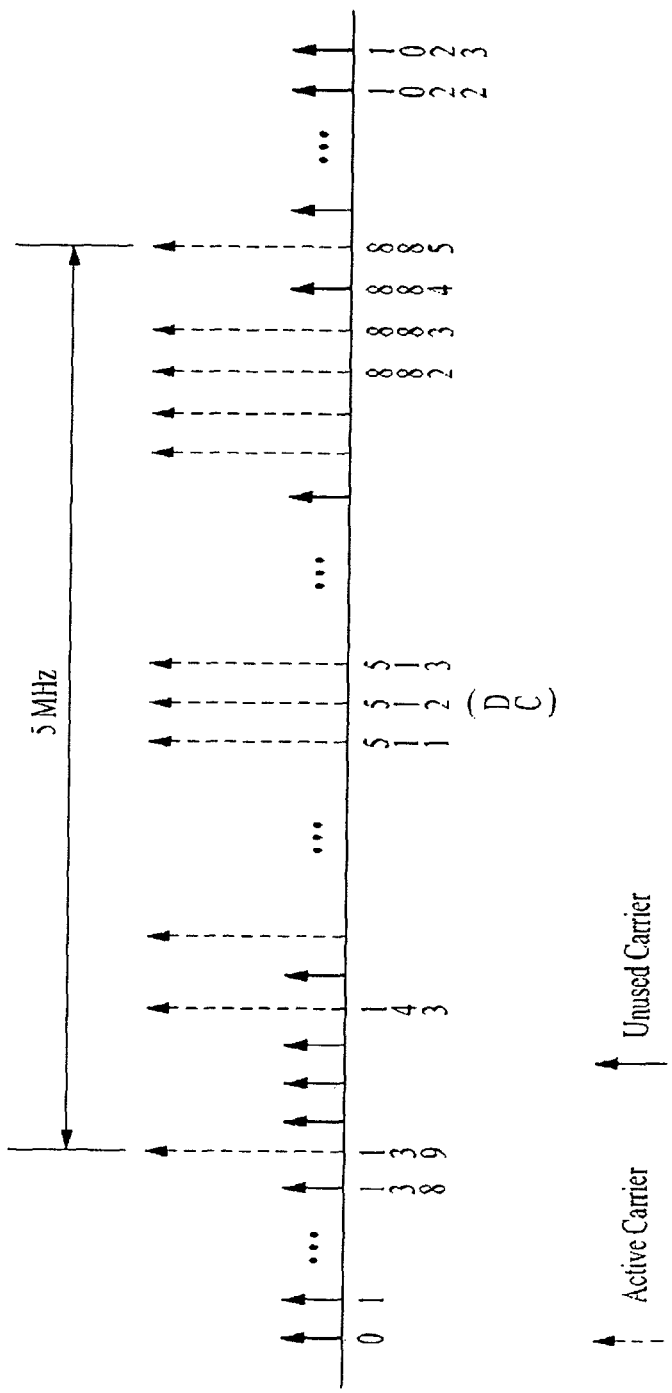
FIG. 44 illustrates location of the active carriers according to an embodiment of the present invention.

FIG. 44 illustrates location of the active carriers according to an embodiment of the present invention.

The illustration shows the active carriers, black arrows, and the unused carriers, gray arrows. In this embodiment, first active carrier is located in $140^{th}$ carrier (139), and last active carrier is located in $886^{th}$ carrier (885). The occupied bandwidth of the preamble symbol is 5 MHz as depicted in the illustration.

The randomly distributed active carriers enable the receiver to estimate the integral carrier frequency offset. The guard band at both spectrum ends ensures the preamble is undistorted even with the existence of a carrier frequency offset up to +/−500 kHz.

Figure 45:
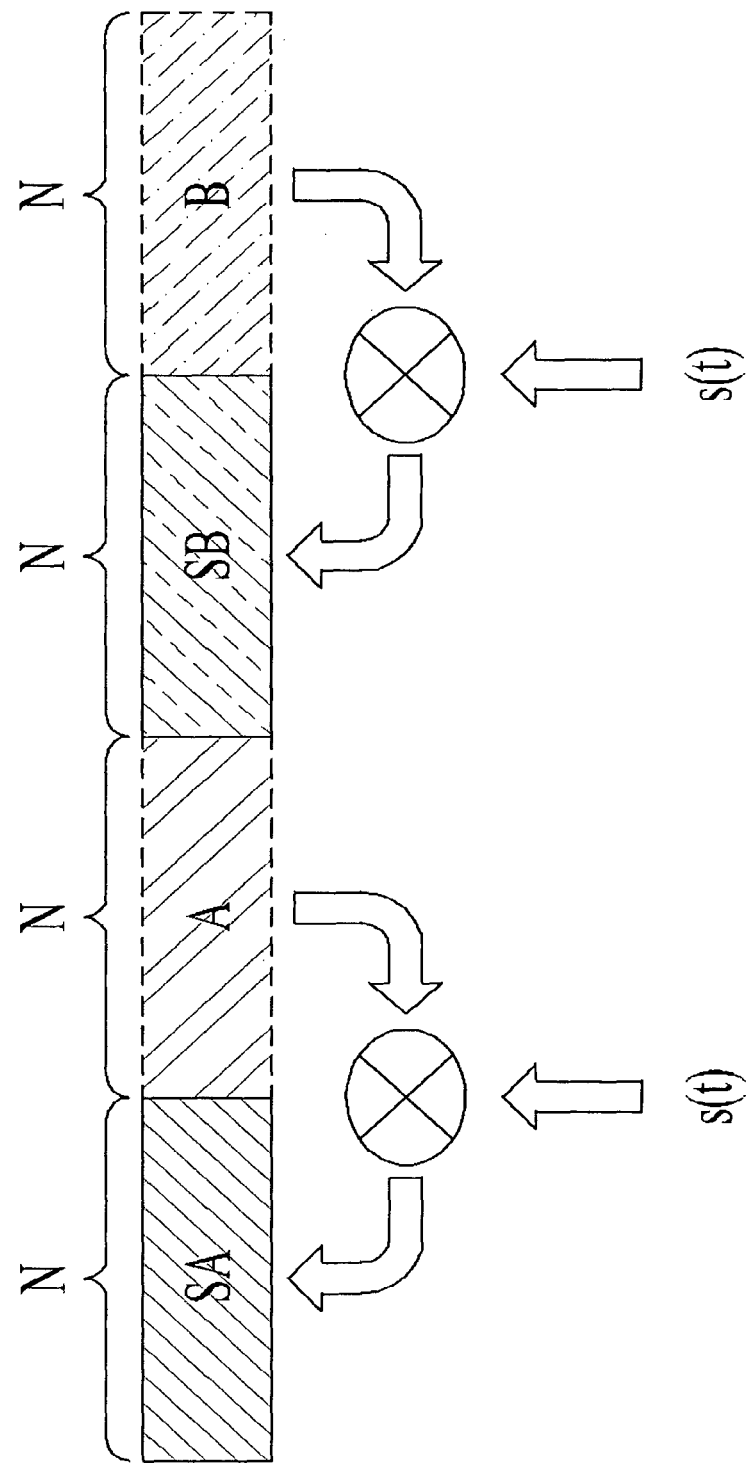
FIG. 45 illustrates time-domain structure of the robust preamble according to an embodiment of the present invention.

FIG. 45 illustrates time-domain structure of the robust preamble according to an embodiment of the present invention.

The robust preamble is designed to detect and decode the preamble symbol under harsh channel conditions like mobile reception. The robust preamble is a kind of repetition of the normal preamble, and carries the same signaling fields S1, S2 and S3 with a different signaling scrambler sequence (SSS).

The first half of the robust preamble is exactly the same as the normal preamble. The second half of the robust preamble is a simple variation of the normal preamble where the difference arises from the sequence SSS applied in the frequency domain. The doubled length of the robust preamble improves the detection performance in the time domain, and the repetition of the signaling fields improves the decoding performance for the preamble signaling data.

Figure 46:
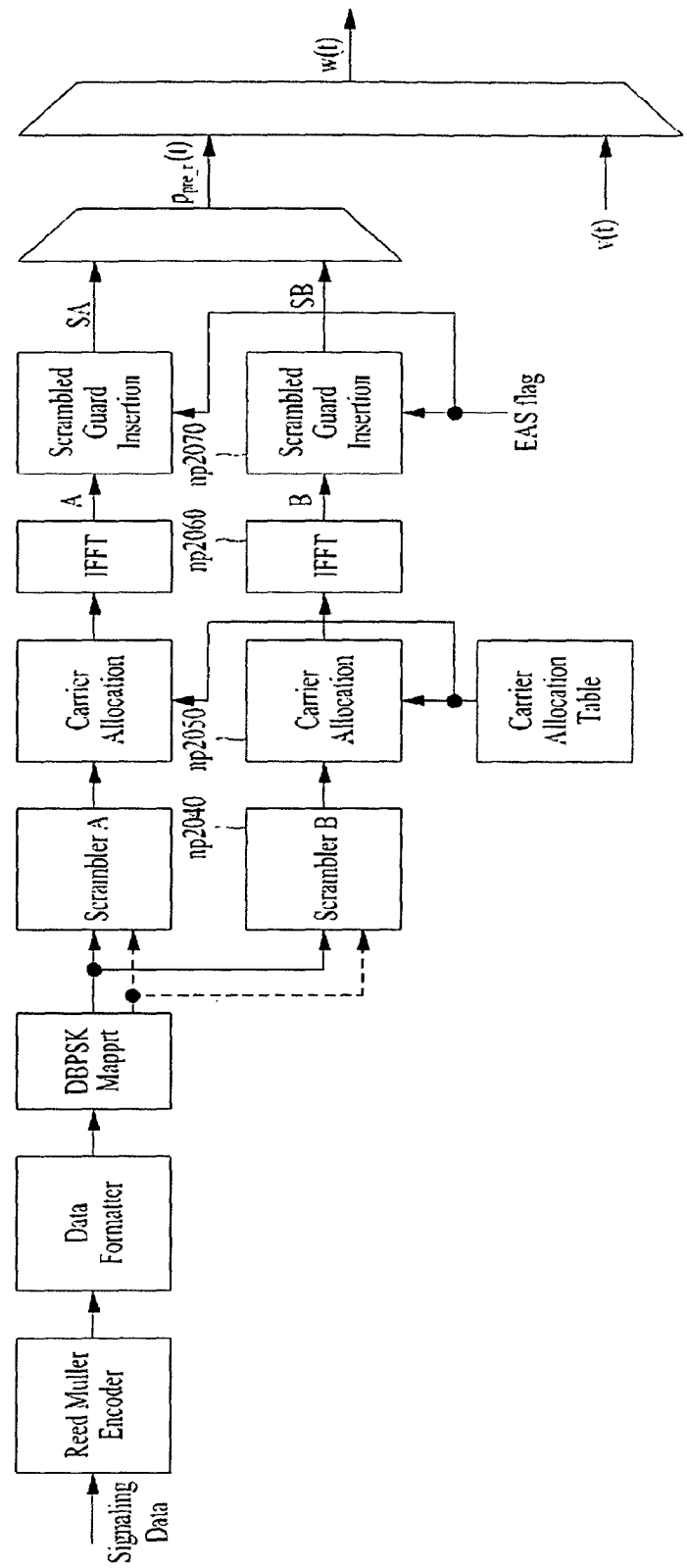
FIG. 46 illustrates block diagram of the robust preamble symbol insertion according to an embodiment of the present invention.

FIG. 46 illustrates block diagram of the robust preamble symbol insertion according to an embodiment of the present invention.

The generation process of the robust preamble symbol is shown in the illustration. The detailed functional steps are described below.

The robust preamble generation differs from the normal preamble by applying the sequence SSS in the frequency domain as described above. Consequently, the Reed Muller encoder, the data formatter and the DBPSK mapper blocks in the illustration are shared with the normal preamble generation.

In the illustration, the non-shaded blocks are exactly the same as those in the block diagram of the normal preamble symbol insertion. Scrambler B(np2040), Carrier Allocation (np2050), IFFT(np2060) and/or Scrambled Guard Insertion (np2070) are added to the block diagram.

For the symbol B, the initial value of the shift register is set by $(R_{14}\ R_{13}\ R_{12}\ R_{11}\ R_{10}\ R_9\ R_8\ R_7\ R_6\ R_5\ R_4\ R_3\ R_2\ R_1\ R_0) = (100001000111000)$ to generate the sequence SSS_B. The scrambled modulation of the symbol B is given by:

$$MS\_SCR\_B = SCRAMBLING_B \quad \text{[Math figure 33]}$$

$$MS\_SCR\_B_i = MS\_DIFF_i \times 2(\tfrac{1}{2} - SSS\_B_i) \quad \text{[Math figure 34]}$$

The sequence MS_SCR_B is applied to the active carriers of the symbol B.

The distribution of the active carriers of symbol B is the same as that of symbol A of the normal preamble.

The symbol B is generated by modulating each carrier according to the following expression:

$$p_B(t) = \frac{1}{\sqrt{384}} \sum_{i=0}^{383} MS\_SCR\_B_i \times e^{j2\pi \frac{k_p(i)-512}{1024T} t} \quad \text{[Math figure 35]}$$

where $MS\_SCR\_B_i$ for $i=0, 1, \ldots, 383$ are the modulation values for the active carriers.

The signal $p_{SB}(t)$ of part SB is given by scrambling $p_B(t)$ with the sequence gss(t), which is same as that used in the normal preamble:

$$p_{SB}(t) = p_B(t) * gss(t) \quad \text{[Math figure 36]}$$

The time-domain baseband waveform $p_{pre\_r}(t)$ of the robust preamble symbol is therefore defined as follows:

$$P_{pre\_r}(t) = \begin{cases} p_{SA}(t) & 0 \le t < 1024T \\ p_A(t) & 1024T \le t < 2048T \\ p_{SB}(t) & 2048T \le t < 3072T \\ p_B(t) & 3072T \le t < 4096T \\ 0 & \text{otherwise} \end{cases} \quad \text{[Math figure 37]}$$

$P_{pre\_r}(t)$ is multiplexed with the input v(t) of the preamble insertion block, to produce the final output w(t) as shown in the illustration.

Figure 47:
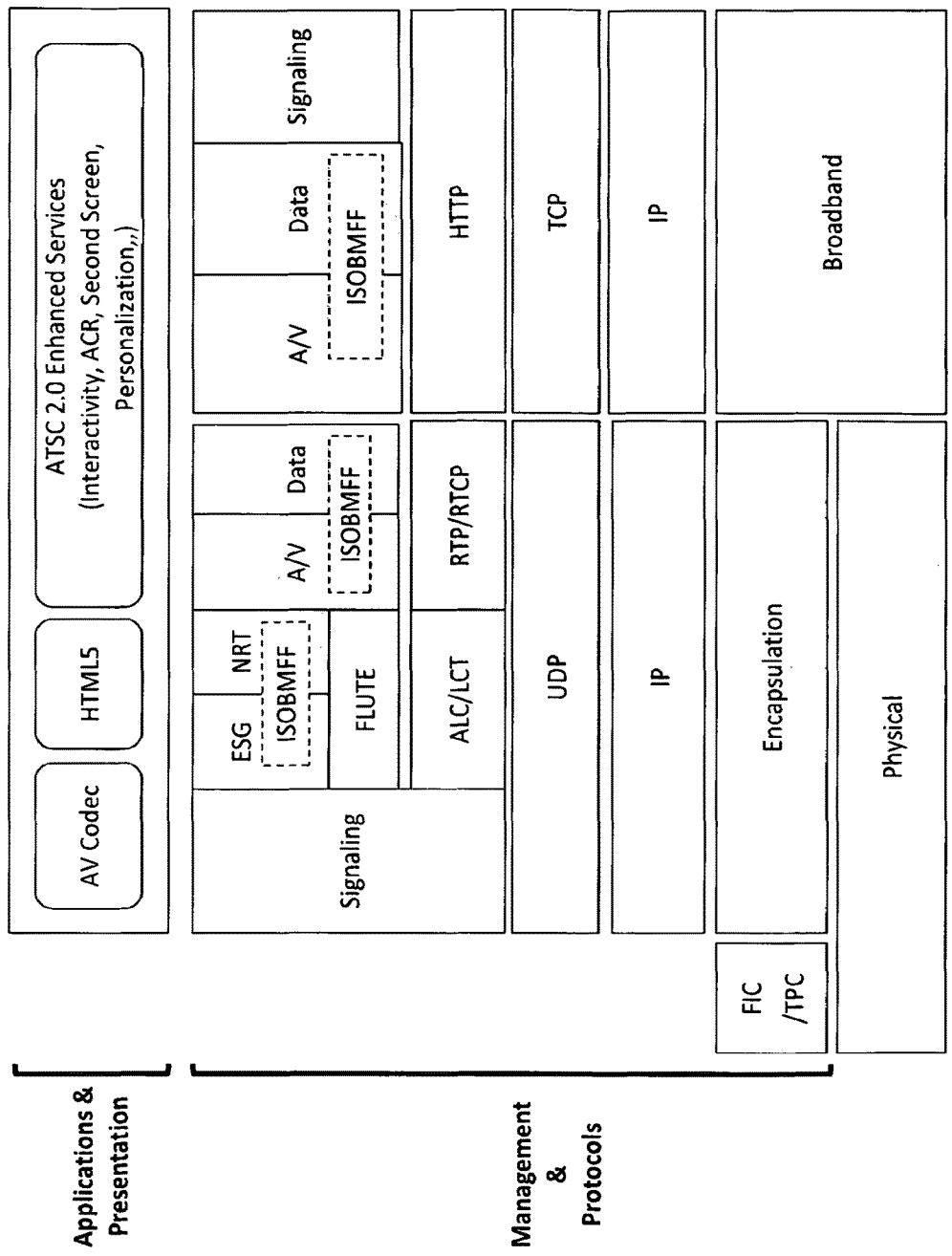
FIG. 47 is a view illustrating a protocol stack of a broadcast system according to an embodiment of the present invention.

FIG. 47 is a view illustrating a protocol stack of a broadcast system according to an embodiment of the present invention.

The broadcast system according to the present invention may correspond to a hybrid broadcast system in which an Internet Protocol (IP) centric broadcast network and a broadband are combined.

The broadcast system according to the present invention may be designed to maintain compatibility with the conventional MPEG-2 based broadcast system.

The broadcast system according to the present invention may correspond to a hybrid broadcast system based on a combination of an IP centric broadcast network, a broadband network and/or a mobile communication network or a cellular network.

Referring to FIG. 47, a physical layer can use a physical protocol employed in a broadcast system such as an Advanced Television Systems Committee (ATSC) system and/or a Digital Video Broadcasting (DVB) system.

An encapsulation layer acquires IP datagrams from information acquired from the physical layer, or converts the acquired IP datagrams into a specific frame (e.g., RS Frame, GSE-lite, GSE or signal frame). Here, the frame may include a set of IP datagrams.

A transmission parameter channel (TPC) is a transmission parameter for delivering mapping information between the physical layer and the IP datagrams or the frame.

A fast information channel (FIC) includes information for allowing access to service and/or contents (e.g., mapping information between a service ID and the frame).

The broadcast system of the present invention may use protocols such as Internet Protocol (IP), User Datagram Protocol (UDP), Transmission Control Protocol (TCP), Asynchronous Layered Coding/Layered Coding Transport (ALC/LCT), Real-time Transport Protocol/RTP Control Protocol (RTP/RTCP), Hypertext Transfer Protocol (HTTP), and File Delivery over Unidirectional Transport (FLUTE). For a stack of these protocols, reference can be made to the architecture illustrated in FIG. 47.

In the broadcast system of the present invention, data can be transmitted in an ISO base media file format (ISOBMFF). Electrical Service Guide (ESG), Non Real Time (NRT), Audio/Video (A/V) and/or normal data can be transmitted in the ISOBMFF format.

Transmission of data through a broadcast network may include transmission of linear contents and/or transmission of non-linear contents.

Transmission of RTP/RTCP based A/V or data (closed caption, emergency alert message, etc.) may correspond to transmission of linear contents.

A RTP payload can be transmitted in a format of an RTP/AV stream including a Network Abstraction Layer (NAL) and/or in an ISOBMFF-encapsulated format. Transmission of the RTP payload may correspond to transmission of linear contents. Transmission in the ISOBMFF-encapsulated format may include Moving Picture Experts Group—Dynamic Adaptive Streaming over HTTP (MPEG DASH) media segments for A/V, etc.

Transmission of ESG based on FLUTE, transmission of non-timed data, and transmission of NRT contents may correspond to transmission of non-linear contents. These can be transmitted in a MIME type file format and/or an ISOBMFF-encapsulated format. Transmission in the ISOBMFF-encapsulated format may include MPEG DASH media segments for A/V, etc.

Transmission through a broadband network can be divided into transmission of contents and transmission of signaling data.

Transmission of contents includes transmission of linear contents (A/V, data (closed caption, emergency alert message, etc.), transmission of non-linear contents (ESG, non-timed data, etc.), and transmission of MPEG DASH based media segments (A/V, data).

Transmission of signaling data includes transmission of a signaling table (including media presentation description (MPD) of MPEG DASH) in a broadcast network.

The broadcast system of the present invention may support synchronization between linear/non-linear contents transmitted through a broadcast network, or synchronization between contents transmitted through a broadcast network and contents transmitted through a broadband. For example, when a single piece of UD content is divided and transmitted simultaneously through a broadcast network and a broadband, a receiver can adjust a timeline which is dependent upon a transmission protocol, synchronize the content of the broadcast network with the content of the broadband, and then reconfigure them into a single piece of UD content.

An applications layer of the broadcast system of the present invention may implement technical features such as interactivity, personalization, second screen, automatic content recognition (ACR), etc. These features are crucial to, for example, extension from ATSC2.0 to ATSC3.0 which are the broadcast standards of the North America. For instance, HTML5 can be used for interactivity.

In a presentation layer of the broadcast system of the present invention, HTML and/or HTML5 can be used to identify spatial and temporal relationships between components or between bidirectional applications.

Figure 48:
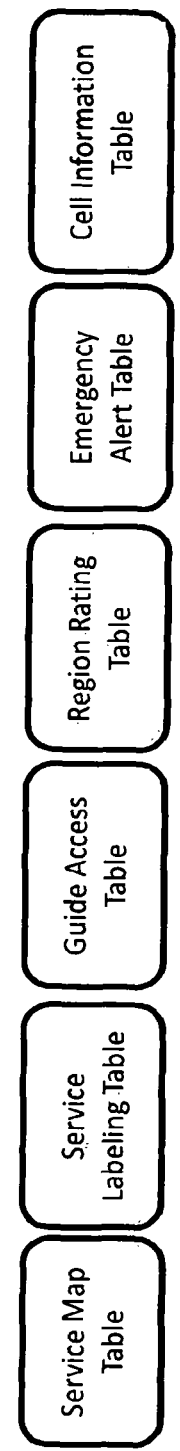
FIG. 48 is a view illustrating a signaling table according to an embodiment of the present invention.

FIG. 48 is a view illustrating a signaling table according to an embodiment of the present invention.

The signaling table according to the current embodiment of the present invention may include Service Map Table (SMT), Service Labeling Table (SLT), Guide Access Table (GAT), Region Rating Table (RRT), Emergency Alert Table (EAT) and/or Cell Information Table (CIT).

The signaling table according to the current embodiment of the present invention may be transmitted on a signaling channel or transmitted as a part of broadcast data.

The signaling table according to the current embodiment of the present invention may include information required to acquire service and/or contents transmitted through a broadcast network and a broadband.

MPD of MPEG DASH may be transmitted as a part of signaling data or a signaling channel according to an embodiment of the present invention.

Signaling transmission according to an embodiment of the present invention may be transmission of encapsulated IP/UDP datagrams for broadcast and transmission based on a HTTP protocol for broadband.

Figure 49:
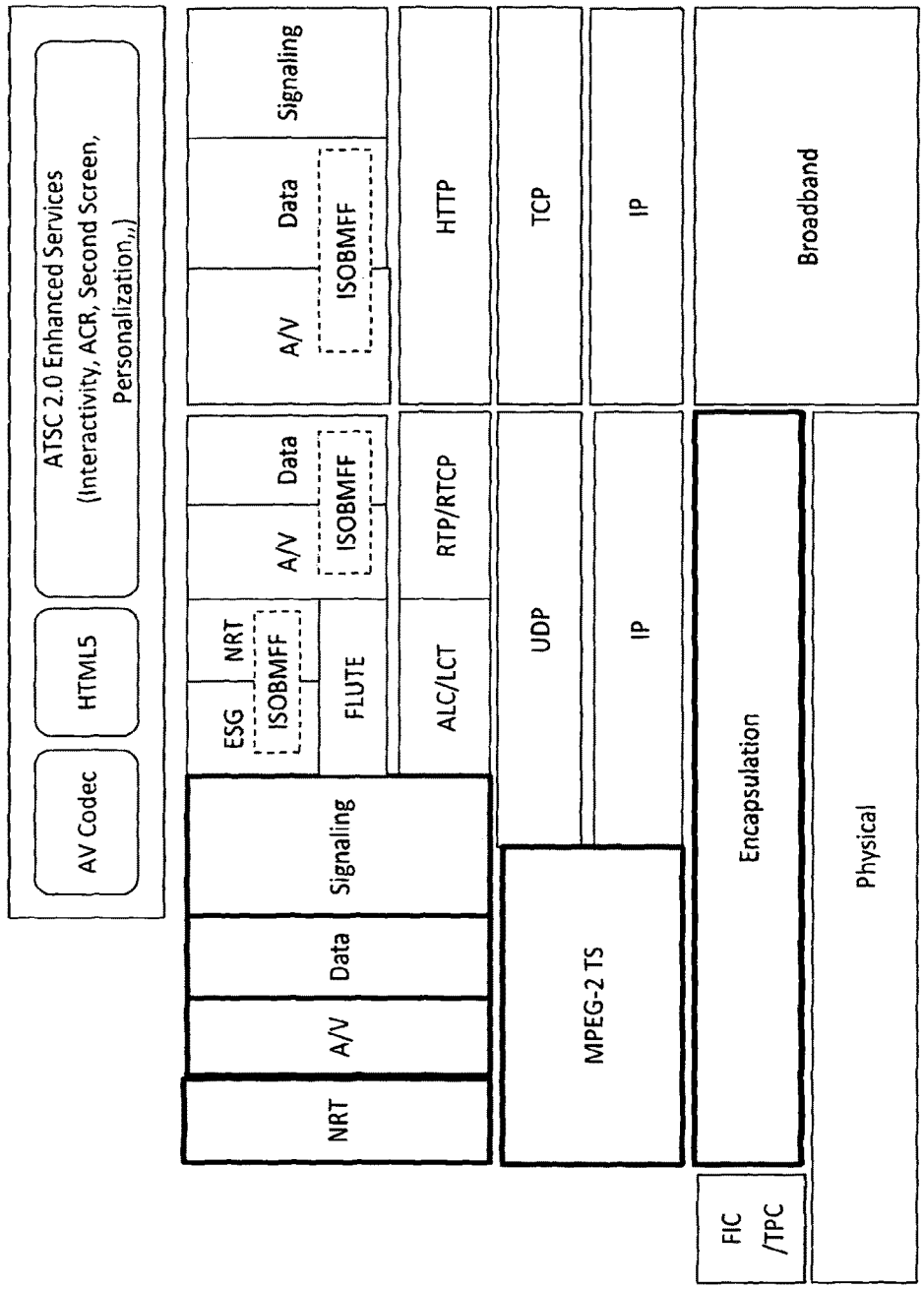
FIG. 49 is a view illustrating a protocol stack of a broadcast system according to another embodiment of the present invention.

FIG. 49 is a view illustrating a protocol stack of a broadcast system according to another embodiment of the present invention.

Since the broadcast system according to the current embodiment of the present invention can be achieved by adding some elements to or modifying some elements of the broadcast system according to the previous embodiments, for a description of the detailed configuration thereof, reference can be made to the previously described broadcast system.

The broadcast system according to the current embodiment of the present invention has system architecture for maintaining compatibility with the MPEG-2 system. For example, the broadcast system may support reception and operation of linear/non-linear contents transmitted from the conventional MPEG-2 system in the ATSC 3.0 system, or may flexibly control processing of A/V and data depending on the format of data received by the ATSC 3.0 system, e.g., MPEG-2 TS or IP datagrams.

An encapsulation layer of the broadcast system according to the current embodiment of the present invention converts information/data acquired from a physical layer into MPEG-2 TS or IP datagrams, or converts the IP datagrams into a specific frame (e.g., RS Frame, GSE-lite, GSE or signal frame).

The broadcast system according to the current embodiment of the present invention includes signaling information for flexibly acquiring service/contents through a broadcast network depending on whether MPEG-2 TS or IP datagrams are received. That is, in the broadcast system, the signaling information can be acquired based on MPEG-2 TS or data according to a UDP protocol.

The broadcast system of the present invention may support synchronization between broadcast network based linear/non-linear contents which are encapsulated into MPEG-2 TS and/or IP datagrams. Alternatively, the broadcast system of the present invention may support synchronization between content fragments transmitted through a broadcast network and a broadband. For example, when a single piece of UD content is divided and transmitted simultaneously through a broadcast network and a broadband, a receiver can adjust a timeline which is dependent upon a transmission protocol, synchronize the content of the broadcast network with the content of the broadband, and then reconfigure them into a single piece of UD content.

Figure 50:
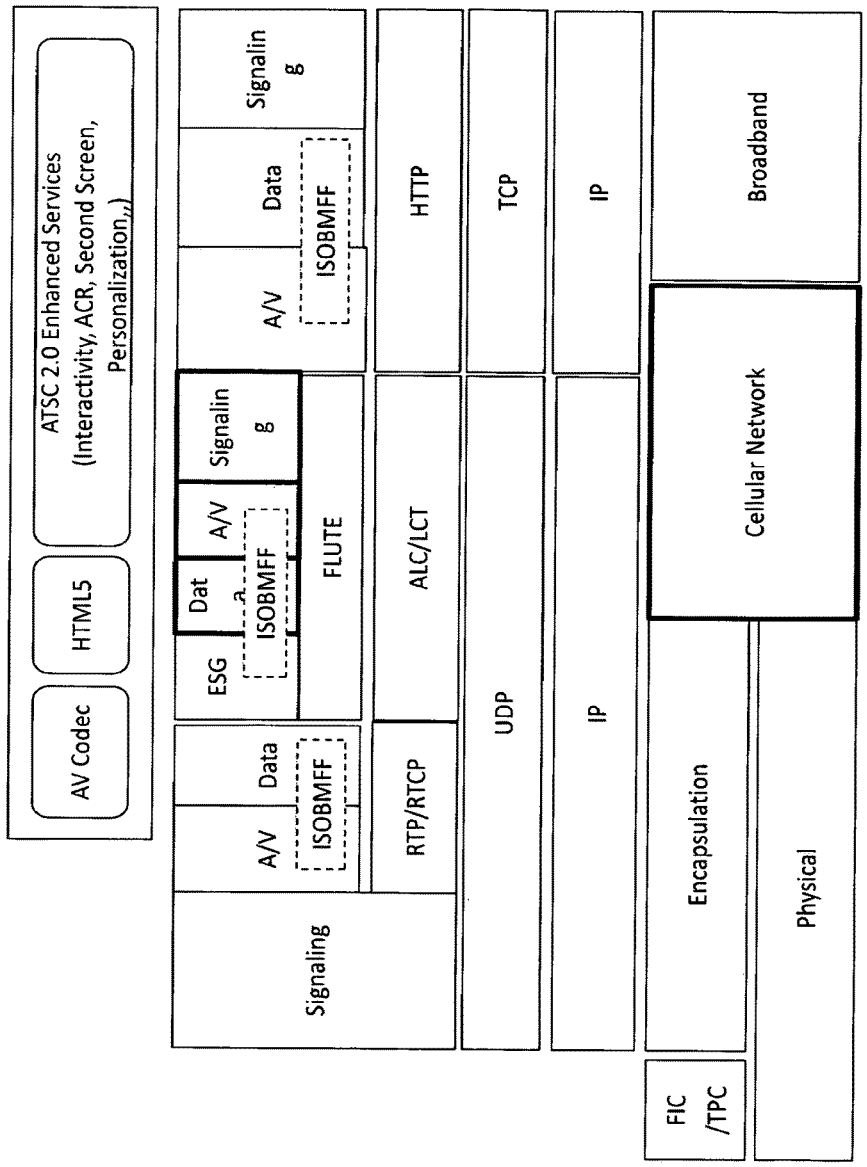
FIG. 50 is a view illustrating a protocol stack of a broadcast system according to another embodiment of the present invention.

FIG. 50 is a view illustrating a protocol stack of a broadcast system according to another embodiment of the present invention.

Since the broadcast system according to the current embodiment of the present invention can be achieved by adding some elements to or modifying some elements of the broadcast system according to the previous embodiments, for a description of the detailed configuration thereof, reference can be made to the previously described broadcast system.

The broadcast system according to the current embodiment of the present invention has a protocol stack for maintaining compatibility with a cellular network. Accordingly, the broadcast system may receive and operate (play) linear/non-linear contents transmitted from the cellular network.

The cellular network may transmit linear/non-linear contents and/or signaling based on FLUTE, and the broadcast system may receive and process data using a corresponding protocol.

The broadcast system according to the current embodiment of the present invention may receive and process MPEG-DASH based MPD and/or media segments through the cellular network.

The broadcast system according to the current embodiment of the present invention may support synchronization between linear contents, between non-linear contents, or between linear contents and non-linear contents which are transmitted through a broadcast network, a broadband, and/or a cellular network. Accordingly, the broadcast system may collect data transmitted through respective networks and create a single piece of content having a different quality level.

Figure 51:
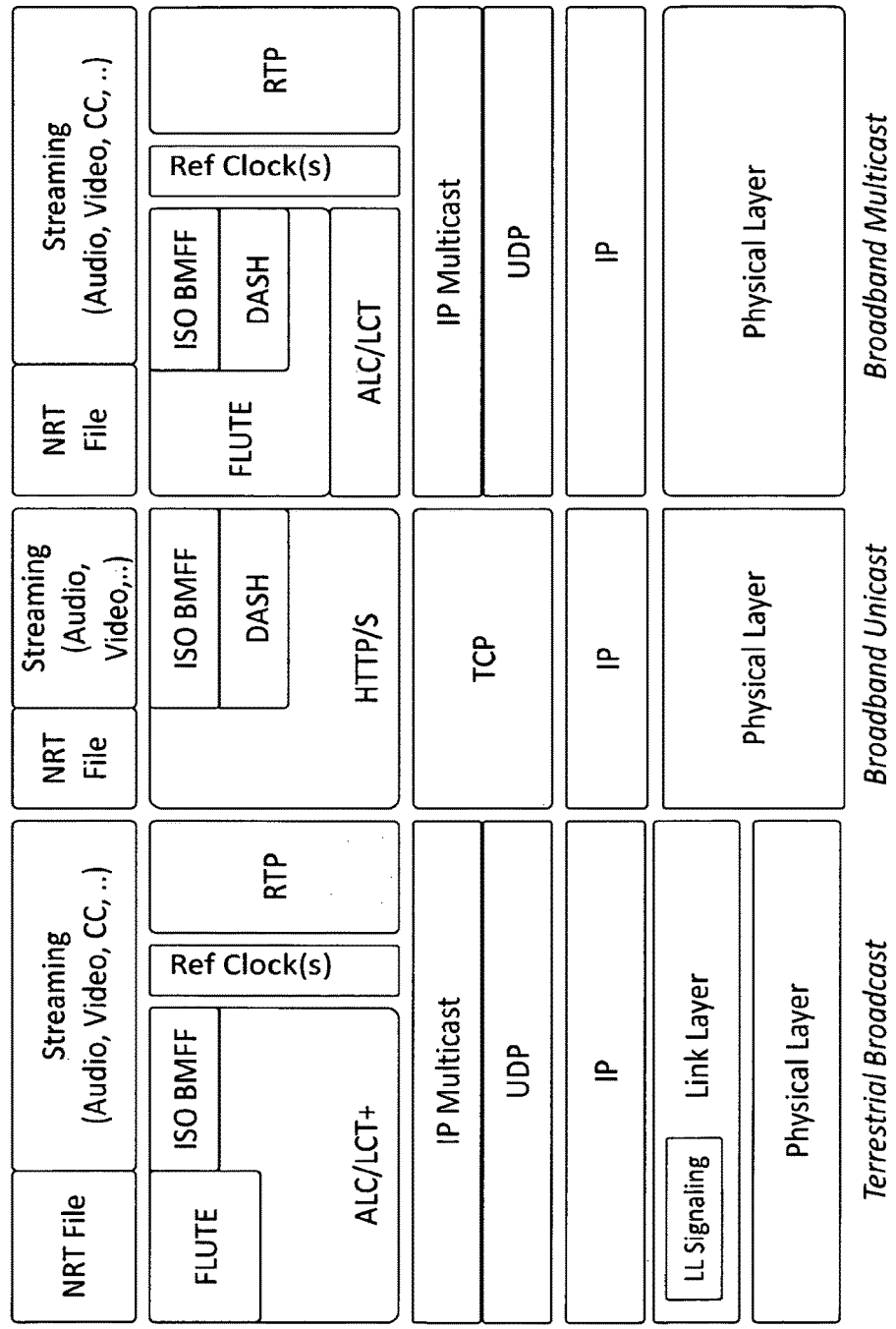
FIG. 51 is a view illustrating a protocol stack of a broadcast system according to another embodiment of the present invention.

FIG. 51 is a view illustrating a protocol stack of a broadcast system according to another embodiment of the present invention.

Figure 52:
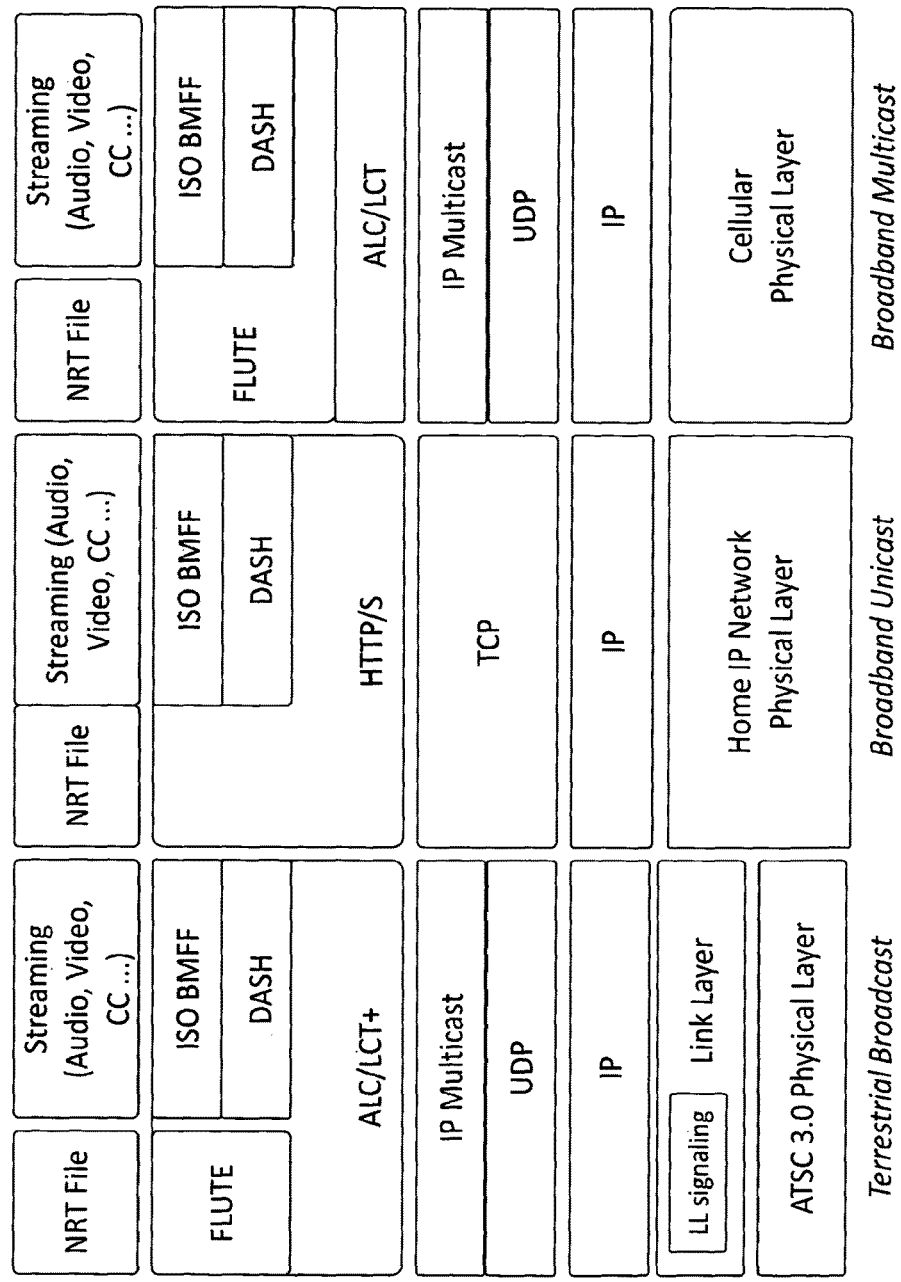
FIG. 52 is a view illustrating a protocol stack of a broadcast system according to another embodiment of the present invention.

FIG. 52 is a view illustrating a protocol stack of a broadcast system according to another embodiment of the present invention.

For the broadcast system described above, specific functions for each part of the broadcast system will be described below.

Packet Encapsulation, Concatenation, Segmentation and Reassembly, Overhead Reduction, Signaling Transmission, Signaling through a Fast Information Channel and/or Transport of EAS Signaling will be included in a link layer of the broadcast system, For Packet Encapsulation, this section only describes a method that includes an encapsulation in the link layer. There can be different methods that can transmit directly the relevant packets without any link layer encapsulation. The link layer provides encapsulation of IP packets, MPEG-2 TS and other protocol packets. Using link layer encapsulation, the physical layer can process one encapsulation packet format, independent of the network layer protocol type. Basically, network layer packets are transformed into the payload of link layer packets. Concatenation and segmentation of network layer packets into link layer packets can be performed in order to use the physical layer resources efficiently.

For Concatenation, when the network layer packet is small, the payload of a link layer packet includes several network layer packets. The link layer packet header includes fields to perform concatenation.

For Segmentation and Reassembly, when the network layer packet is too large to process in the physical layer, the network layer packet is divided into two or more segments. The link layer packet header includes fields to perform segmentation on the sending side and reassembly on the receiving side.

For Overhead Reduction, the link layer provides optional header compression for reduction of overhead in IP flows. In ATSC 3.0, header compression is based on the RoHC (Robust Header compression) framework [ROHC]. In the ATSC 3.0 system, the RoHC framework can operate in the unidirectional mode.

For Signaling Transmission, the link layer provides transport of signaling information such as a fast information channel, EAS (Emergency Alert System) messages and signaling generated at the link layer such as information for overhead reduction.

For Signaling through a Fast Information Channel, the main purpose of the fast information channel is to efficiently deliver essential information for rapid channel scan and service acquisition. This information primarily includes binding information between ATSC 3.0 services and the physical data pipe.

For Transport of EAS Signaling, if the physical layer supports a special emergency alert channel with adequate bandwidth to carry basic emergency alert messages (e.g., CAP messages [CAP]), this channel can carry emergency alert related signaling and the basic emergency alert messages. Additional media files can be delivered via separate data pipes. If the physical layer only supports low bandwidth notifications that emergency alert messages are available, then basic alert messages and additional media files can be delivered via separate data pipes. In both cases the separate data pipes can be configured to have high robustness.

The broadcast system described above may process both of data, signals and/or files transmitted via a real-time protocol and/or a non real-time protocol.

Broadcast and Multicast Delivery, RTP Carriage, ALC/LCT extension carrying ISO BMFF, Unicast Delivery and/or Error Correction will be included in the broadcast system for real-time continuous content delivery.

For Broadcast and Multicast Delivery, two different methods are described for real-time delivery of continuous content via broadcast and multicast—RTP and/or ISO BMFF over ALC/LCT.

For RTP Carriage, delivery of continuous content components via RTP can be supported for real-time broadcast or multicast delivery of the content. Such delivery can conform to [RTP] and appropriate additional payload specifications for the type of media being carried, such as [RTP-TT] for timed-text closed captions, [RTP-AVC] and [RTP-SVC] for H.264 video, [RTP-HEVC] for HEVC video, [RTP-HEAAC] for HE AAC audio, etc., and possible additional constraints such as those in sections 7.5 and 9.5 of [A153-7] and section 5.2 of [A153-8]. In particular, RTCP SR packets can be used for synchronization among different continuous content components being delivered via broadcast or multicast.

For ALC/LCT extension carrying ISO BMFF, delivery of continuous content components via ISO BMFF objects contained in ALC/LCT packets can be supported for real-time broadcast or multicast delivery of the content. The ISO BMFF objects can be formatted according to [ISO BMFF], conforming to profiles to be specified by ATSC. The ALC/LCT packets can be formatted according to [LCT] and [ALC], with an additional LCT header extension defined by ATSC to carry presentation timing information.

A "Broadcast Timeline" can be established by sending broadcast timeline clock reference values via broadcast or multicast. This Broadcast Timeline can serve as the reference time base for the presentation timing information in the LCT header extension.

For Unicast Delivery, DASH [DASH] can be supported for real-time delivery of continuous components over a unicast channel, with segments conforming to the specifications in [ISO BMFF]. Both a "live" DASH profile and a "pre-recorded" DASH profile can be specified by ATSC for this purpose, with the live profile intended for delivery of live content, and the pre-recorded profile intended for delivery of pre-recorded content (either as part of a linear service or part of an on-demand service).

For Error Correction, error correction for real-time continuous content delivery to fixed and mobile receivers can be supported at the physical layer.

Broadcast and Multicast, Error Correction, Unicast and/or Continuous Media. File Formats will be included in the broadcast system for the non real-time continuous content delivery.

For Delivery, non-real-time delivery of files via broadcast or multicast can be supported according to the specifications in [NRT] sections 5.2, 5.5-5.9, and 5.11.

For Error Correction, error correction for non-real-time delivery of files can be supported using FEC according to the specifications in [NRT] section 5.4, and using post-delivery repair along the lines of the mechanisms specified in [DVB-CDP].

For Unicast, non-real-time delivery of files via unicast can be supported via HTTP 1.1 and via HTTP 1.1 over TLS 1.2. Delivery via HTTP 1.1 can conform to [HTTP1.1]. Delivery via HTTP 1.1 over TLS 2.1 can further conform to [TLS2.1].

For Continuous Media File Formats, in order to support non-real-time delivery of content files, it is necessary to specify file formats that are to be supported. It is especially necessary to specify file formats of files containing continuous media to ensure that synchronization with other content is possible (see description below).

The broadcast system described above should have synchronization functions to properly combine data, files or/and signals of different protocols which are supported by the broadcast system.

For example of combination of Broadcast or Multicast with Unicast, this section describes the model for synchronization between multiple media component streams delivered in real-time over broadcast or multicast and DASH segments carrying movie fragments delivered via a unicast broadband channel.

For RTP (Broadcast or Multicast)+DASH (Unicast), as mentioned above, each continuous media component delivered via RTP can have an associated RTCP SR stream. Each RTCP SR packet can carry an NTP clock reference timestamp and a corresponding RTP clock reference timestamp, which can be used to map the RTP timeline to the NTP timeline. Thus, the presentation time of the access units in the RTP stream (which can be indicated by RTP presentation time stamps in the RTP packet headers) can be determined by the mapping of the RTP timeline to the NTP timeline.

In order to synchronize content delivered via DASH (unicast) with content delivered via RTP (broadcast or multicast), it is necessary to establish a mapping from the DASH Media Presentation timeline to the NTP timeline. Information necessary to establish a mapping from the DASH Media Presentation timeline to the NTP timeline can be delivered in the broadcast or multicast.

For ALC/LCT (Broadcast or Multicast)+DASH (Unicast), as stated above, a Broadcast Timeline can be established whenever continuous content is delivered via ALC/LCT, to serve as the reference time base for the presentation timing information in the LCT header extension of ALC/LCT packets. In order to synchronize content delivered via DASH (unicast) with content delivered via ALC/LCT (broadcast or multicast), information necessary to establish a mapping from the DASH Media Presentation timeline to the Broadcast Timeline can be delivered in the broadcast or multicast.

Above two methods can be applied when other transport protocols are used for broadcast channel.

For Real-time Continuous Content+NRT Files, to synchronize the play-out of continuous content from non-real-time files with continuous content delivered in real-time, the general approach to synchronization can be to map the timeline of the file-based content to the timeline of the real-time continuous content. How the timeline of the file-based content is determined can depend on the file format. In order to specify a synchronization mechanism, it is necessary to require that the timeline specifies a clock rate and a start time corresponding to the first presentation unit in the file, and that all the presentation units in the file have a presentation time relative to this timeline. Each of the presentation units includes audio data, video data, or a portion of content to be presented in the receiving device. The appropriate timeline mapping information can be signaled.

The above-described steps can be omitted or replaced by steps executing similar or identical functions according to design.

Although the description of the present invention is explained with reference to each of the accompanying drawings for clarity, it is possible to design new embodiment(s) by merging the embodiments shown in the accompanying drawings with each other. And, if a recording medium readable by a computer, in which programs for executing the embodiments mentioned in the foregoing description are recorded, is designed in necessity of those skilled in the art, it may belong to the scope of the appended claims and their equivalents.

An apparatus and method according to the present invention may be non-limited by the configurations and methods of the embodiments mentioned in the foregoing description. And, the embodiments mentioned in the foregoing description can be configured in a manner of being selectively combined with one another entirely or in part to enable various modifications.

In addition, a method according to the present invention can be implemented with processor-readable codes in a processor-readable recording medium provided to a network device. The processor-readable medium may include all kinds of recording devices capable of storing data readable by a processor. The processor-readable medium may include one of ROM, RAM, CD-ROM, magnetic tapes, floppy discs, optical data storage devices, and the like for example and also include such a carrier-wave type implementation as a transmission via Internet. Furthermore, as the processor-readable recording medium is distributed to a computer system connected via network, processor-readable codes can be saved and executed according to a distributive system.

It will be appreciated by those skilled in the art that various modifications and variations can be made in the present invention without departing from the spirit or scope of the inventions. Thus, it is intended that the present invention covers the modifications and variations of this invention provided they come within the scope of the appended claims and their equivalents.

Both apparatus and method inventions are mentioned in this specification and descriptions of both of the apparatus and method inventions may be complementarily applicable to each other.

MODE FOR INVENTION

Various embodiments have been described in the best mode for carrying out the invention.

INDUSTRIAL APPLICABILITY

The present invention is available in a series of broadcast signal provision fields.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

The invention claimed is:

1. A method of receiving a broadcast signal by an apparatus for receiving the broadcast signal, the method comprising:
   receiving the broadcast signal including link layer packets, wherein each link layer packet includes a link layer packet header and a payload, wherein a packet type of input packets encapsulated in the link layer packets is an Internet Protocol (IP) packet type or a MPEG-2 TS packet type, wherein the link layer packet header includes an information field for identifying whether a segmentation of an input packet or a concatenation of an input packet with another input packet is performed, and wherein when the packet type of the input packets is the IP packet type, headers of the input packets are compressed based on Robust Header Compression (RoHC) of unidirectional mode;
   processing the broadcast signal;
   decapsulating the link layer packets into the input packets based on the information field; and
   decompressing the headers of the input packets based on the packet type of the input packets.

2. The method of claim 1,
   wherein the input packets include Audio/Video (A/V) data,
   wherein the A/V data is included in first files based on ISO base media file format (ISOBMFF),
   wherein the input packets further include service guide data, and non-real time content data which are delivered in advance its use and stored in a receiving device,
   wherein the service guide data is further included in the first files, and
   wherein the non-real time content data are included in second files based on ISOBMFF.

3. The method of claim 2,
   wherein the A/V data which are transmitted in a real-time are to be combined with the non-real time content data to present a complete content.

4. The method of claim 3,
   wherein the first files include a first timeline and the second files include a second timeline, and
   wherein the first timeline and the second timeline are used to synchronize the non-real time content with the A/V data.

5. The method of claim 4,
   wherein the second files include a plurality of presentation units.

6. The method of claim 5,
   wherein the second timeline specifies a clock rate and a start time corresponding to a first presentation unit in the second files.

7. The method of claim 5,
   wherein each of the presentation units has a presentation time relative to the second timeline.

8. An apparatus for receiving a broadcast signal, the apparatus comprising:
   an antenna to receive the broadcast signal including link layer packets, wherein each link layer packet includes a link layer packet header and a payload, wherein a packet type of input packets encapsulated in the link layer packets is an Internet Protocol (IP) packet type or a MPEG-2 TS packet type, wherein the link layer packet header includes an information field for identifying whether a segmentation of an input packet or a concatenation of an input packet with another input packet is performed, and wherein when the packet type of the input packets is the IP packet type, headers of the input packets are compressed based on Robust Header Compression (RoHC) of unidirectional mode; and
   a processor to:
   process the broadcast signal,
   decapsulate the link layer packets into the input packets based on the information field, and
   decompress the headers of the input packets based on the packet type of the input packets.

9. The apparatus of claim 8,
   wherein the input packets include Audio/Video (A/V) data,
   wherein A/V data is included in first files based on ISO base media file format (ISOBMFF),
   wherein the input packets further include service guide data, and non-real time content data which are delivered in advance its use and stored in a receiving device,
   wherein the service guide data is further included in the first files, and
   wherein the non-real time content data are included in second files based on ISOBMFF.

10. The apparatus of claim 9,
    wherein the A/V data which are transmitted in a real-time are to be combined with the non-real time content data to present a complete content.

11. The apparatus of claim 10,
    wherein the first files include a first timeline and the second files include a second timeline, and
    wherein the first timeline and the second timeline are used to synchronize the non-real time content with the A/V data.

12. The apparatus of claim 11,
    wherein the second files include a plurality of presentation units.

13. The apparatus of claim 12,
    wherein the second timeline specifies a clock rate and a start time corresponding to a first presentation unit in the second files.

14. The apparatus of claim 12,
    wherein each of the presentation units has a presentation time relative to the second timeline.

15. A method of transmitting a broadcast signal by an apparatus for transmitting the broadcast signal, the method comprising:

encapsulating input packets into link layer packets, wherein each link layer packet includes a link layer packet header and a payload, wherein a packet type of the input packets is an Internet Protocol (IP) packet type or a MPEG-2 TS packet type, wherein the link layer packet header includes an information field for identifying whether a segmentation of an input packet or a concatenation of an input packet with another input packet is performed, and wherein when the packet type of the input packets is the IP packet type, headers of the input packets are compressed based on Robust Header Compression (RoHC) of unidirectional mode;

generating the broadcast signal including the link layer packets; and transmitting the broadcast signal.

16. An apparatus for transmitting a broadcast signal, the apparatus comprising:

a processor to:
   encapsulate input packets into link layer packets, wherein each link layer packet includes a link layer packet header and a payload, wherein a packet type of the input packets is an Internet Protocol (IP) packet type or a MPEG-2 TS packet type, wherein the link layer packet header includes an information field for identifying whether a segmentation of an input packet or a concatenation of an input packet with another input packet is performed, and wherein when the packet type of the input packets is the IP packet type, headers of the input packets are compressed based on Robust Header Compression (RoHC) of unidirectional mode, and
   generate the broadcast signals including the link layer packets; and an antenna to transmit the broadcast signal.

* * * * *